(12) United States Patent
Geim et al.

(10) Patent No.: US 9,548,364 B2
(45) Date of Patent: Jan. 17, 2017

(54) STRUCTURES AND METHODS RELATING TO GRAPHENE

(75) Inventors: Andre Geim, Manchester (GB); Kostya Novoselov, Manchester (GB); Roman Gorbachev, Manchester (GB); Leonid Ponomarenko, Manchester (GB)

(73) Assignee: The University of Manchester, Manchester (GB)

(*) Notice: Subject to any disclaimer, the term of this patent is extended or adjusted under 35 U.S.C. 154(b) by 0 days.

(21) Appl. No.: 14/005,476

(22) PCT Filed: Mar. 22, 2012

(86) PCT No.: PCT/GB2012/050642
§ 371 (c)(1),
(2), (4) Date: Sep. 16, 2013

(87) PCT Pub. No.: WO2012/127245
PCT Pub. Date: Sep. 27, 2012

(65) Prior Publication Data
US 2014/0008611 A1    Jan. 9, 2014

(30) Foreign Application Priority Data
Mar. 22, 2011  (GB) .................................. 1104824.6

(51) Int. Cl.
*H01L 29/16*    (2006.01)
*H01L 21/02*    (2006.01)

(52) U.S. Cl.
CPC ..... *H01L 29/1606* (2013.01); *H01L 21/02527* (2013.01)

(58) Field of Classification Search
CPC ............. H01L 29/1606; H01L 29/7781; H01L 21/02527; H01L 21/02376

USPC ............................................ 438/479; 257/14
See application file for complete search history.

(56) References Cited

U.S. PATENT DOCUMENTS

| 8,227,842 B2* | 7/2012 | Marinero et al. ............. 257/288 |
| 8,384,122 B1 | 2/2013 | Hu et al. |
| 2002/0014667 A1 | 2/2002 | Shin et al. |
| 2007/0187694 A1 | 8/2007 | Pfeiffer |

(Continued)

FOREIGN PATENT DOCUMENTS

| CN | 101385126 A | 3/2009 |
| CN | 101950593 A | 1/2011 |
| JP | 2009527127 A | 7/2009 |
| WO | WO-2007097938 A1 | 8/2007 |

OTHER PUBLICATIONS

Chen, et al. "Towards Flexible All-Carbon Electronics: Flexible Organic Field-Effect Transistors and Inverter Circuits Using Solution-Processed All-Graphene Source/Drain/Gate Electrodes", Nano Res. 2010, 3(10), pp. 714-721.

(Continued)

*Primary Examiner* — Jerome Jackson, Jr.
*Assistant Examiner* — David Spalla
(74) *Attorney, Agent, or Firm* — Wilmer Cutler Pickering Hale and Dorr LLP

(57) ABSTRACT

This application relates to graphene based heterostructures and methods of making graphene based heterostructures. The graphene heterostructures comprise: i) a first encapsulation layer; ii) a second encapsulation layer; and iii) a graphene layer. The heterostructures find application in electronic devices.

14 Claims, 54 Drawing Sheets

(56) References Cited

U.S. PATENT DOCUMENTS

Figure 1:
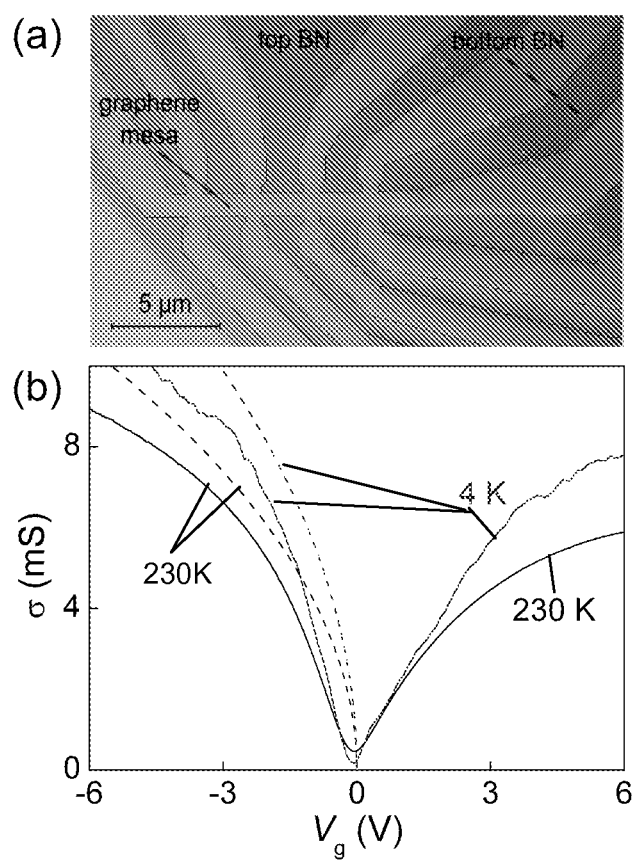

| | | | |
|---|---|---|---|
| 2008/0099827 A1 | 5/2008 | Kreupl | |
| 2009/0294759 A1 | 12/2009 | Woo et al. | |
| 2010/0176495 A1* | 7/2010 | Chu | H01L 21/76254 257/635 |
| 2011/0017979 A1 | 1/2011 | Meric et al. | |
| 2011/0030879 A1 | 2/2011 | Veerasamy | |
| 2011/0045282 A1* | 2/2011 | Kelber | B82Y 30/00 428/333 |
| 2011/0059599 A1 | 3/2011 | Ward et al. | |
| 2011/0068320 A1* | 3/2011 | Marinero | B82Y 10/00 257/9 |
| 2011/0073562 A1* | 3/2011 | Zettl | C01B 21/064 216/36 |
| 2011/0089403 A1* | 4/2011 | Woo | B82Y 10/00 257/29 |
| 2011/0163298 A1* | 7/2011 | Sung | G03H 1/02 257/29 |
| 2011/0175628 A1 | 7/2011 | Kohlstedt | |
| 2011/0233513 A1* | 9/2011 | Dimitrakopoulos | H01L 29/1606 257/9 |
| 2013/0102084 A1* | 4/2013 | Loh | B01J 21/185 436/94 |
| 2014/0166984 A1 | 6/2014 | Gunlycke et al. | |

OTHER PUBLICATIONS

Gerbedoen, et al. "AlGaN/GaN MISHEMT with hBN as Gate Dielectric", Diamond & Related Materials 18 (2009), pp. 1039-1042.

Gorbachev, et al. "Hunting for Monolayer Boron Nitride: Optical and Raman Signatures", Small 2011, vol. 7, No. 4, pp. 465-468.

International Search Report corresponding to International Application No. PCT/GB2012/050641, dated Dec. 3, 2012, 3 pages.

Radisavljevic, et al. "Single-Layer $MoS_2$ Transistors", Nature Nanotechnology, vol. 6, Mar. 2011, pp. 147-150.

Suganuma, et al. "Fabrication of Transparent and Flexible Organic Field-Effect Transistors with Solution-Processed Graphene Source-Drain and Gate Electrodes", Applied Physics Express 4 (2011), pp. 021603-1 through 021603-3.

Tanaka, et al. Heteroepitaxial System of h-BN/Monolayer Graphene On Ni(111), Surface Review and Letters, vol. 10, No. 4 (2003), pp. 697-703.

United Kingdom Search Report issued by The United Kingdom Intellectual Property Office for Application No. GB1104824.6 mailed on Jul. 20, 2011, 4 pages.

Wilson "Graphene Production Goes Industrial", Physics Today 63 (8), 15 (2010), 3 pages.

Xu, et al. "In-plane and Tunneling Pressure Sensors Based on Graphene/Hexagonal Boron Nitride Heterostructures", Applied Physics Letters 99, (2011), pp. 133109-1 through 133109-3.

Slawinska et al. "Reversible modifications of linear dispersion: Graphene between boron nitride monolayers," Physical Review B, Aug. 15, 2010, vol. 82, 5 pages.

Tanaka, et al. "Heteroepitaxial Film of Monolayer Graphene/Monolayer h-BN on Ni(111)," Surface Review and Letters, vol. 10, No. 5 (2003), pp. 721-726.

Dean et al., "Boron nitride substrates for high-quality graphene electronics," Nature Nanotechnology, vol. 5, 20 pages, (2010).

* cited by examiner

STRUCTURES AND METHODS RELATING TO GRAPHENE

CROSS REFERENCE TO RELATED APPLICATIONS

This application is a National Stage Entry of PCT International Application No. PCT/GB2012/050642, filed on Mar. 22, 2012, which claims priority to GB11048424.6, filed on Mar. 22, 2011, the contents of which are incorporated herein by reference in their entirety.

This invention generally relates to structures and methods relating to graphene. In some aspects, the invention generally relates to graphene heterostructures, i.e. structures including graphene and at least one other material.

Graphene can be understood as a one-atom-thick planar sheet of carbon atoms arranged in a honeycomb lattice.

In search for new phenomena and applications, which are expected, predicted or to be uncovered in graphene, it is thought important to continue improving its electronic quality that is commonly characterized by charge carrier mobility $\mu$. Graphene obtained by mechanical cleavage on top of an oxidized Si wafer usually exhibits $\mu \sim 10,000$ cm$^2$V$^{-1}$s$^{-1}$.[1] For typical carrier concentrations $n \approx 10^{12}$ cm$^{-2}$, such quality translates into the mean free path $l=(h/2e)\mu(n/\pi)^{0.5}$ of the order of 100 nm where h is Planck's constant and e the electron charge. On the other hand, it has been shown that, if extrinsic scattering in graphene is eliminated, its mobility at room temperature (T) can reach ~200,000 cm$^2$V$^{-1}$s$^{-1}$ due to weak electron-phonon interaction.[2] Indeed, for $n \sim 10^{11}$ cm$^{-2}$, $\mu$ exceeding 100,000 cm$^2$V$^{-1}$s$^{-1}$ and 1,000,000 cm$^2$V$^{-1}$s$^{-1}$ at room and liquid-helium T, respectively, were demonstrated for suspended graphene annealed by high electric current.[3-5] However, suspended devices are extremely fragile, susceptible to the ambient atmosphere and difficult to anneal in the proper four-probe geometry (the latter has not been achieved so far). Furthermore, it requires a significant amount of strain to suppress flexural modes in suspended graphene and retain high $\mu$ up to room T.[5] Most recently, a breakthrough was achieved by using hexagonal boron-nitride (hBN) as an atomically smooth and inert substrate for cleaved graphene.[6] Such structures were shown to exhibit $\mu \sim 100,000$ cm$^2$V$^{-1}$s$^{-1}$ at $n \sim 10^{11}$ cm$^{-2}$. Although $\mu$ achieved in graphene yield l approaching 1 $\mu$m, no ballistic effects on this scale have so far been reported.

After several years of active transport studies still a little is known about electron-electron ("e-e") interactions in graphene. Due to its minor contribution into the sheet resistance, the direct measurements of the e-e interactions in the conventional transistor structures require complex analysis [Kozikov]. Observation of transport properties of two closely spaced graphene flakes can shed light on a variety of new interaction phenomena including, for example, exciton condensation [MacDonald]. One of such effects, the electron drag, proved to be a very useful tool in GaAs/AlGaAs heterostructures [Gramila, Sivan]. Since the drag is caused by the scattering between fluctuations of electron density of two two-dimensional electron gases ("2DEGs"), it is a probe of intra-layer density excitations and inter-layer electron-electron interaction.

The present invention has been devised in light of the above considerations.

US 2007/0187694 is directed towards a transistor device which is formed by epitaxial deposition of graphene layers on to hexagonal BN layers and of BN layers onto graphene layers.

US 2009/029759 describes a stack structure which is formed from epitaxial deposition of graphene onto hexagonal BN.

However, despite the apparent discussion of such a structure in the above patents, this concept remained firmly, prior to the present invention, as only a theoretical concept. Indeed, epitaxial growth of graphene onto BN is a method which had not been achieved anywhere at the time of publication of US 2009/029759 and US 2007/0187694. Thus these are both theoretical applications which have actually not been reduced to practice. Indeed, it is evident from the documents that the devices to which the above mentioned applications are directed were not achievable using the methods described therein. This point is confirmed by a more recent paper by Liu et al (Direct Growth of Graphene/Hexagonal Boron Nitride Stacked Layers; Liu, Z.; Song, L.; Zhao, J.; Ma, L.; Zhang, J.; Lou, J.; Ajayan; P. M.; Nano. Lett.; 2011; 11; 2032-2037.) which apparently describes for the first time the deposition of graphene on hexagonal BN and hexagonal BN on graphene. This paper also is deficient however and the material produced is widely accepted by the scientific community as a whole as not being a BNgraphene composite. One of the main criticisms of this paper and the earlier patents is that the authors were not actually in possession of the material and simply speculated on the possible structure and properties of the material. However, the growth of graphene on BN, and in particular hexagonal BN, is unpredictable and difficult to achieve as has been demonstrated by the many unsuccessful attempts to obtain the material. The present invention has succeeded in providing for the first time BNgraphene structures which can be produced and characterised.

In reality, for example, one of the major problems we have found when attempting to form structures relates to the fact that the deposition of graphene on hBN can result in numerous 'bubbles' containing trapped adsorbates (presumably hydrocarbons). This can seriously impact on the electrical properties of the graphene and on the heterostructure as a whole. This issue is not even contemplated in the prior art. However, such bubbles, if present in the active part of devices, will cause significant charge inhomogeneity and effectively render the devices useless. We have overcome this and other problems.

One problem solved by the present invention resides in the provision of heterostructures according to the first aspect of the invention and also the provision of devices comprising such heterostructures. This problem is not solved by either US 2009/029759 or US 2007/0187694. The process used to obtain these novel structures also represents part of the technical problem addressed by this patent.

SUMMARY OF THE INVENTION

A first aspect of the invention may provide:
a graphene heterostructure having:
a first encapsulation layer;
a second encapsulation layer; and
a graphene layer positioned between the first encapsulation layer and the second encapsulation layer.

The term graphene used above includes both "pristine" i.e. chemically unmodified graphene and also functionalised graphene. The individual graphene layers forming the top and/or bottom electrode may thus be graphene or functionalised graphene. The graphene could also be modified by physical means such as heat treatment. Hereafter, for brevity, we collectively refer to both graphene and modified graphene simply as graphene.

By encapsulating the graphene layer in this way, the graphene layer is made less susceptible to its environment and can result in the graphene having improved charge carrier mobility μ, see Experiment 1 for details. Accordingly, the first aspect of the invention may provide a graphene heterostructure having a charge carrier mobility μ of 100,000 $cm^2V^{-1}s^{-1}$ or greater, preferably at room temperature (e.g. 20° C.).

Preferably, the first encapsulation layer includes (more preferably is of) boron-nitride. More preferably, the first encapsulation layer includes (more preferably is of) hexagonal boron-nitride. The first encapsulation layer may be a hexagonal boron-nitride crystal, for example.

Preferably, the second encapsulation layer includes (more preferably is of) boron-nitride. More preferably, the second encapsulation layer includes (more preferably is of) hexagonal boron-nitride. The second encapsulation layer may be a hexagonal boron-nitride crystal, for example.

Hexagonal boron-nitride is preferred as a material for the first and second encapsulation layers, because it can act as an atomically smooth and inert substrate for graphene. Using hexagonal boron-nitride as the first and second encapsulation layers has been found to result in the graphene heterostructure exhibiting, among other things, room temperature ballistic transport of a 1 μm distance and high charge carrier mobility μ, even at room temperature, see Experiment 1 for details. It is thought that materials other than hexagonal boron-nitride (e.g. aluminium oxide) could in principle be used as the first and/or second encapsulation layers. However, these other materials are not preferred because they are not as flat and/or do not have other useful properties possessed by boron nitride.

Preferably, the graphene layer lies directly next to the first encapsulation layer, i.e. with no layers therebetween. Preferably the second encapsulation layer lies directly next to the graphene layer, i.e. with no layers therebetween.

In an embodiment, the graphene heterostructure may comprise a second graphene layer. This allows the formation of more complicated devices, including several layers of transistors for integrated circuits. In this embodiment, the graphene layer becomes a first graphene layer. It may be that the first encapsulation layer is between the first graphene layer and the second graphene layer. Alternatively, the second encapsulation layer may be between the first graphene layer and the second graphene layer. In a further embodiment, the graphene heterostructure comprises a third encapsulation layer. In this way a sandwich of alternating layers of graphene and encapsulating layers may be constructed. The encapsulating layers may in each case be of different materials or they may all be the same.

Preferably, the second graphene layer lies directly next to the first or second encapsulation layer as appropriate, i.e. with no layers therebetween. Preferably the third encapsulation layer lies directly next to second graphene layer, i.e. with no layers therebetween.

The first and/or second encapsulation layer may have a thickness approximately equal to 10 nm. The first and/or second encapsulation layer may have a thickness of from 1 to 1000 atomic layers of BN.

Each graphene layer is preferably a single sheet of graphene, i.e. it is preferably one atom thick. However, it is also possible for a graphene layer to include multiple sheets of graphene. For example, a graphene layer could include two sheets of graphene (so-called "bilayer graphene") or even three sheets of graphene (so-called "trilayer graphene"). Above three sheets of graphene, it is thought that the electric properties of a graphene layer become less useful. Accordingly, a graphene layer preferably includes no more than three sheets of graphene. However the graphene layer may include structural features and localised defects where graphene may be more than three atomic layers thick. in embodiments in which there are multiple graphene layers, the thickness of each graphene layer is independent of the thickness of the other graphene layer(s).

The graphene layer is preferably shaped, e.g. by removing portions of the layer (e.g. by etching, e.g. by electron-beam lithography and/or oxygen plasma etching) to form a structure. The structure may include one or more contact regions for connecting the structure to an external device. The structure could be a hall bar structure, for example, but other structures are equally possible, e.g. the structure could simply be a single conductive track. Hall bar structures are well known, and some examples are illustrated in the Experiments described below. Hall bar structures may allow the properties of the graphene heterostructure to be investigated, see e.g. Experiment 1. In embodiments with multiple graphene layers, one or more graphene layers may be shaped.

The graphene heterostructure may include one or more contacts, e.g. of metal, e.g. to connect the graphene layer(s) to external electronics. Each of the one or more contacts may be positioned on one or more respective contact regions included in a structure formed in the graphene layer(s) (see above).

Preferably, the second encapsulation layer is aligned with respect to the graphene layer so that it covers only a portion of the graphene layer, preferably so that one or more contact regions included in a structure formed in the graphene layer (see above) are not covered by the second encapsulation layer. This allows one or more contacts to be deposited on one or more contact regions included in a structure formed in the graphene layer after the second encapsulation layer has been deposited on the graphene layer, e.g. by lithography e.g. electron beam lithography.

The graphene heterostructure may include a substrate on which the first encapsulation layer is positioned. In one embodiment, the first encapsulation layer lies directly next to the substrate, i.e. with no layers therebetween. The substrate preferably include a silicon wafer, preferably an oxidised silicon wafer, e.g. so that the substrate has $SiO_2$ having a thickness approximately equal to 100 nm.

The graphene heterostructure may, for example, have a width approximately equal to 1 μm.

The first aspect of the invention may also provide a method of making a graphene heterostructure having:
 a first encapsulation layer;
 a second encapsulation layer; and
 a graphene layer positioned between the first encapsulation layer and the second encapsulation layer.

The method may include one or more optional further steps to include one or more further layers. Thus a further graphene layer may be added to the encapsulated graphene structure obtained by the above method.

The method may include any method step implementing or corresponding to any apparatus feature described in connection with the first aspect of the invention.

For example, the method may include:
 depositing a graphene layer on a first encapsulation layer; and
 depositing a second encapsulation layer on the graphene layer, so that the graphene layer is positioned between the first encapsulation layer and the second encapsulation layer.

As another example, the first encapsulation layer preferably includes (more preferably is of) boron-nitride. More preferably, the first encapsulation layer includes (more preferably is of) hexagonal boron-nitride. The first encapsulation layer may be a hexagonal boron-nitride crystal, for example. Similarly, the second encapsulation layer preferably includes (more preferably is of) boron-nitride. More preferably, the second encapsulation layer includes (more preferably is of) hexagonal boron-nitride. The second encapsulation layer may be a hexagonal boron-nitride crystal, for example.

As another example, the graphene layer is preferably deposited so that it lies directly next to the first encapsulation layer. Similarly, the second encapsulation layer is preferably deposited so that it lies directly next to the graphene layer.

As another example, the first and/or second encapsulation layer may be deposited so as to have a thickness between 1 and 1000 atomic layers of hexagonal boron nitride.

As another example, the graphene layer is preferably deposited so as to be a single sheet of graphene, i.e. so that it is preferably one atom thick. This does not include structural features and defects where graphene may be more than one atomic layer thick.

As another example, the method preferably includes shaping the graphene layer, e.g. by removing portions of the layer (e.g. by etching, e.g. by electron-beam lithography and/or oxygen plasma etching) to form a structure. This shaping is preferably performed after the graphene layer has been deposited, but before the second encapsulation layer has been deposited. Alternatively, the graphene layer can be shaped during deposition, i.e. grown in a certain shape or shaped prior to the deposition. The structure may include one or more contact regions for connecting the structure to an external device. The structure formed in the graphene layer could be a hall bar structure, for example, but other structures are equally possible, e.g. the structure could simply be a single conductive track. Hall bar structures are well known, and some examples are illustrated in the Experiments described below. Hall bar structures may allow the properties of the graphene heterostructure to be investigated, see e.g. Experiment 1.

As another example, the method may include depositing one or more contacts, e.g. of metal, e.g. to connect the graphene layer to external electronics. The one or more contacts may be deposited on (i.e. so that they are positioned on) one or more contact regions included in a structure formed in the graphene layer (see above). The one or more contacts may be deposited, for example, by electron beam lithography.

As another example, the method may include aligning the second encapsulation layer with respect to the graphene layer so that it covers only a portion of the graphene layer, preferably so that one or more contact regions included in a structure formed in the graphene layer (see above) are not covered by the second encapsulation layer. The second encapsulation layer is preferably aligned before it is deposited on the graphene layer, e.g. using an optical mask aligner.

As another example, the method may include depositing the first encapsulation layer on a substrate. This is preferably performed before depositing the graphene layer and depositing the second encapsulation layer. The first encapsulation layer is preferably deposited so that it lies directly next to the substrate. The substrate can include, for example, a layer of dielectric and a layer of conductor. Such substrate can be, for example, a silicon wafer, preferably an oxidised silicon wafer, e.g. so that the substrate has $SiO_2$ insulating layer.

The first encapsulation layer may be deposited on the substrate mechanically, e.g. by exfoliation (mechanical cleavage), which is a technique well understood in the art.

Although in the experiments listed below graphene and boron nitride were mechanically exfoliated from a bulk crystal, this technique is not well suited for a large scale implementation. Depending on the choice of graphene and boron nitride fabrication processes the described layer sequence can be either grown on top of each other or assembled from the layers fabricated separately. For example, the graphene layer may be deposited on the first encapsulation layer according to the second aspect of this invention.

Similarly, the second encapsulation layer may be deposited on the graphene layer according to a method according to the second aspect of this invention, e.g. using a precursor structure, the precursor structure including the second encapsulation layer positioned on a carrier layer, the method including:

depositing the precursor structure on the graphene layer with the second encapsulation layer facing the graphene layer (and therefore the carrier layer facing away from the graphene layer); and subsequently (i.e. after depositing the precursor structure on the surface) removing the carrier layer from the second encapsulation layer. The method may include any additional steps described in or associated with the second aspect of the invention.

The method preferably includes, after depositing any one or more of the layers (particularly after depositing any one or more of the graphene layer and the second encapsulation layer), cleaning the graphene heterostructure, e.g. by annealing, e.g. at a temperature approximately equal to 300° C. and/or in an argon-hydrogen atmosphere, e.g. so as to remove residue and/or other contamination.

A second aspect of the invention may provide:

a method of depositing a layer of material on a surface using a precursor structure, the precursor structure including the layer of material positioned on a carrier layer, the method including:

depositing the precursor structure on the surface with the layer of material facing the surface (and therefore the carrier layer facing away from the surface); and subsequently (i.e. after depositing the precursor structure on the surface) removing the carrier layer from the layer of material.

By using the precursor structure in this manner, it is possible to deposit a very thin layer of material (e.g. the layer of material may have a thickness of 10 nm or less) accurately on the surface.

The method is particularly advantageous when used to form a graphene heterostructure. Accordingly, the method may be a method of depositing a layer of material on a surface using a precursor structure to form a graphene heterostructure. The surface may be the surface of an existing graphene heterostructure. An explanation of how this method may be used in connection with the heterostructures described in the first and second aspects of this invention has already been provided.

The method may be preferred to conventional techniques for depositing a layer of material to form a graphene heterostructure, because conventional techniques for depositing a layer of material to form a graphene heterostructure, e.g. exfoliation, may make it difficult to align the layers and/or cause contamination, for example.

The layer of material may be of a material/thickness suitable for forming a graphene heterostructure. For example, the layer of material may be of graphene, or of hexagonal boron-nitride. The layer of material may have a thickness e.g. of 10 nm or less.

The precursor structure may be thin, delicate and/or flexible. Accordingly, the depositing of the precursor structure on the surface may include picking up the precursor structure using a support, e.g. a metal frame.

To achieve accurate alignment, the precursor structure may be aligned with respect to the surface, before it is deposited on the surface, e.g. having an accuracy approximately equal to 2 µm.

The carrier layer may be removed by any suitable technique, preferably etching. Accordingly, the carrier layer is preferably chosen to be etchable, e.g. soluble. The carrier layer may be a polymer, e.g. poly(methyl methacrylate) ("PMMA") which could be removed by etching, e.g. using acetone.

The removing of the carrier layer may leave residue and/or other contamination. Accordingly, the method preferably includes, after removing the carrier layer, cleaning the structure including the deposited layer of material, e.g. by annealing the structure, e.g. at a temperature approximately equal to 300° C. and/or in an argon-hydrogen atmosphere, e.g. so as to remove residue and/or other contamination.

As already explained above, the method may be used to form one or more layers in a method according to the first aspect of the invention and/or one or more layers in a method according to the second invention.

The method may include making the precursor structure, before the precursor structure is deposited on the surface.

The making of the precursor structure may include, for example:
depositing the carrier layer on a sacrificial carrier layer;
depositing the layer of material on the carrier layer; and
removing the sacrificial carrier layer so as to separate a precursor structure including the carrier layer and the layer of material from the sacrificial carrier layer.

The making of the precursor structure may include initially depositing the sacrificial carrier layer on a substrate, e.g. with the carrier layer and/or layer of material being deposited whilst the sacrificial carrier layer is positioned on the substrate. Accordingly, the removing of the sacrificial carrier layer may separate the carrier layer precursor structure including the carrier layer and the layer of material from the sacrificial carrier layer and the substrate.

Here, use of the substrate may be advantageous as it provides an initial surface on which the carrier layers and the layer of material can be deposited.

Preferably, the sacrificial carrier layer is removed using a technique to which the carrier layer is resistant. More preferably, the sacrificial carrier layer is removed by etching using an agent to which the carrier layer is resistant. The sacrificial carrier layer and/or the carrier layer may be of different polymers, susceptible to different etching agents for example. By way of example, the sacrificial carrier layer may be of polymethylglutarimide ("PMGI") with the carrier layer being of poly(methyl methacrylate) ("PMMA"). Accordingly, the sacrificial carrier layer could be removed by etching, e.g. using a weak alkali solution to which PMMA is resistant. The PMMA could be subsequently removed from the layer of material using acetone, for example.

The second aspect of the invention may provide the above described precursor structure, i.e. a precursor structure including a layer or material positioned on a carrier layer. The precursor structure may have any of the features described above.

The second aspect of the invention may provide a method of making the above-described precursor structure. The method of making the precursor structure may include, for example:
depositing a carrier layer on a sacrificial carrier layer;
depositing a layer of material on the carrier layer; and
removing the sacrificial carrier layer so as to separate a precursor structure including the carrier layer and the layer of material from the sacrificial carrier layer.

The second aspect of the invention may provide the intermediate structure formed in this method, e.g. an intermediate structure having: a carrier layer positioned on the sacrificial carrier layer; and a layer of material positioned on the carrier layer. The intermediate structure may have any of the features described above, e.g. the sacrificial carrier layer may be positioned on the substrate.

Figure 41:
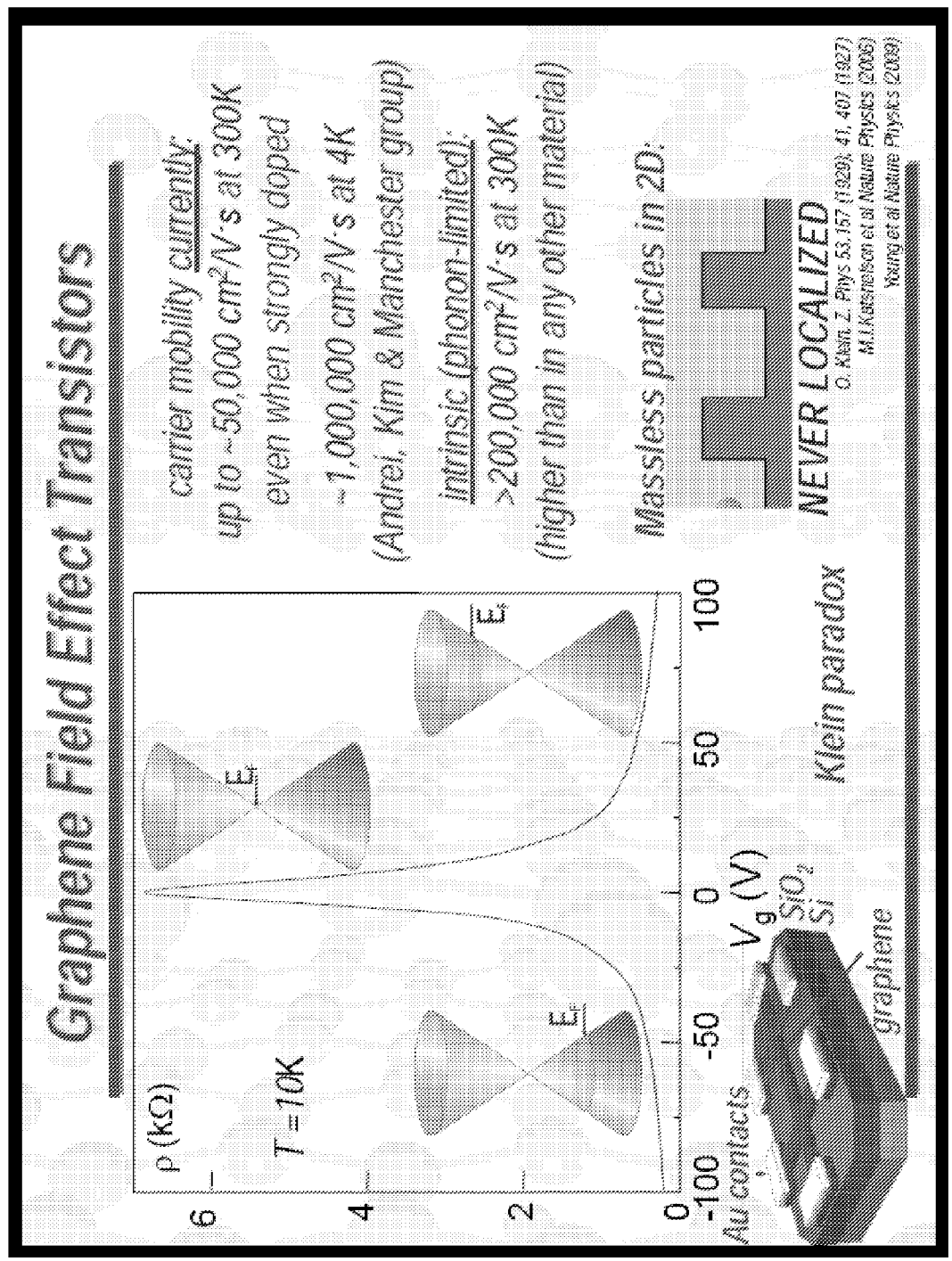
Figure 42:
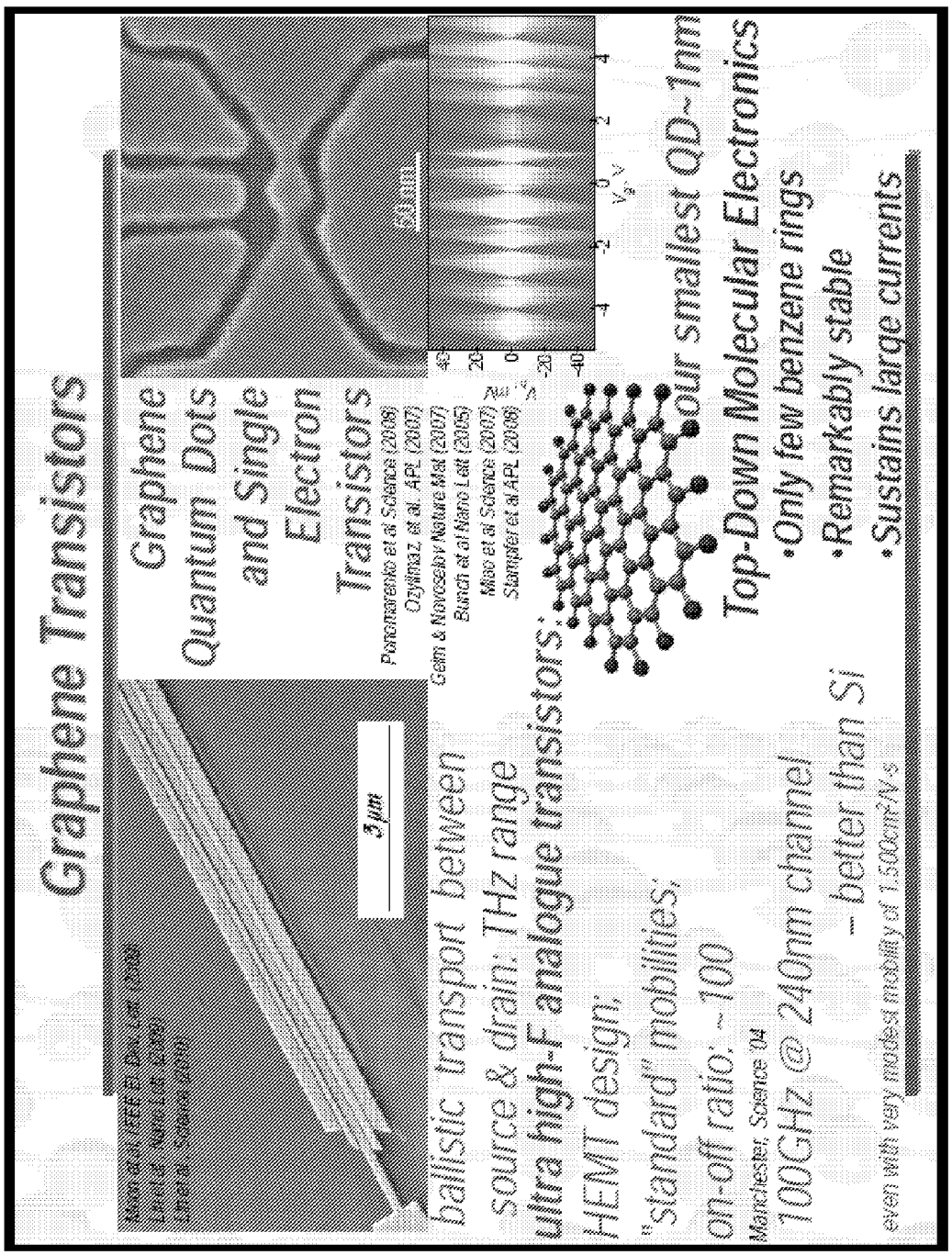
Figure 43:
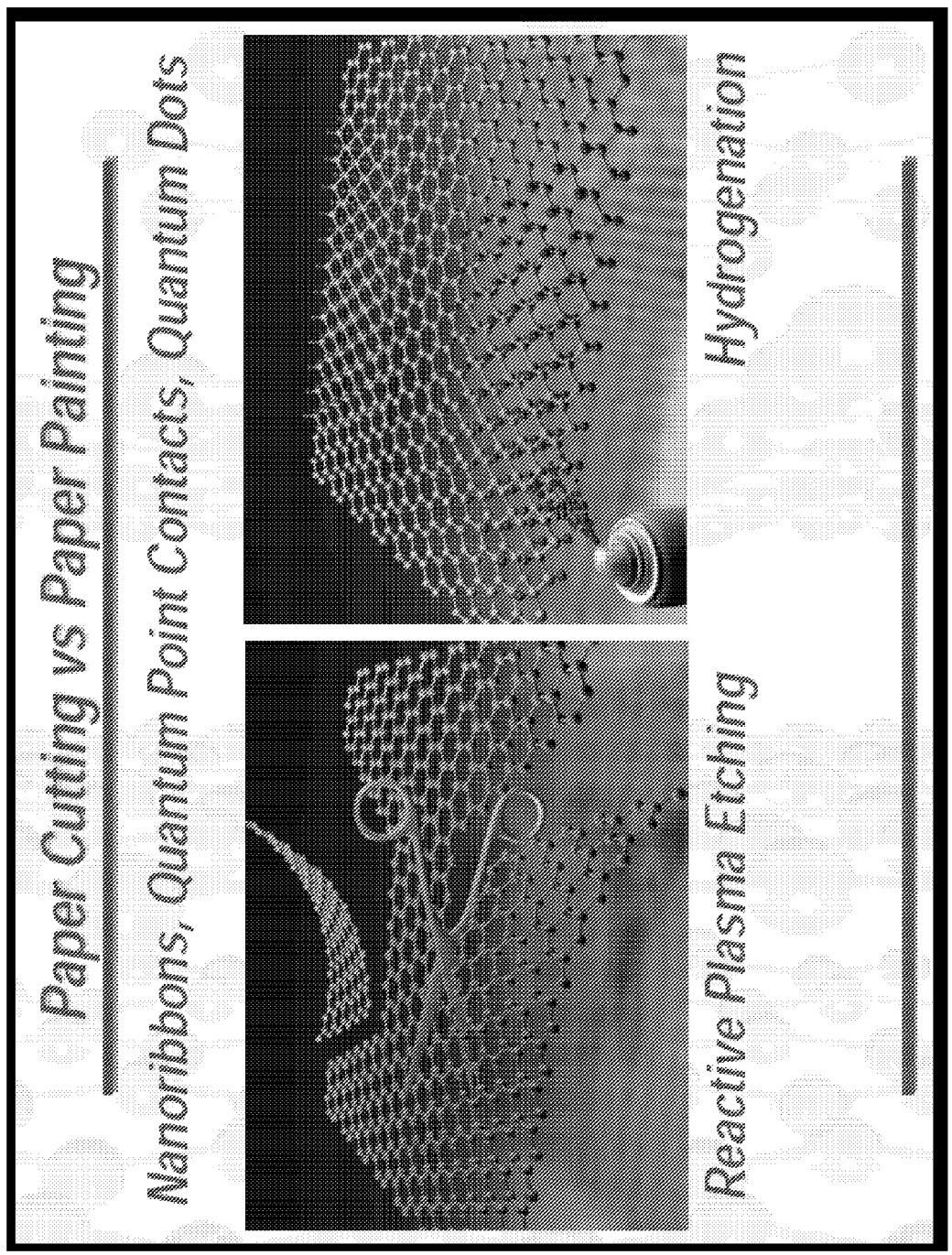
Figure 44:
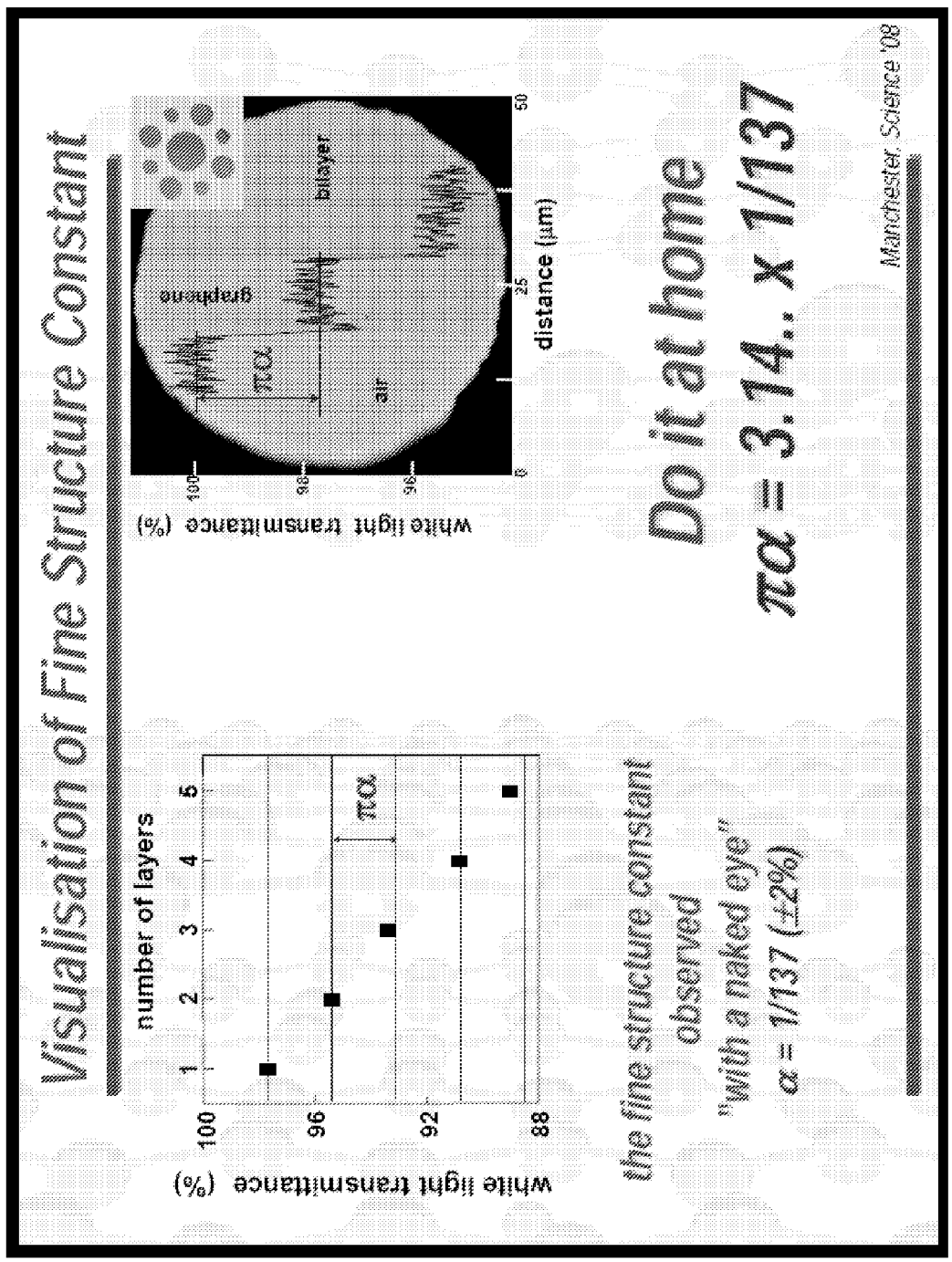
Figure 51:
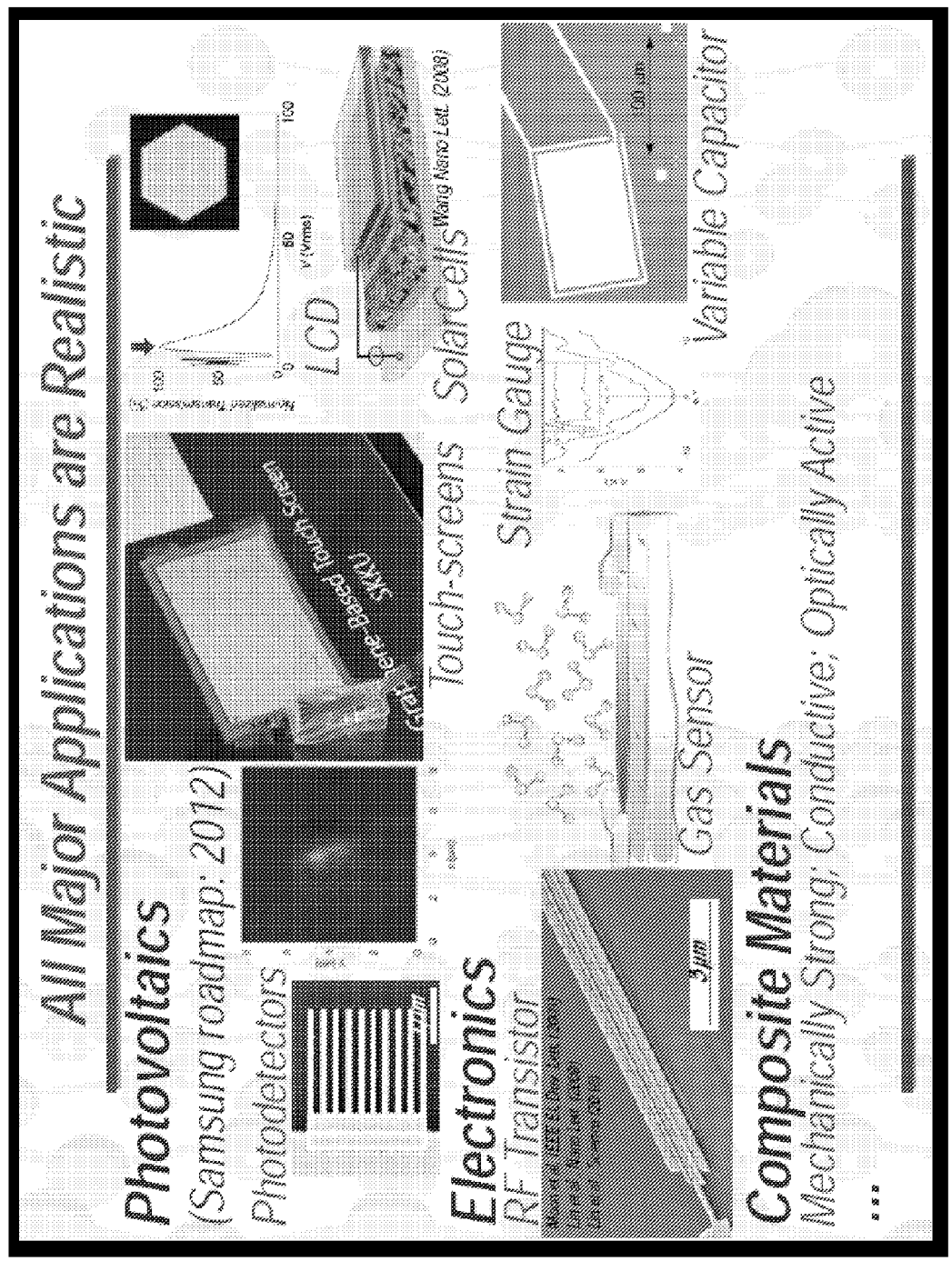
Figure 52:
Figure 53:
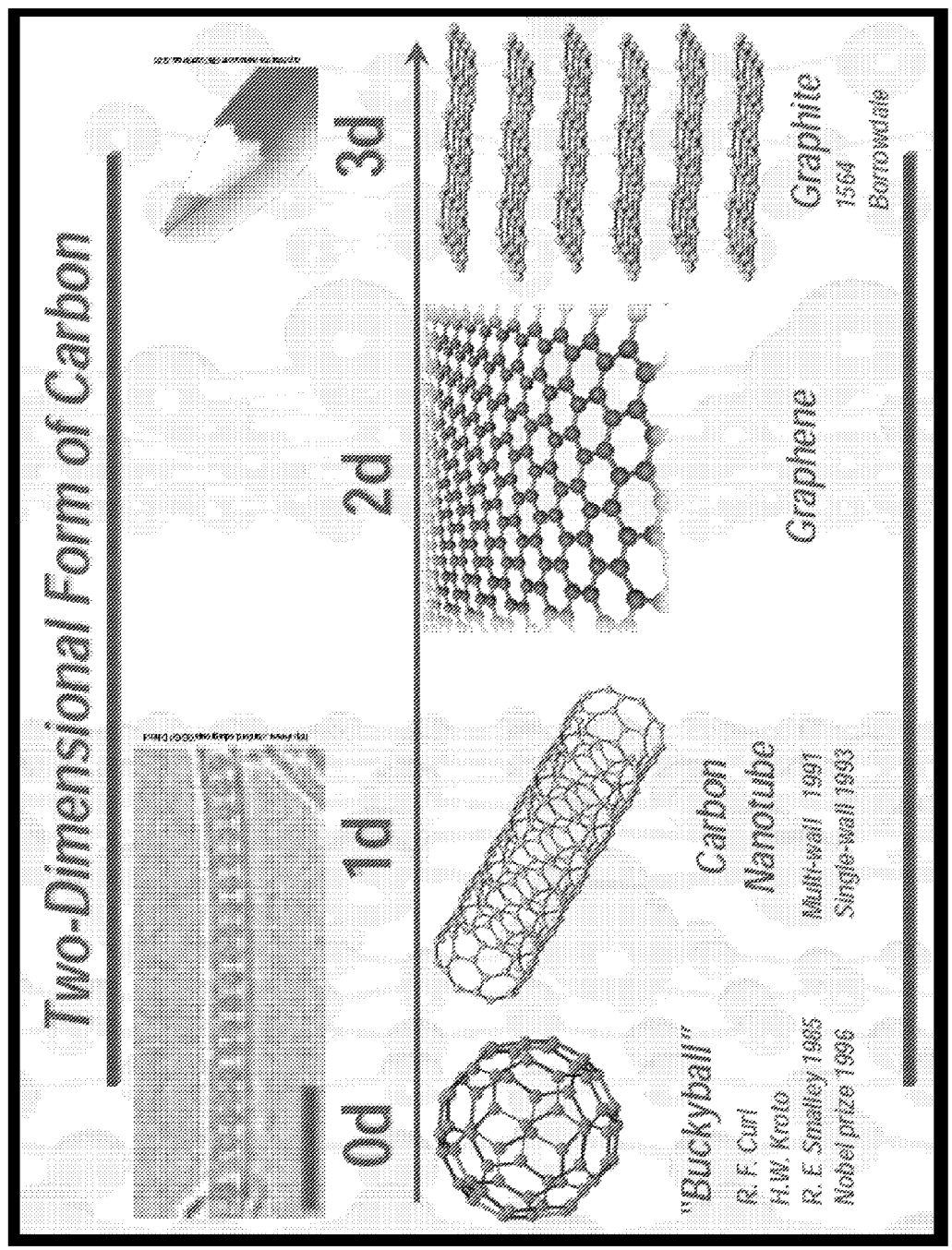
Figure 54:
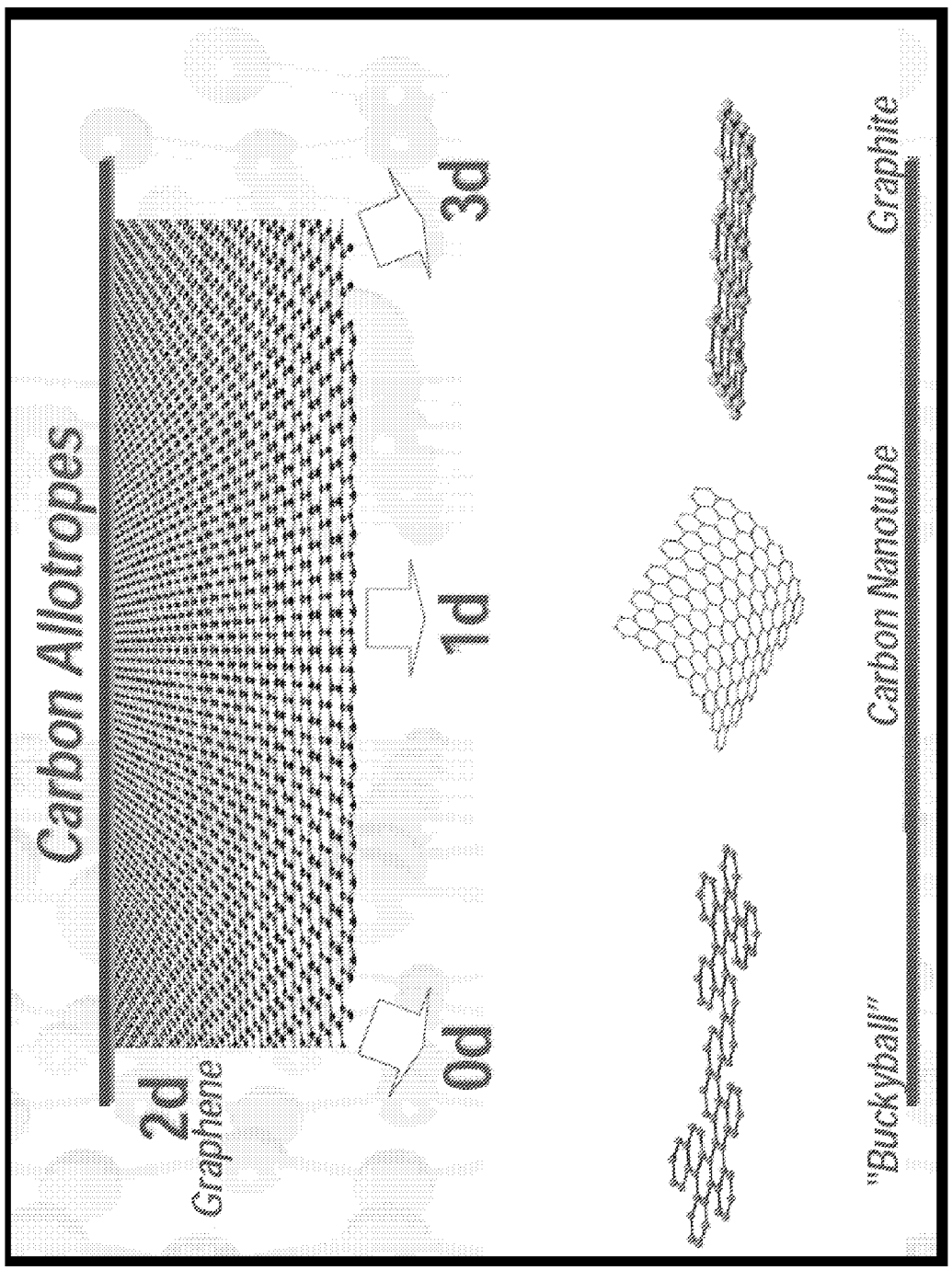

In another aspect, the present invention may provide an electronic component for use in an electronic circuit including an aforementioned graphene heterostructure. The electronic component may be: e.g. a hall probe; e.g. a field effect transistor e.g. as depicted in FIG. 41; a transistor e.g. as depicted in FIG. 42; a photovoltaic such as a photodetector, a variable capacitor or an RF transistor e.g. as depicted in FIG. 51.

Figure 45:
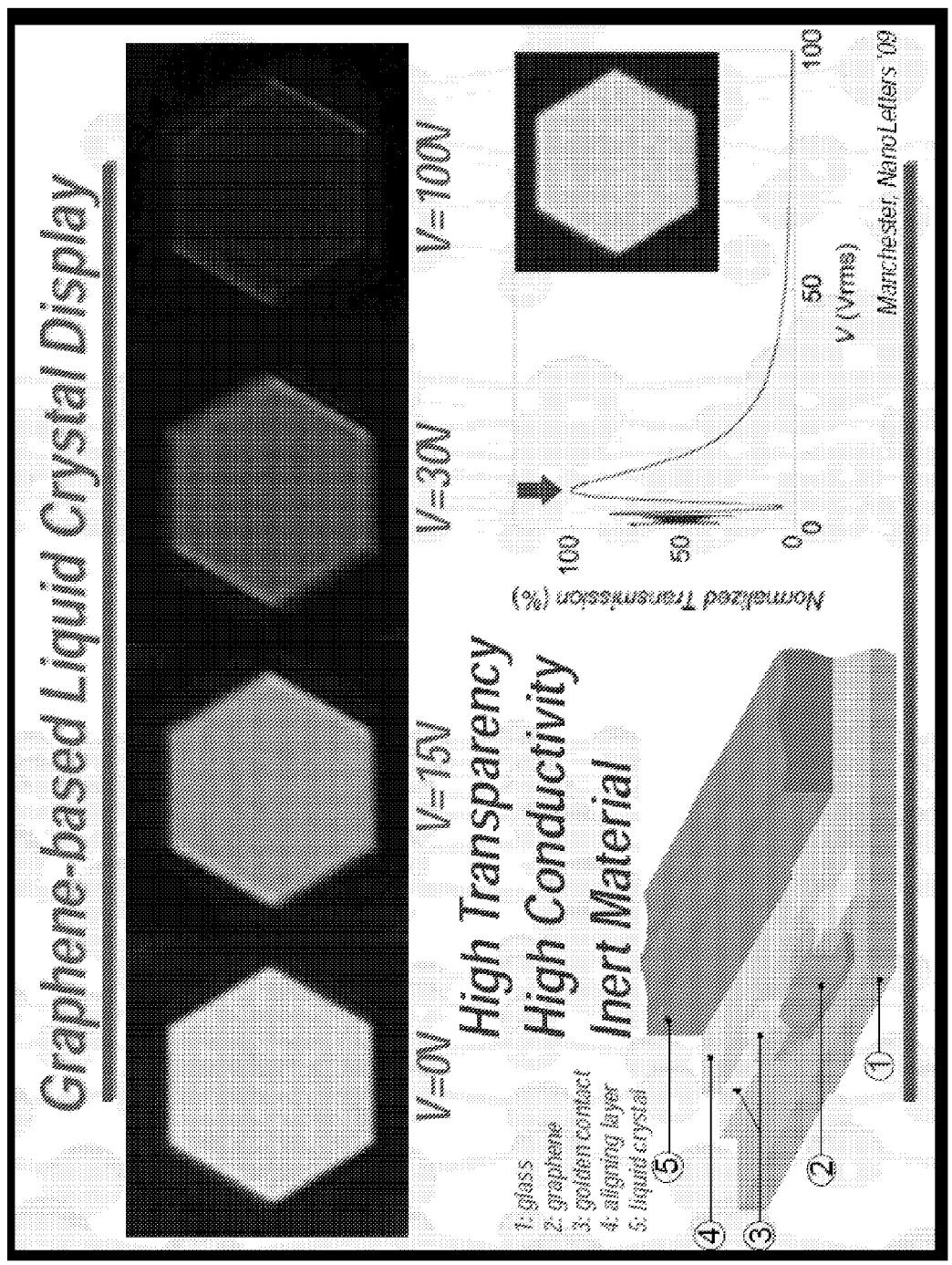
Figure 46:
Figure 47:
Figure 48:
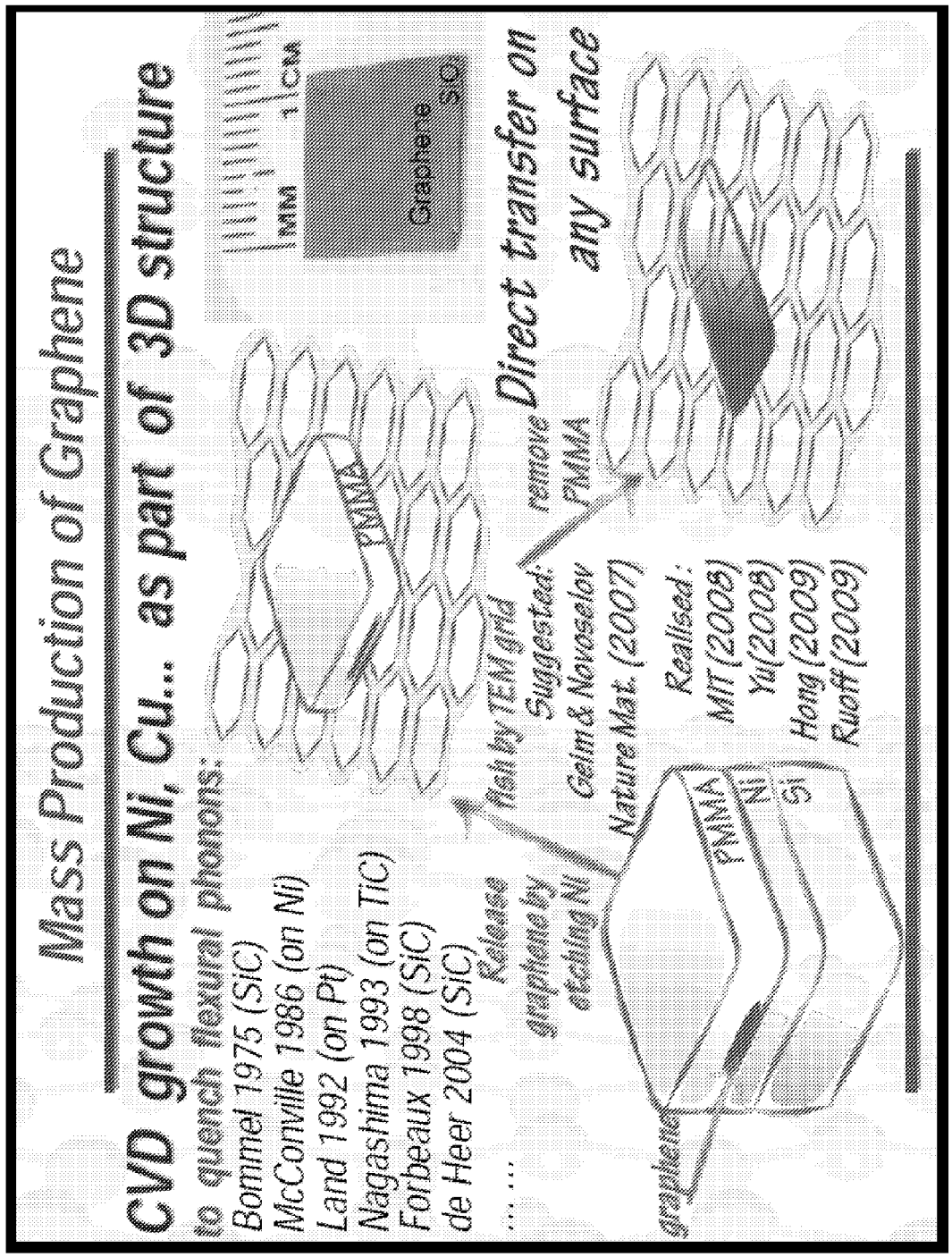
Figure 49:
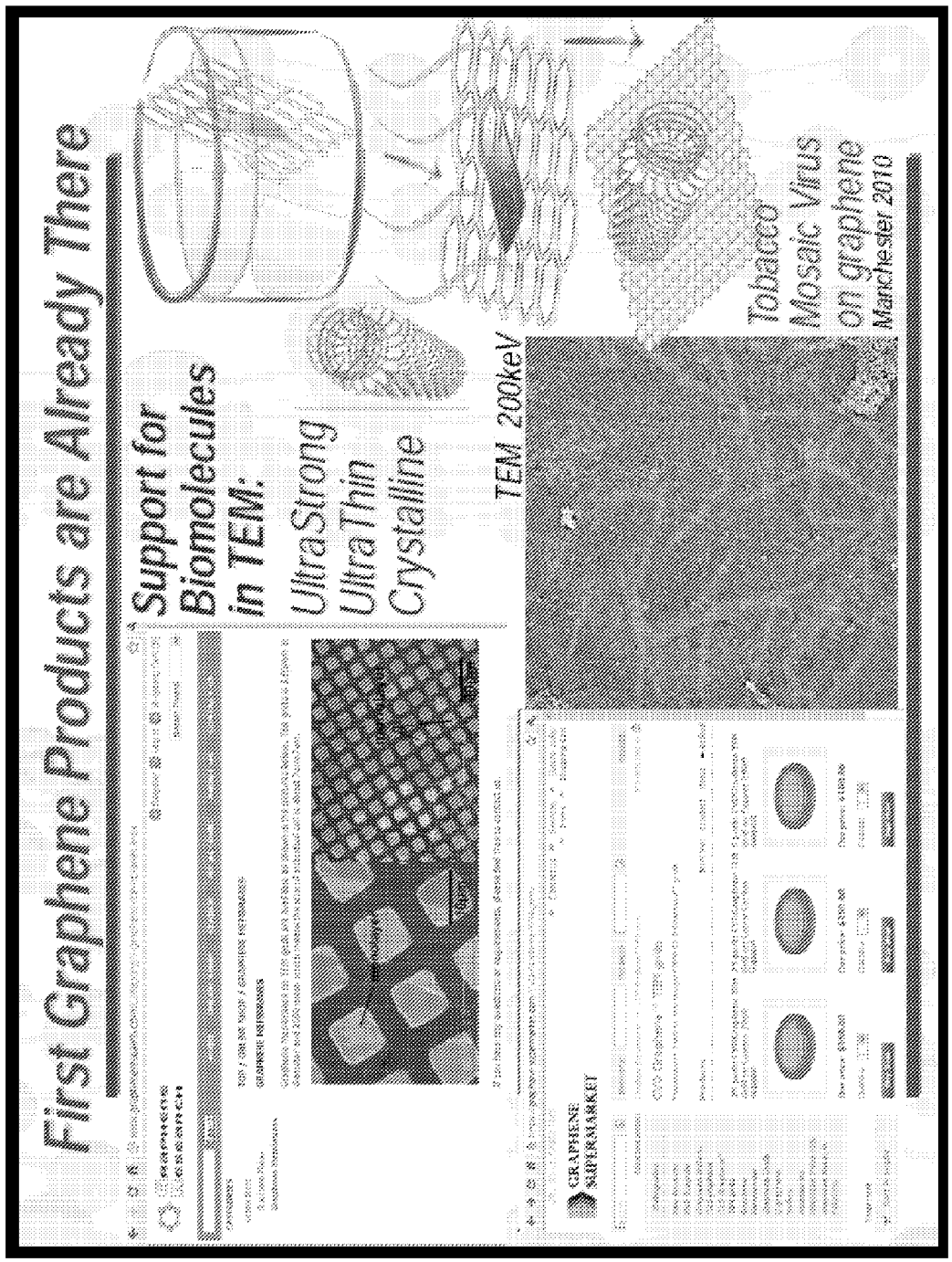
Figure 50:
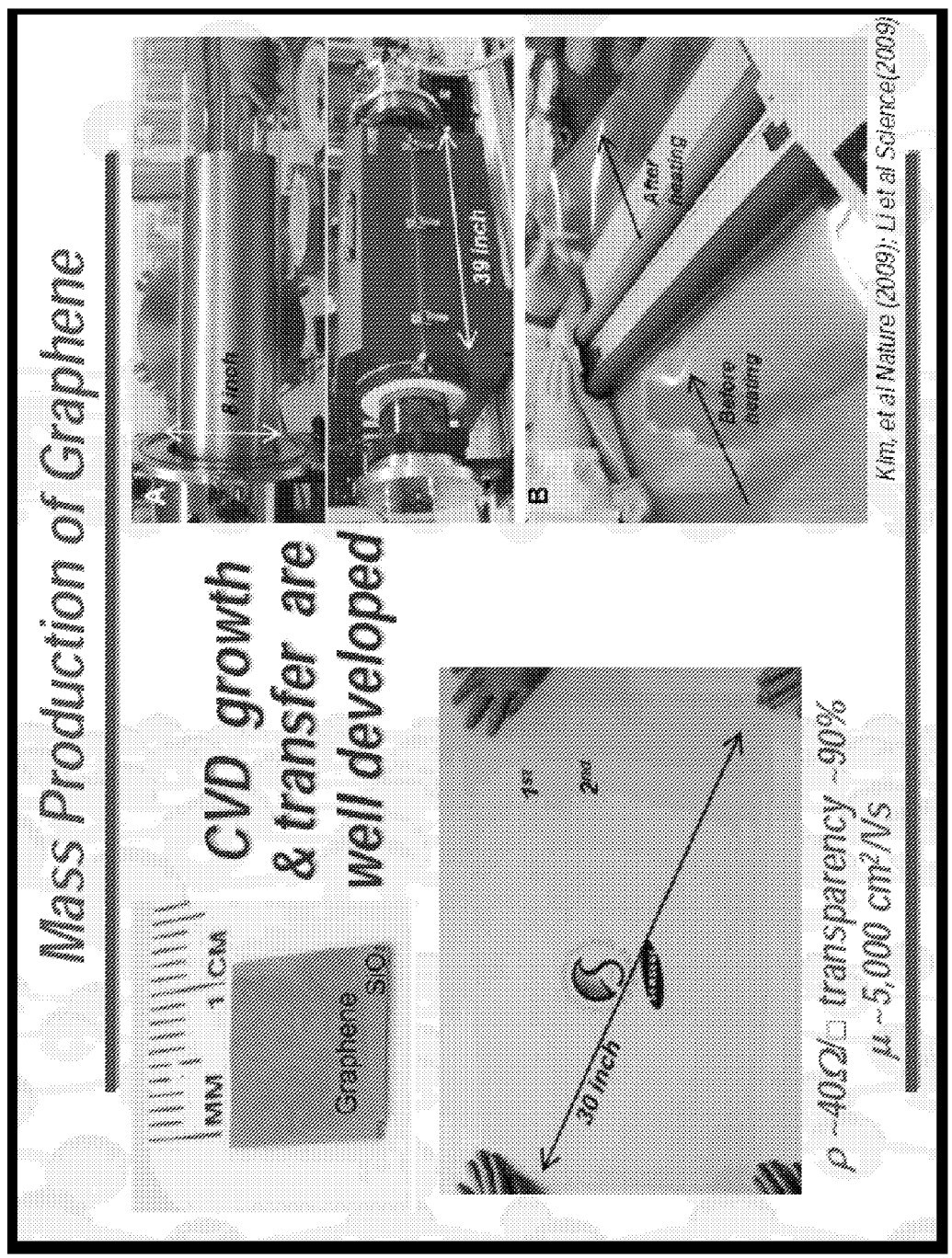

In another aspect, the present invention may provide an electronic device including an aforementioned graphene heterostructure. The electronic device may be: e.g. a liquid crystal display e.g. as depicted in FIG. 45; e.g. a touch screen, solar cell, strain gauge or gas sensor e.g. as depicted in FIG. 51.

Herein, "approximately equal" preferably means equal to the extent that there is a percentage difference (or "error") of no more than 50%, 40%, 30%, 20%, 10%, 5%, 2% or 1%.

The invention also includes any combination of the aspects and preferred features described except where such a combination is clearly impermissible or expressly avoided.

Embodiments of our proposals are discussed below, with reference to the accompanying drawings in which:

FIG. 1(*a*), which relates to Experiment 1, is an optical micrograph of a grapheme-boron-nitride (GBN) device.

FIG. 1(*b*), which relates to Experiment 1, shows σ as a function of back-gate voltage $V_g$ for a GBN device, measured in the standard four-probe geometry.

Figure 2:
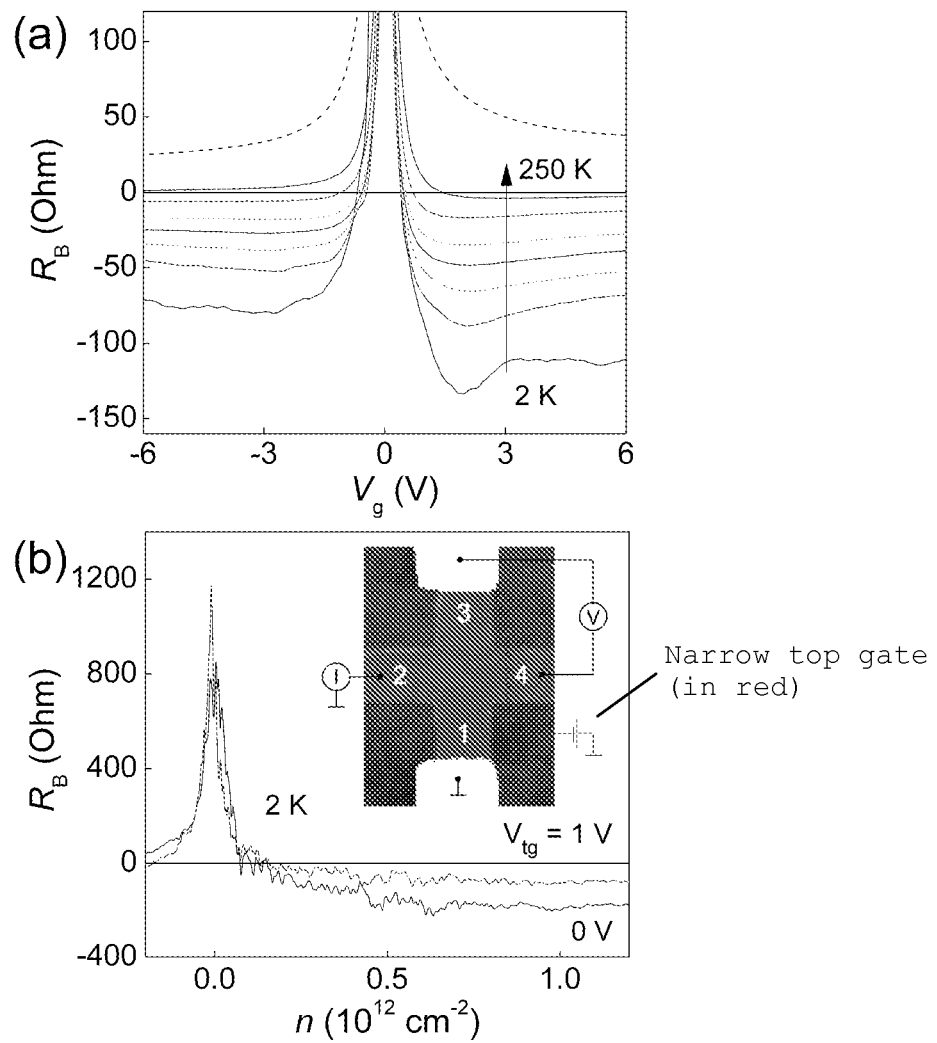

FIG. 2(*a*), which relates to Experiment 1, shows bend resistance at various T for the same device as in FIG. 1(*b*).

FIG. 2(*b*) (Inset), which relates to Experiment 1, shows atomic force micrograph of a Hall cross.

FIG. 2(*b*) (Main panel), which relates to Experiment 1, shows $R_B(n)$ for a device with a top gate.

Figure 3:
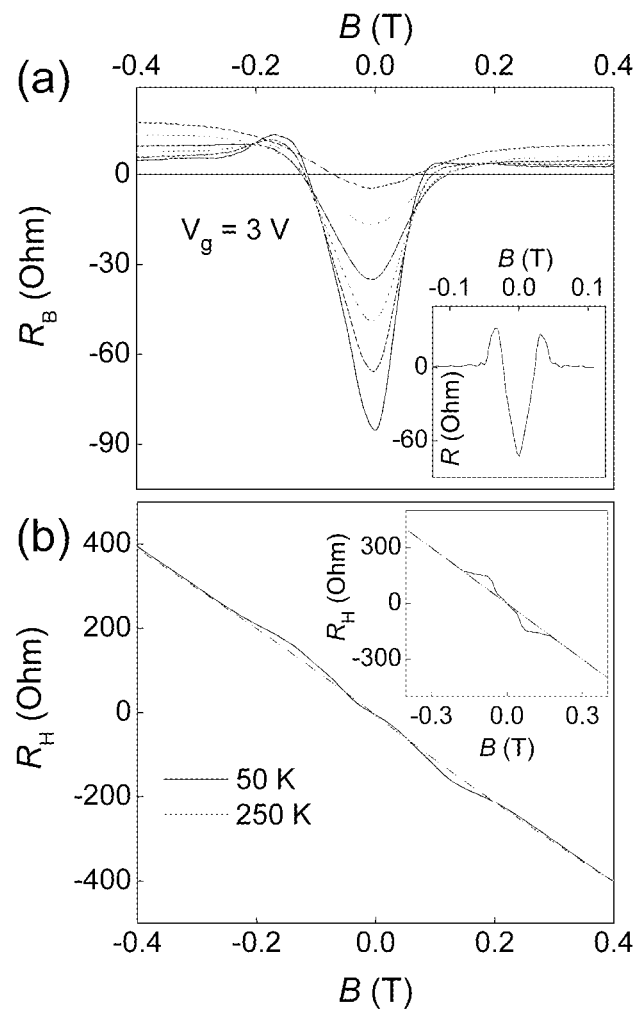

FIG. 3(*a*), which relates to Experiment 1, shows $R_B(B)$ for a fixed $n \approx 6 \times 10^{11}$ cm$^{-2}$.

FIG. 3(*b*), which relates to Experiment 1, shows Hall resistance $R_H$ measured at 50 and 250 K.

FIG. 3(*b*) (Inset), which relates to Experiment 1, shows $R_H(B)$ found theoretically for rounded corners.

Figure 4:
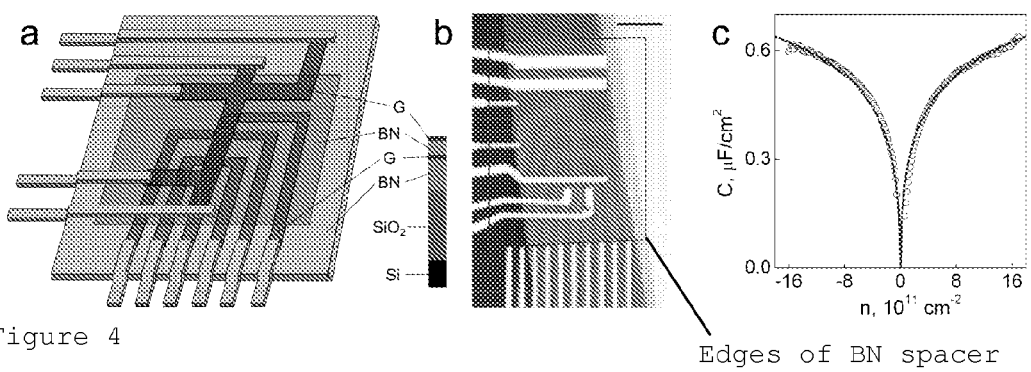

FIG. 4(*a*), which relates to Experiment 2, is a device schematic of the multilayer sample.

FIG. 4(*b*), which relates to Experiment 2, is an optical image of the multilayer sample.

FIG. 4(*c*), which relates to Experiment 2, shows experimental results on quantum capacitance (circles) and simulations for different spacer thicknesses (solid lines).

Figure 5:
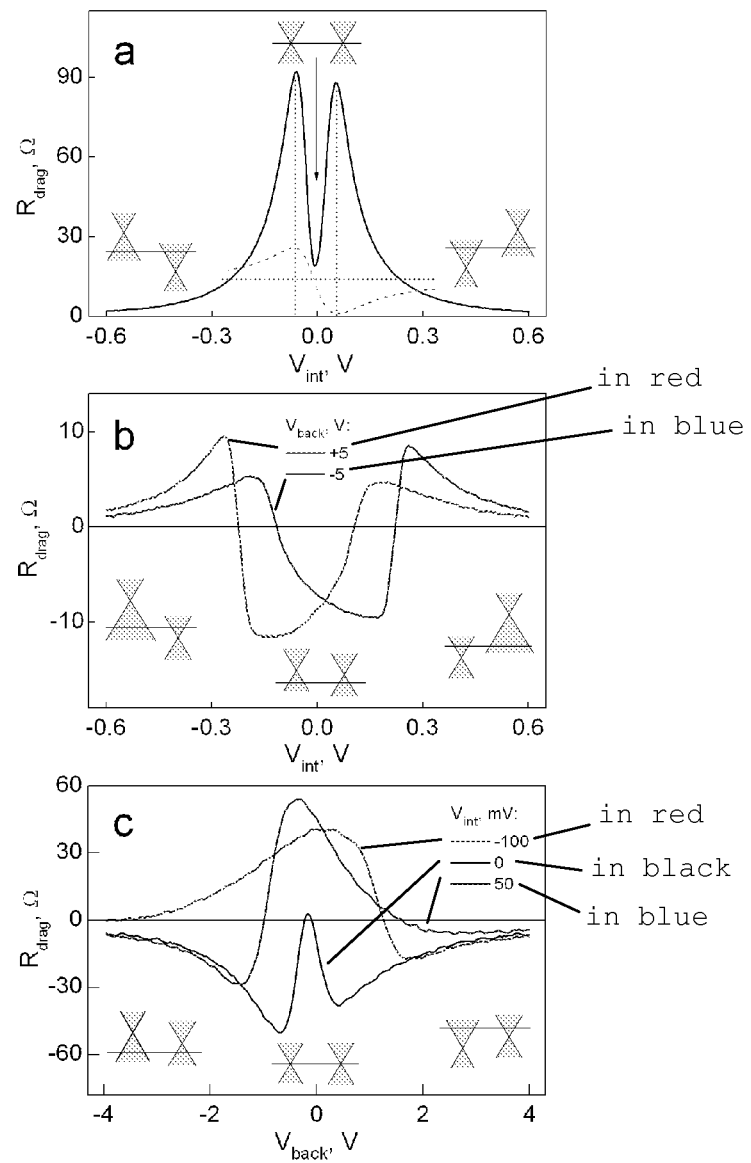

FIG. 5(*a*), which relates to Experiment 2, shows drag as a function of interlayer voltage (solid) for the symmetric case.

FIG. 5(*b*), which relates to Experiment 2, shows the drag resistance in the nonsymmetric case.

Figure 6:
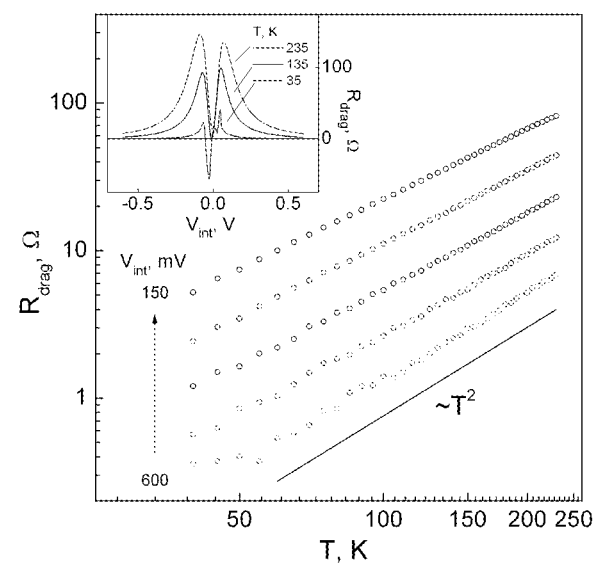

FIG. 5(c), which relates to Experiment 2, shows $R_{drag}$ as a function of back gate voltage FIG. 6, which relates to Experiment 2, shows Temperature dependence of drag resistance for different $V_{int}$.

FIG. 6 (Inset), which relates to Experiment 2, shows $R_{drag}(V_{int})$ at three different temperatures.

Figure 7:
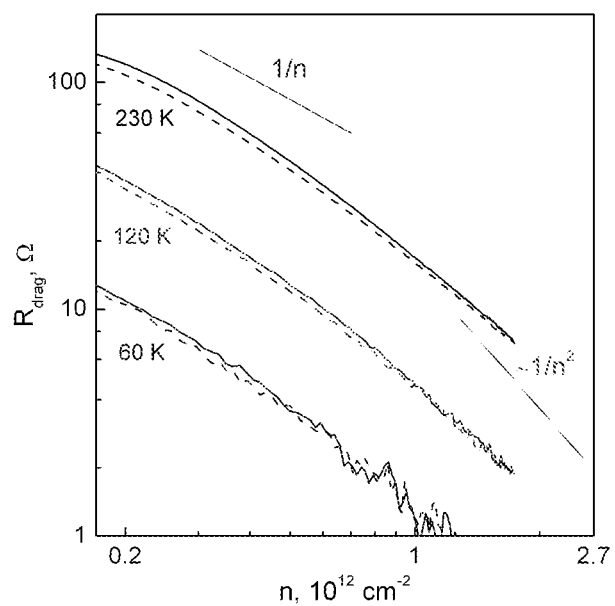
Figure 8:
Figure 9:
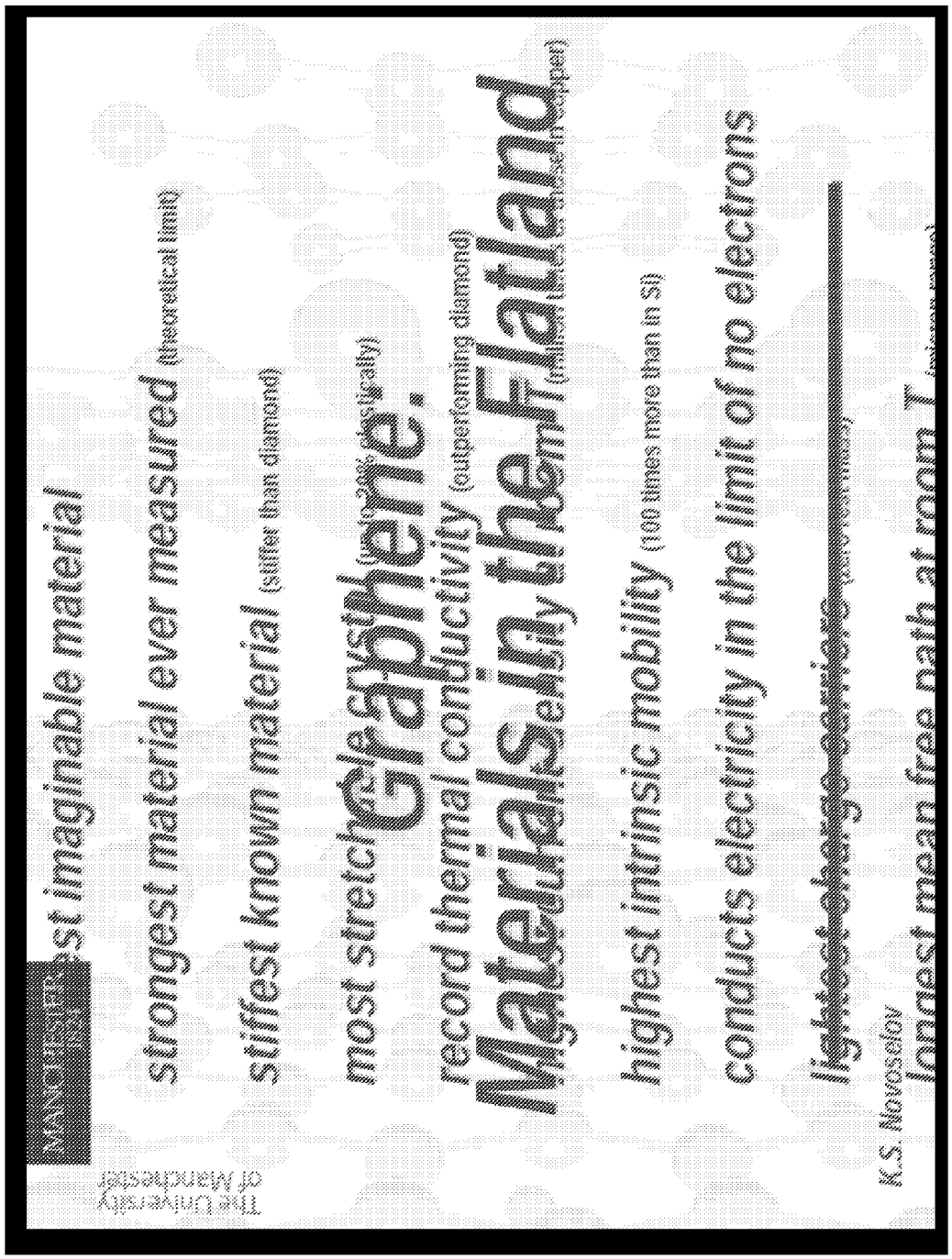
Figure 10:
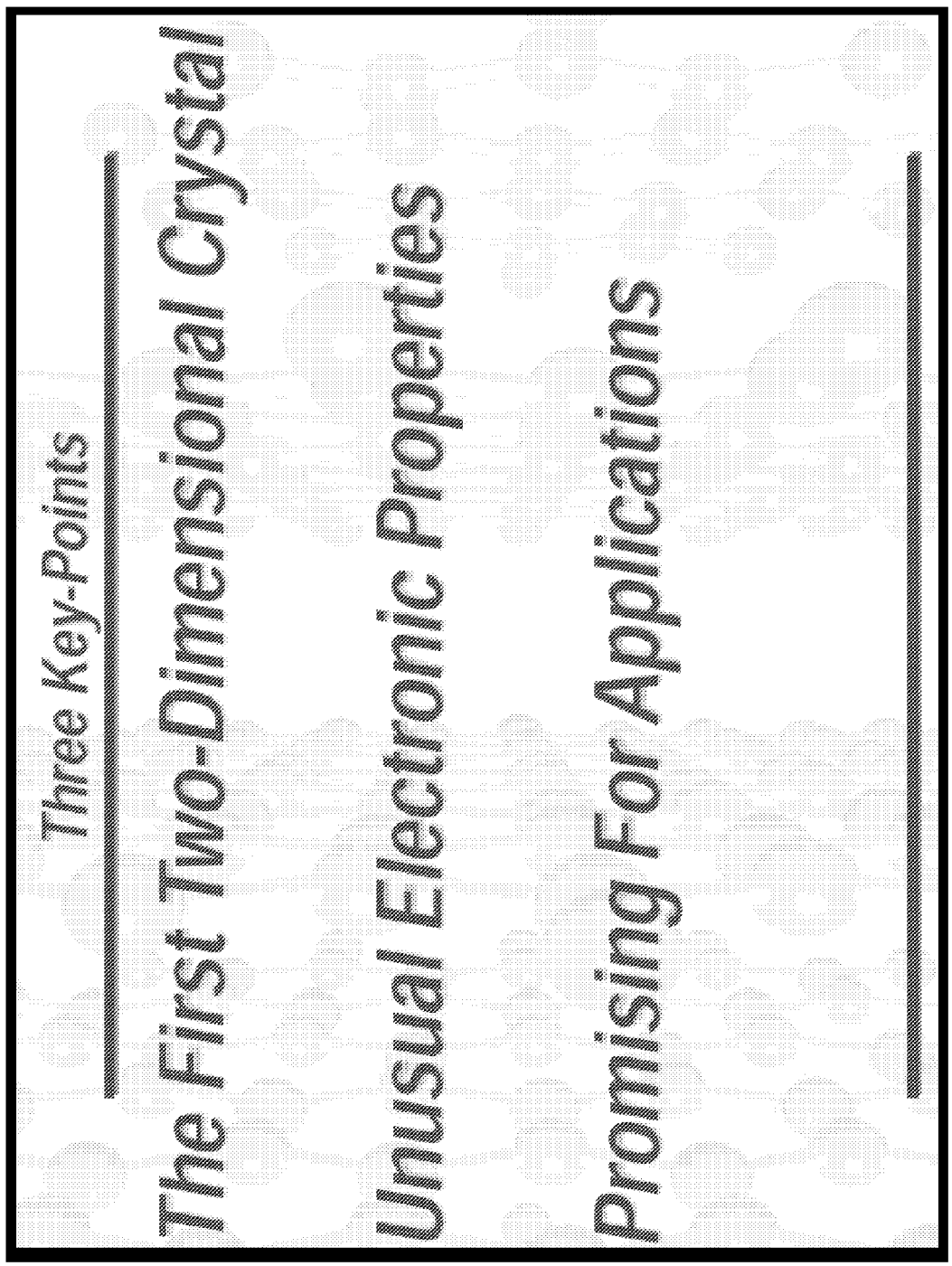
Figure 11:
Figure 12:
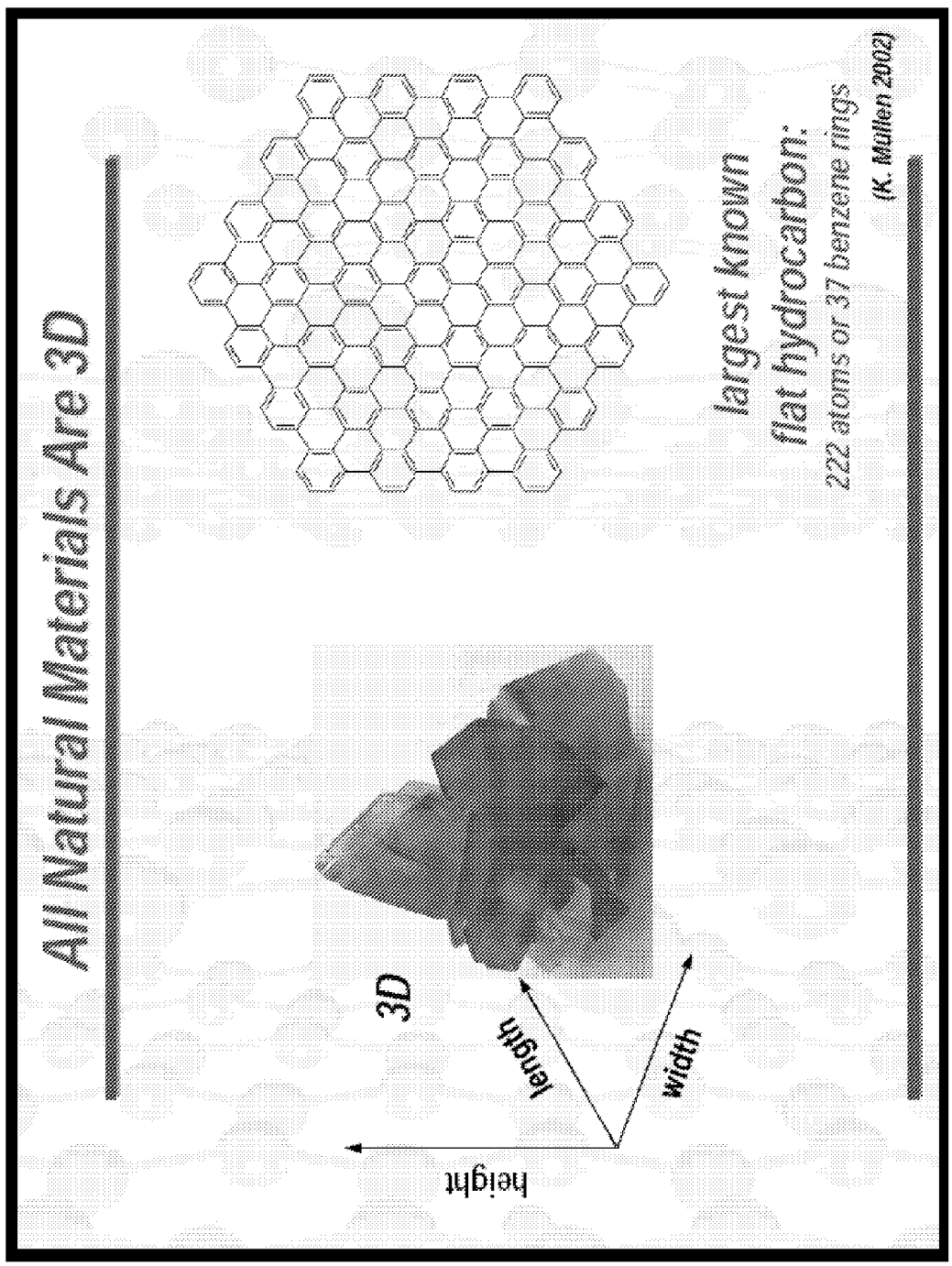
Figure 13:
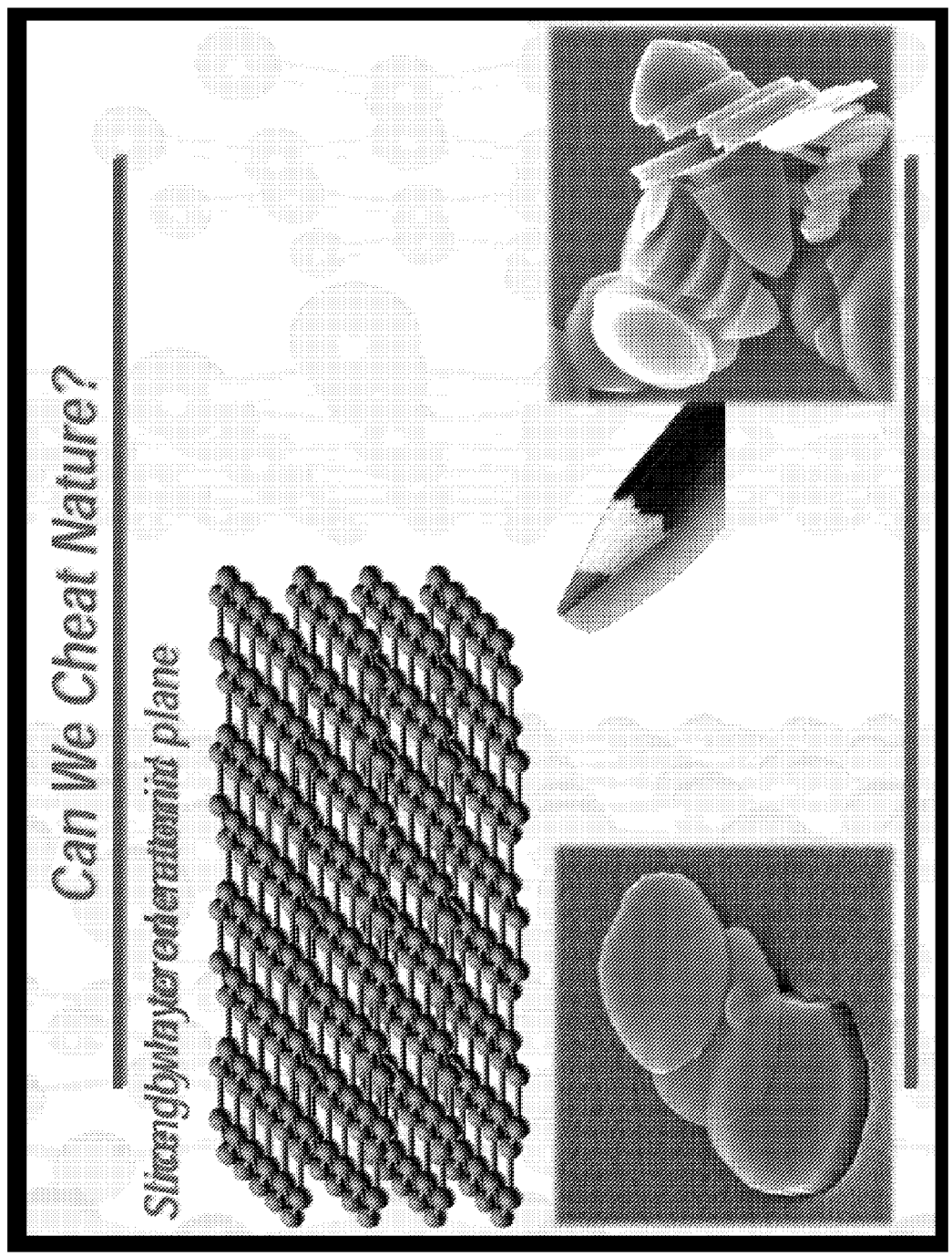
Figure 14:
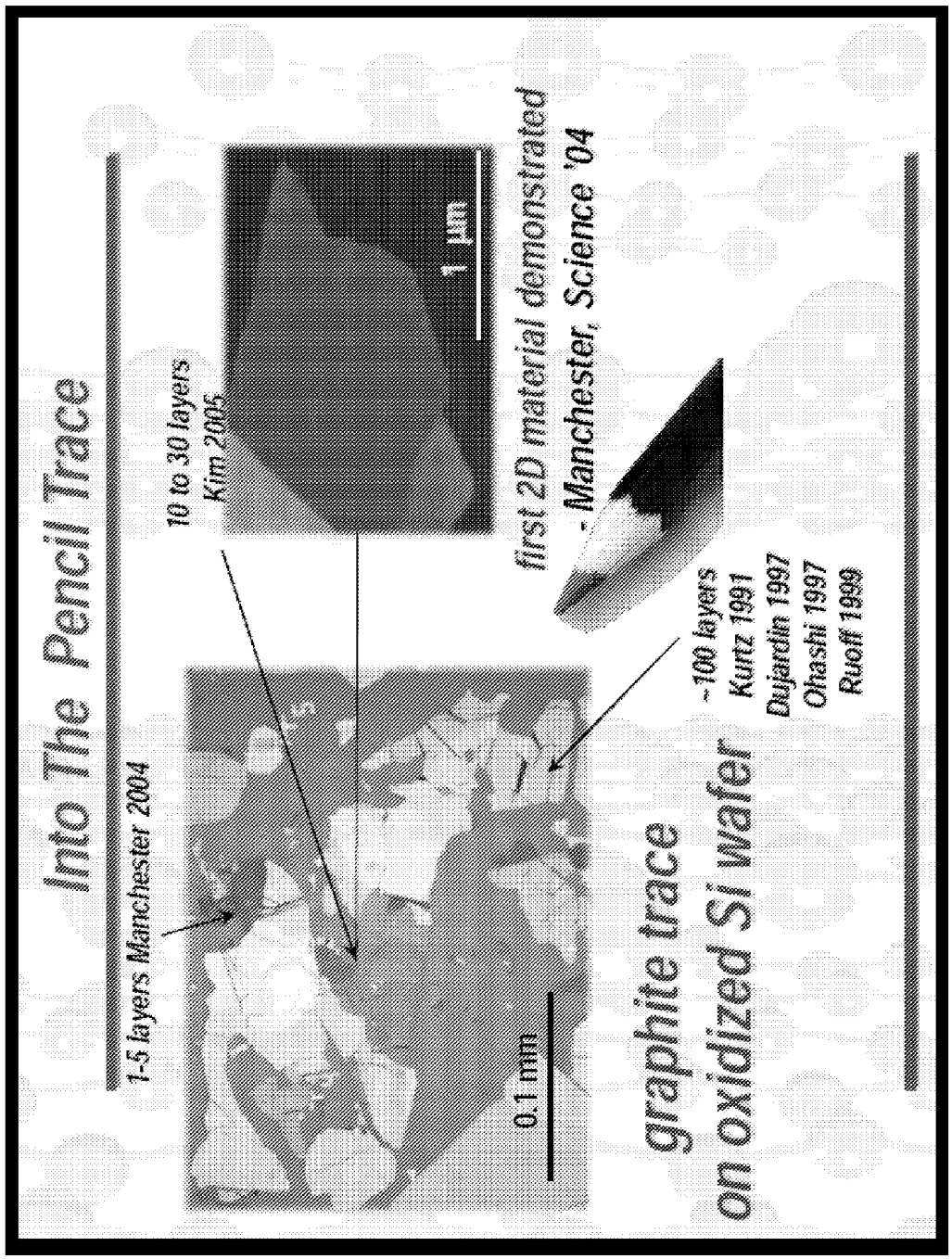
Figure 15:
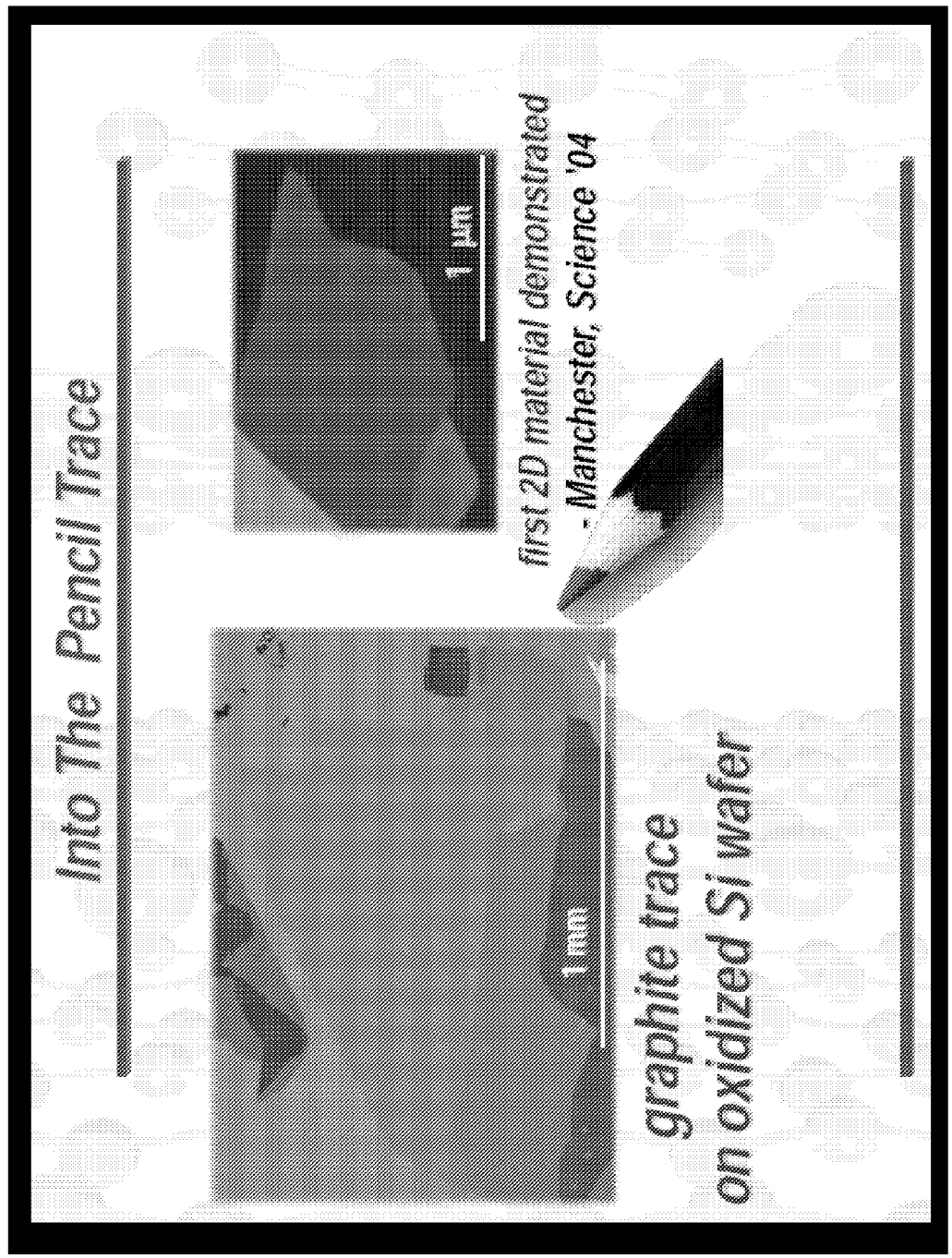
Figure 16:
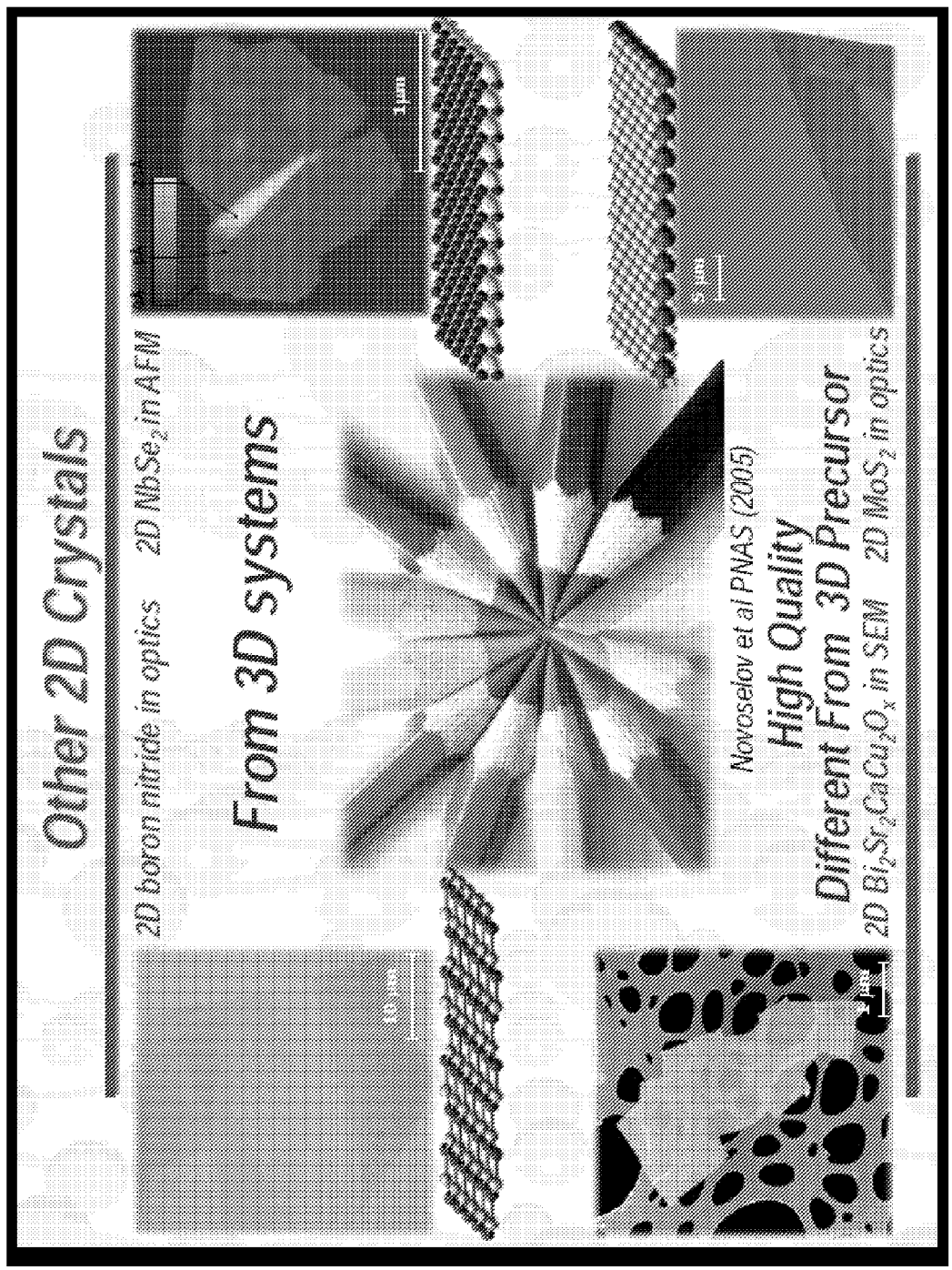
Figure 17:
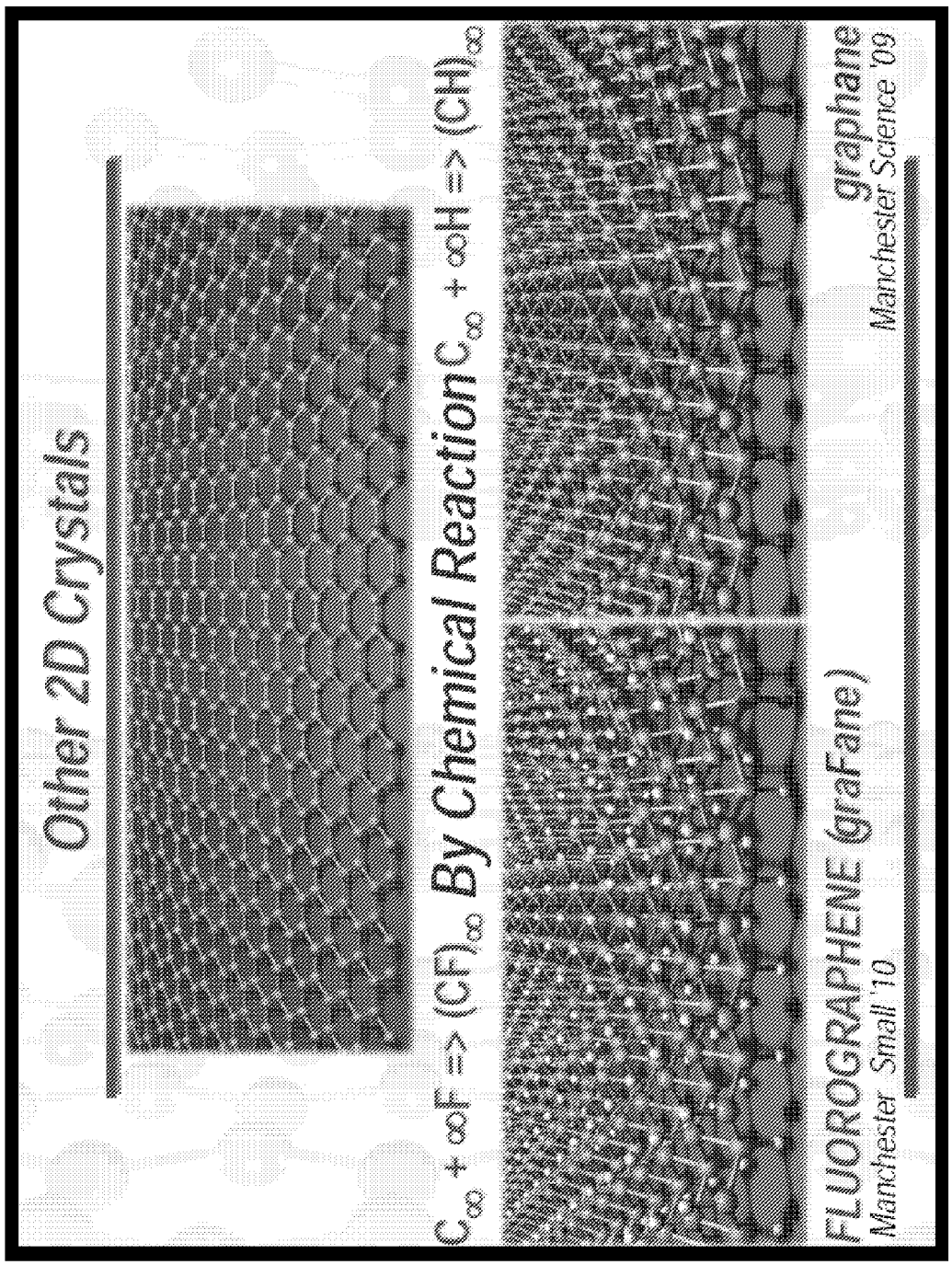
Figure 18:
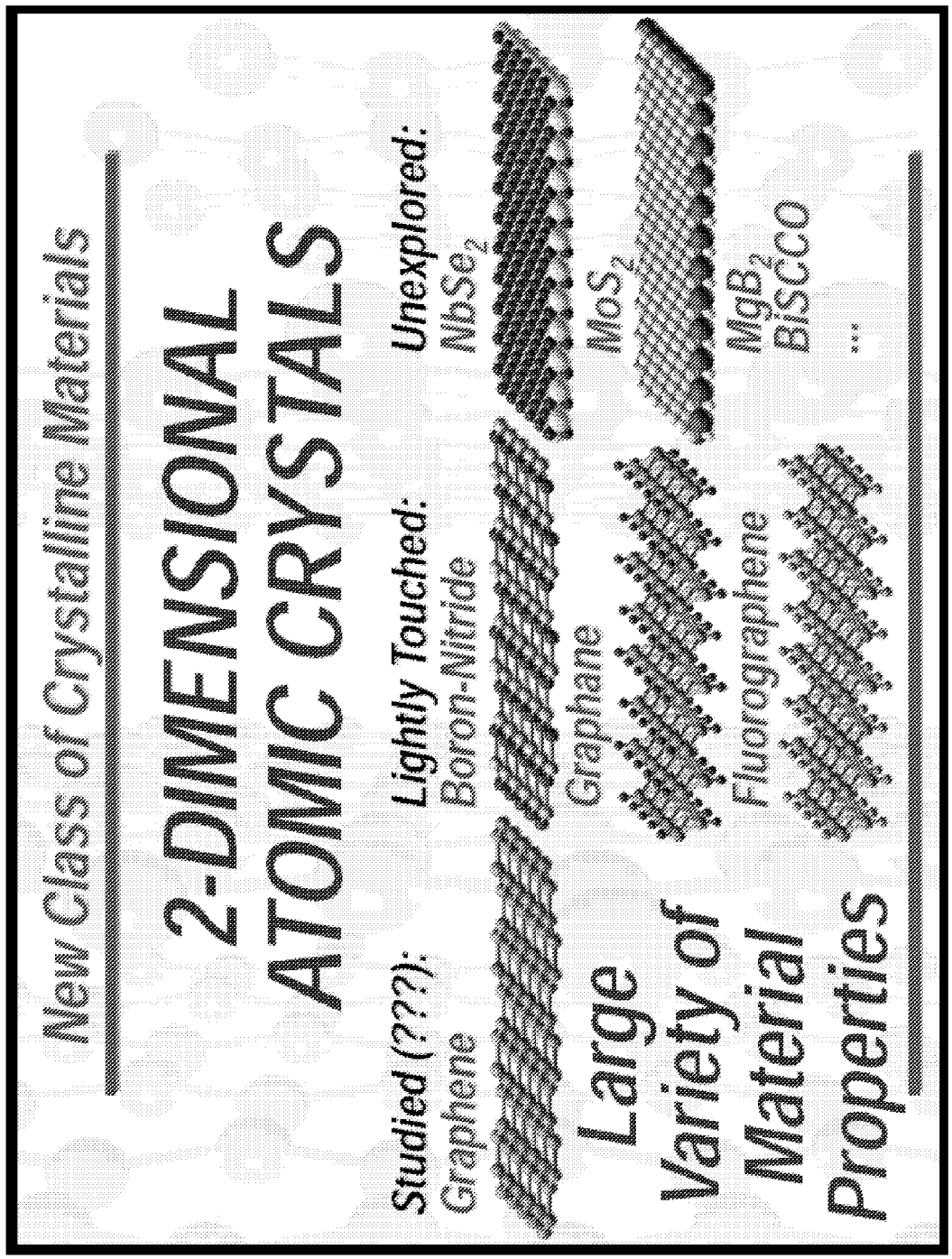
Figure 19:
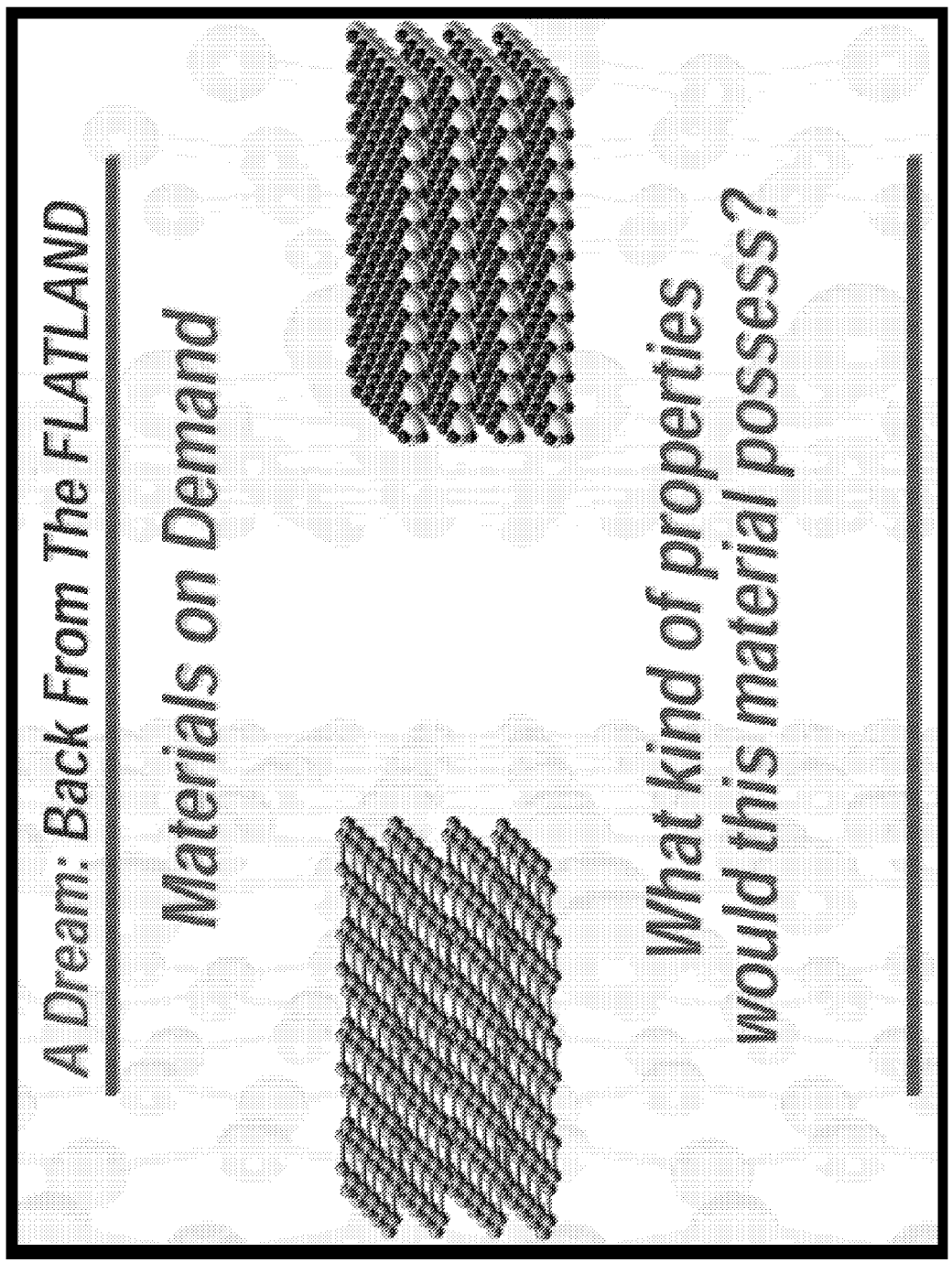
Figure 20:
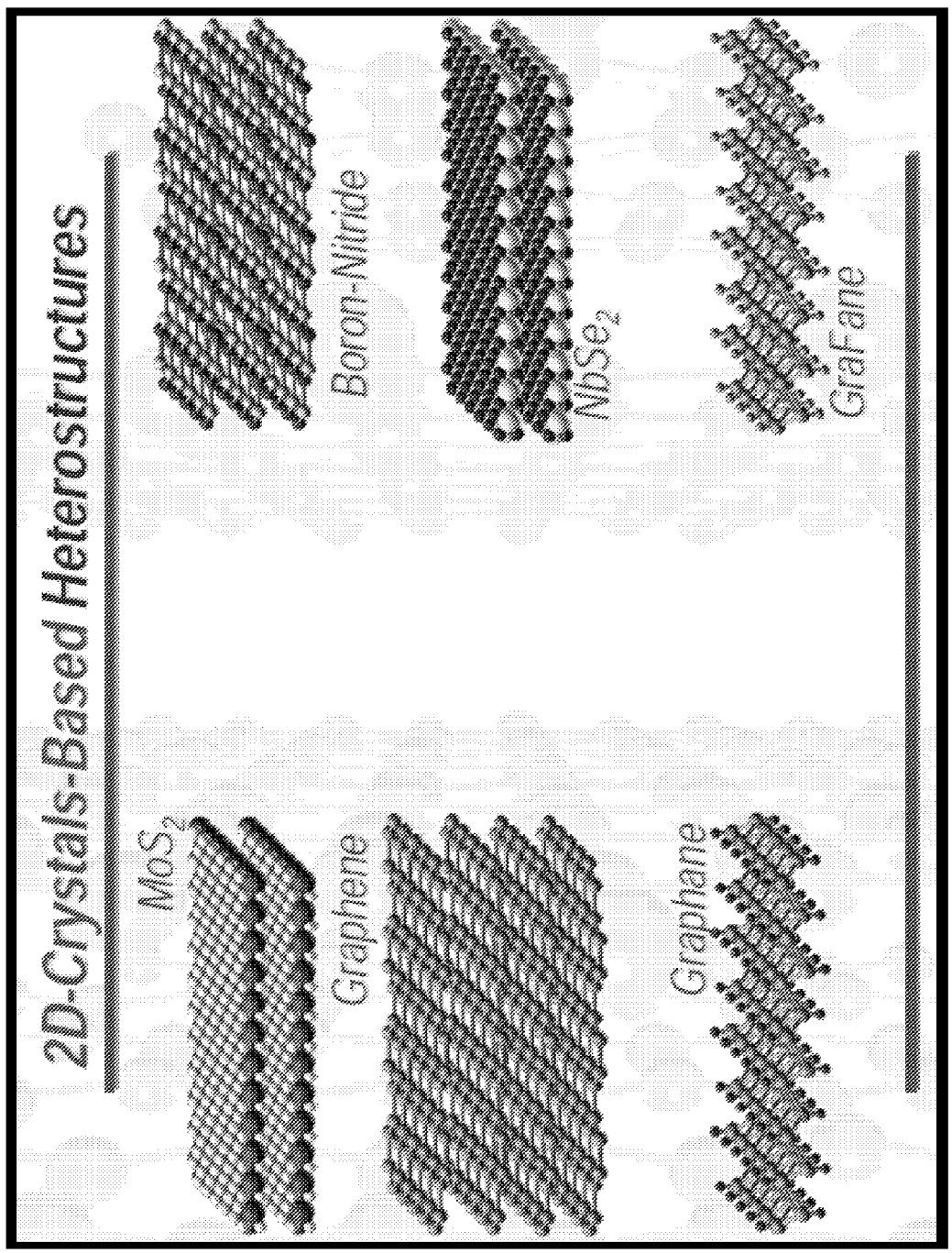
Figure 21:
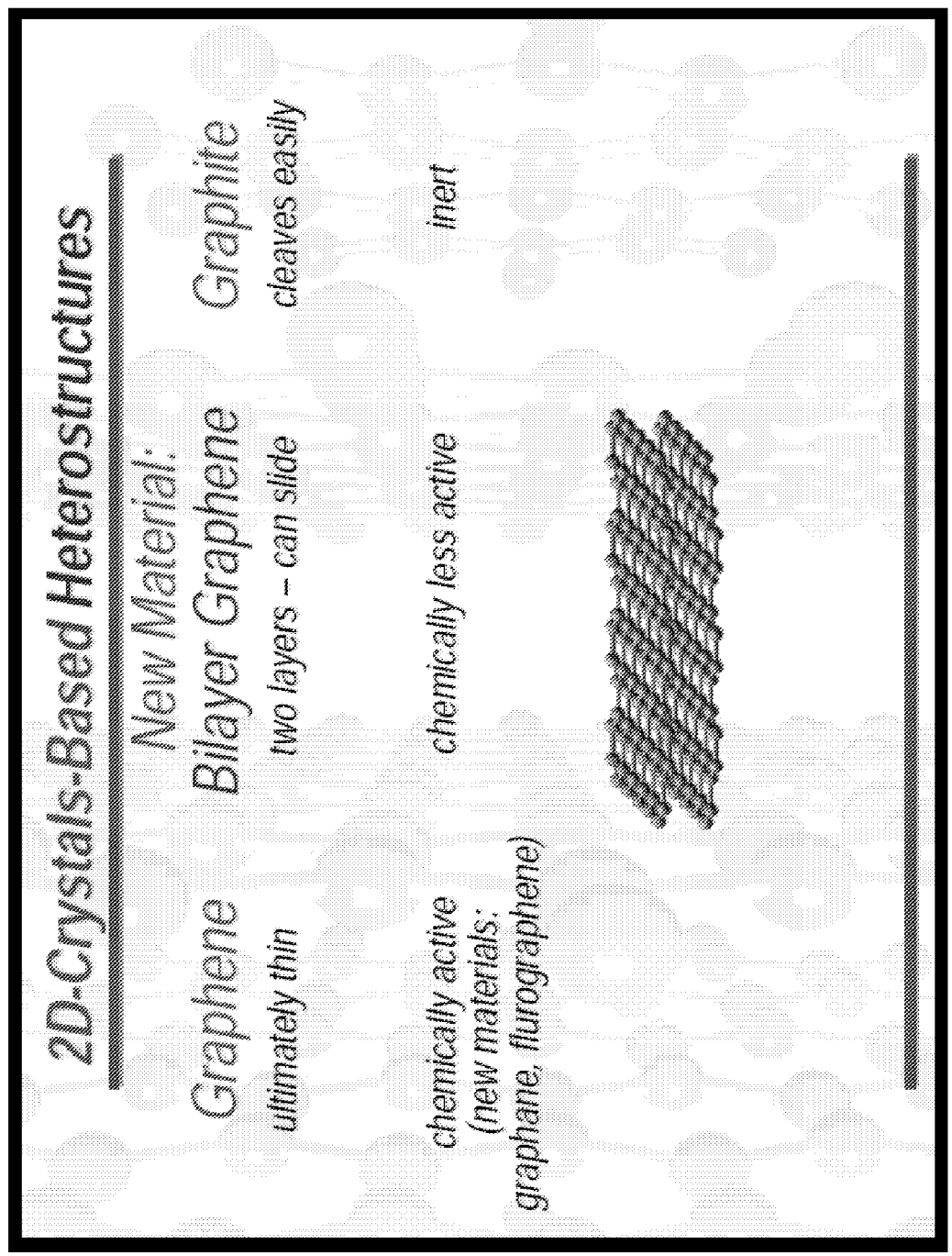
Figure 22:
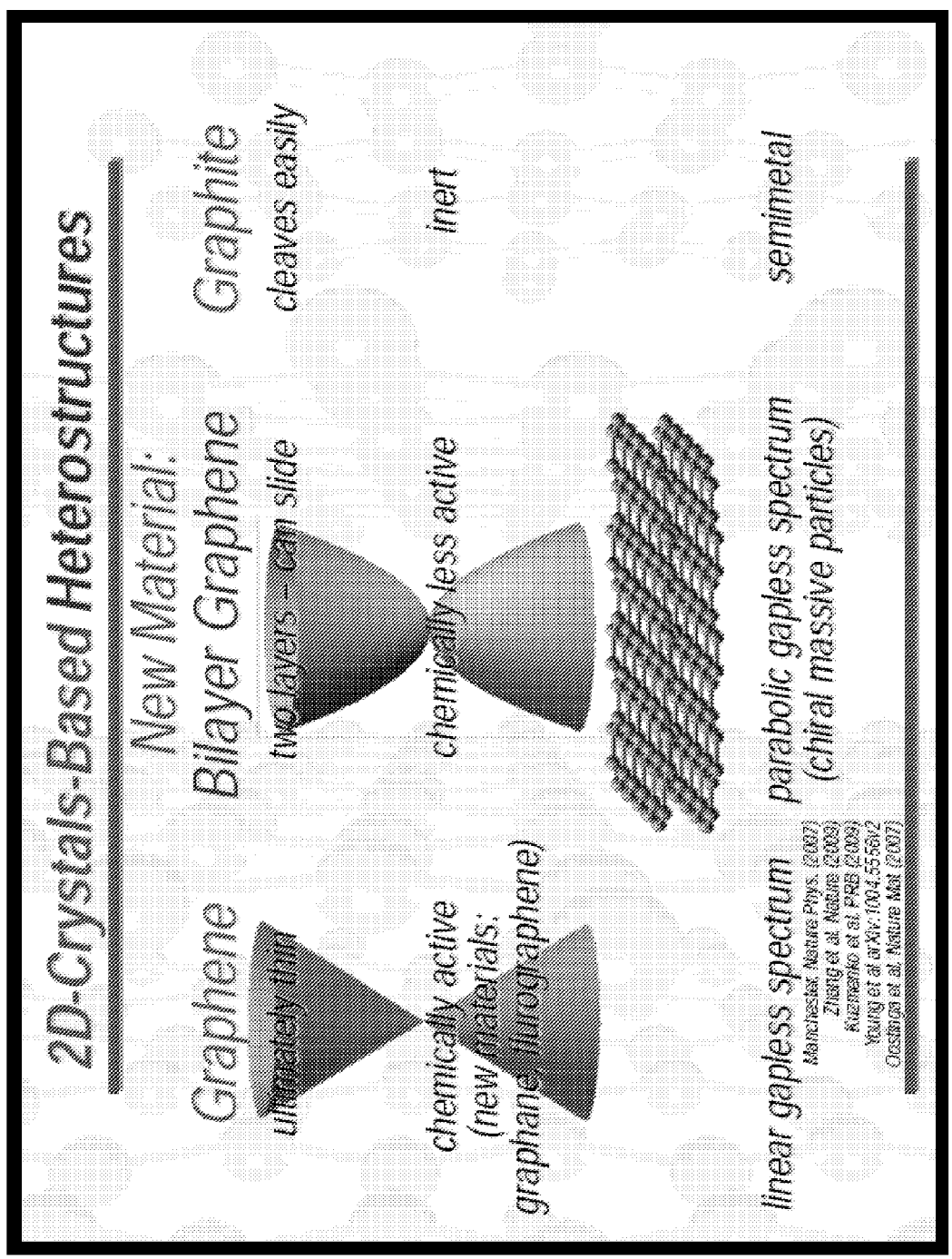
Figure 23:
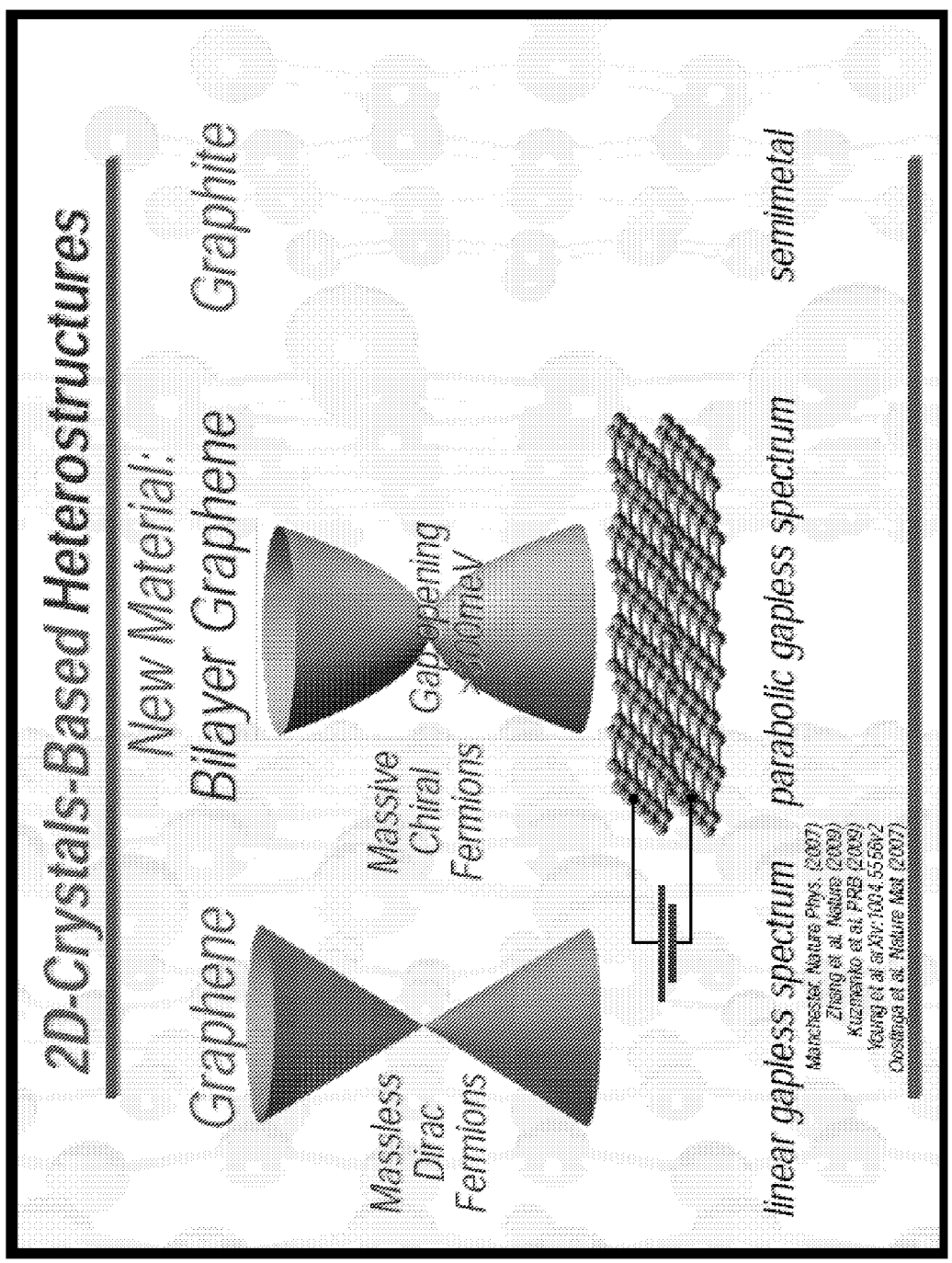
Figure 24:
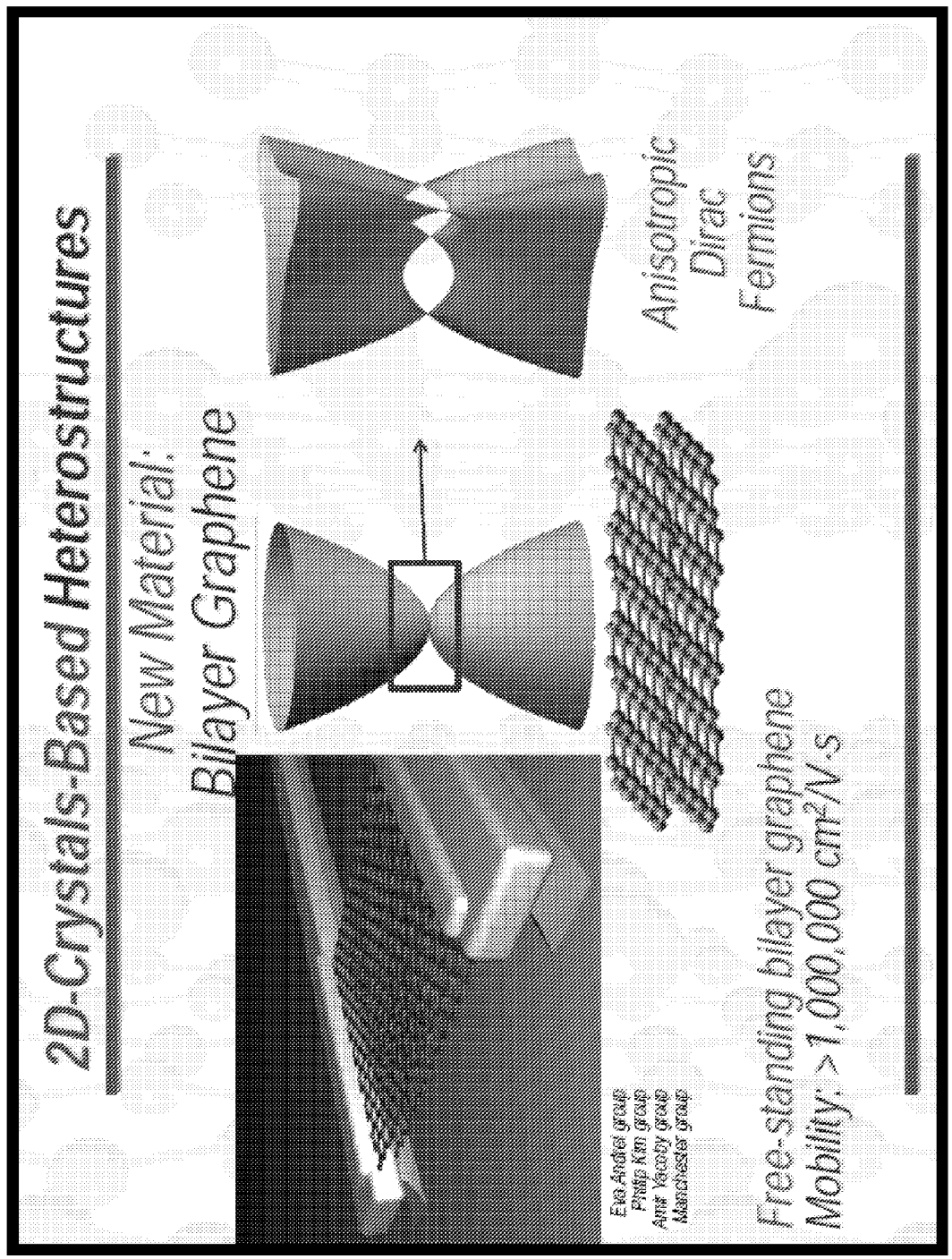
Figure 25:
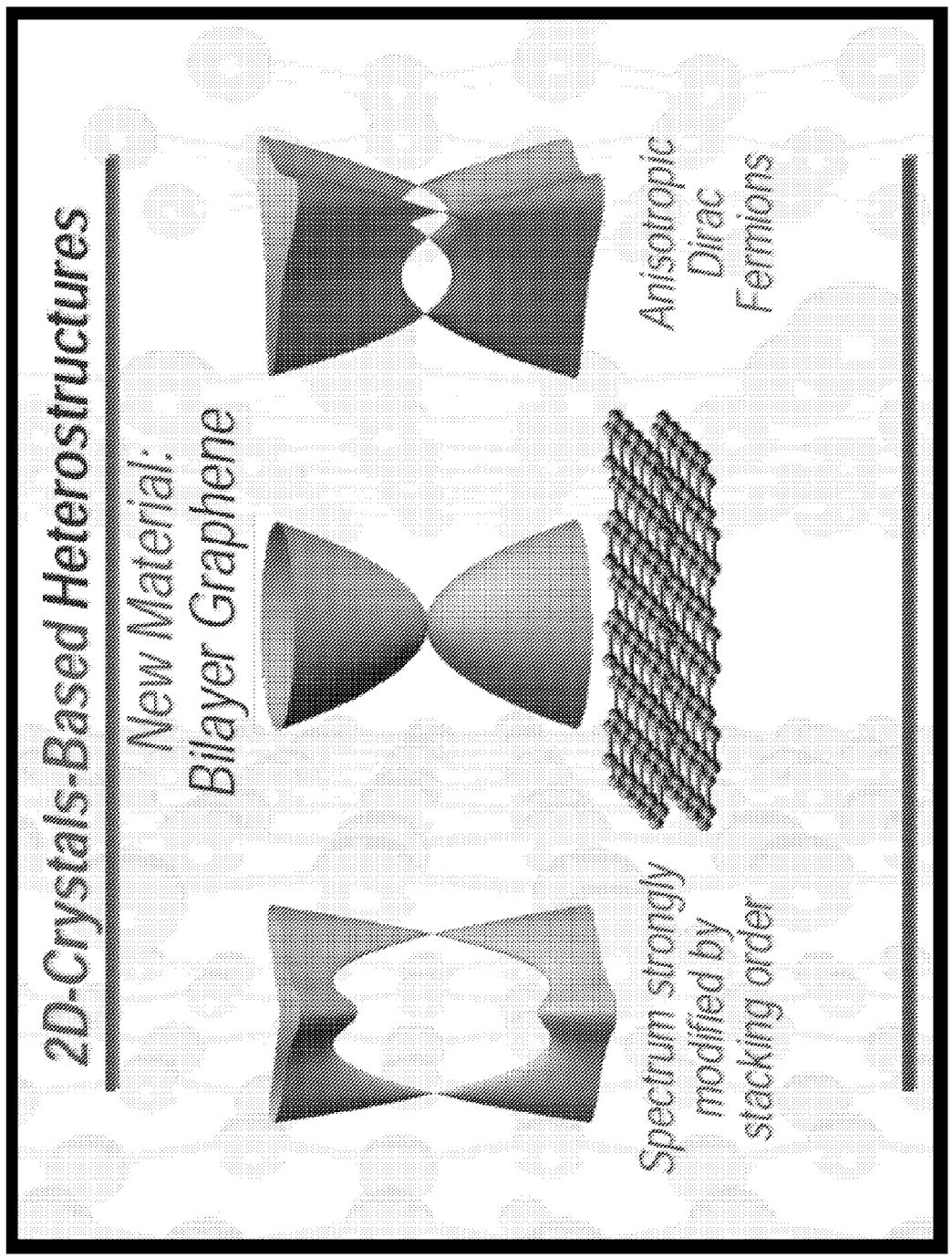
Figure 26:
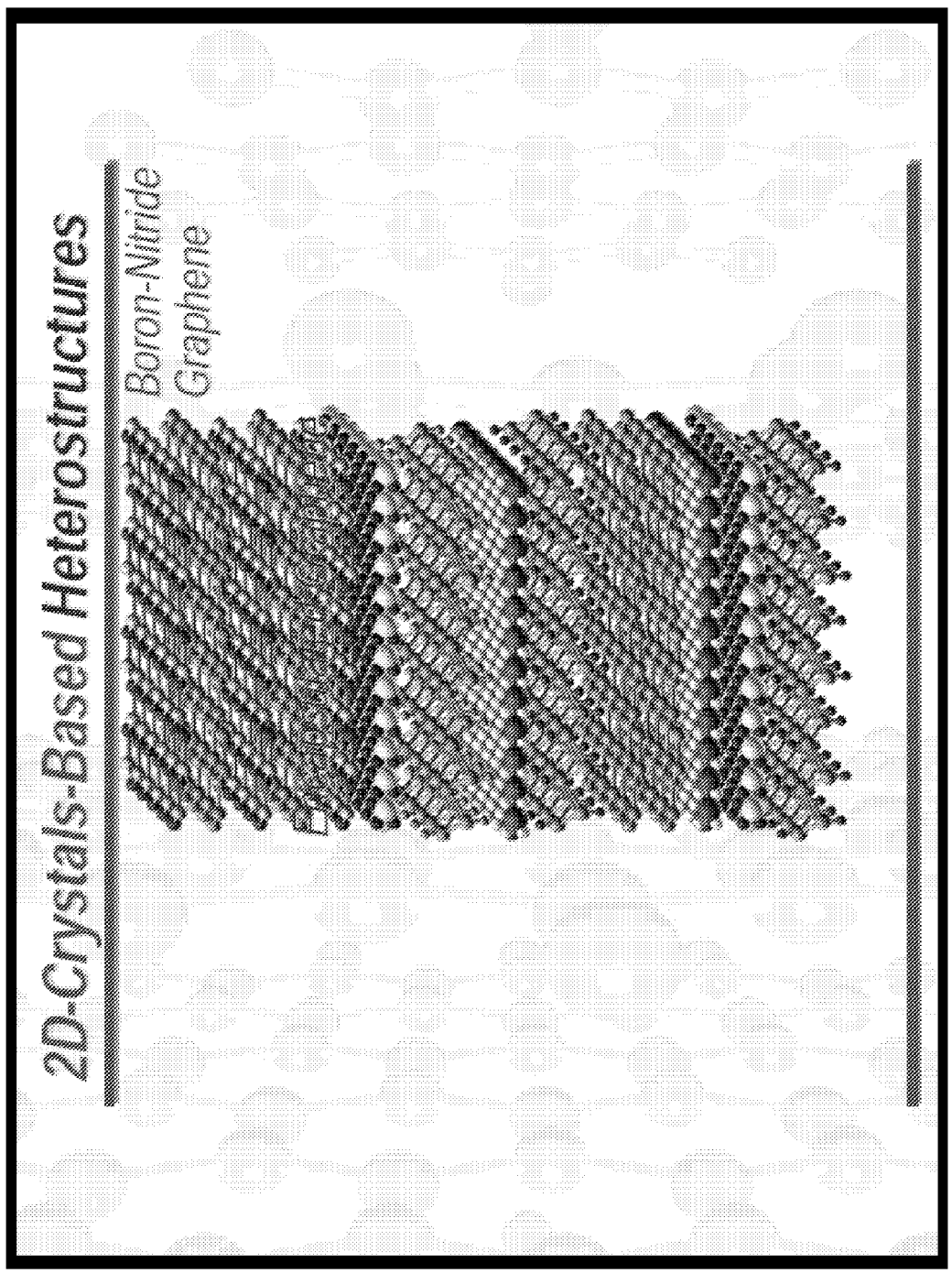
Figure 27:
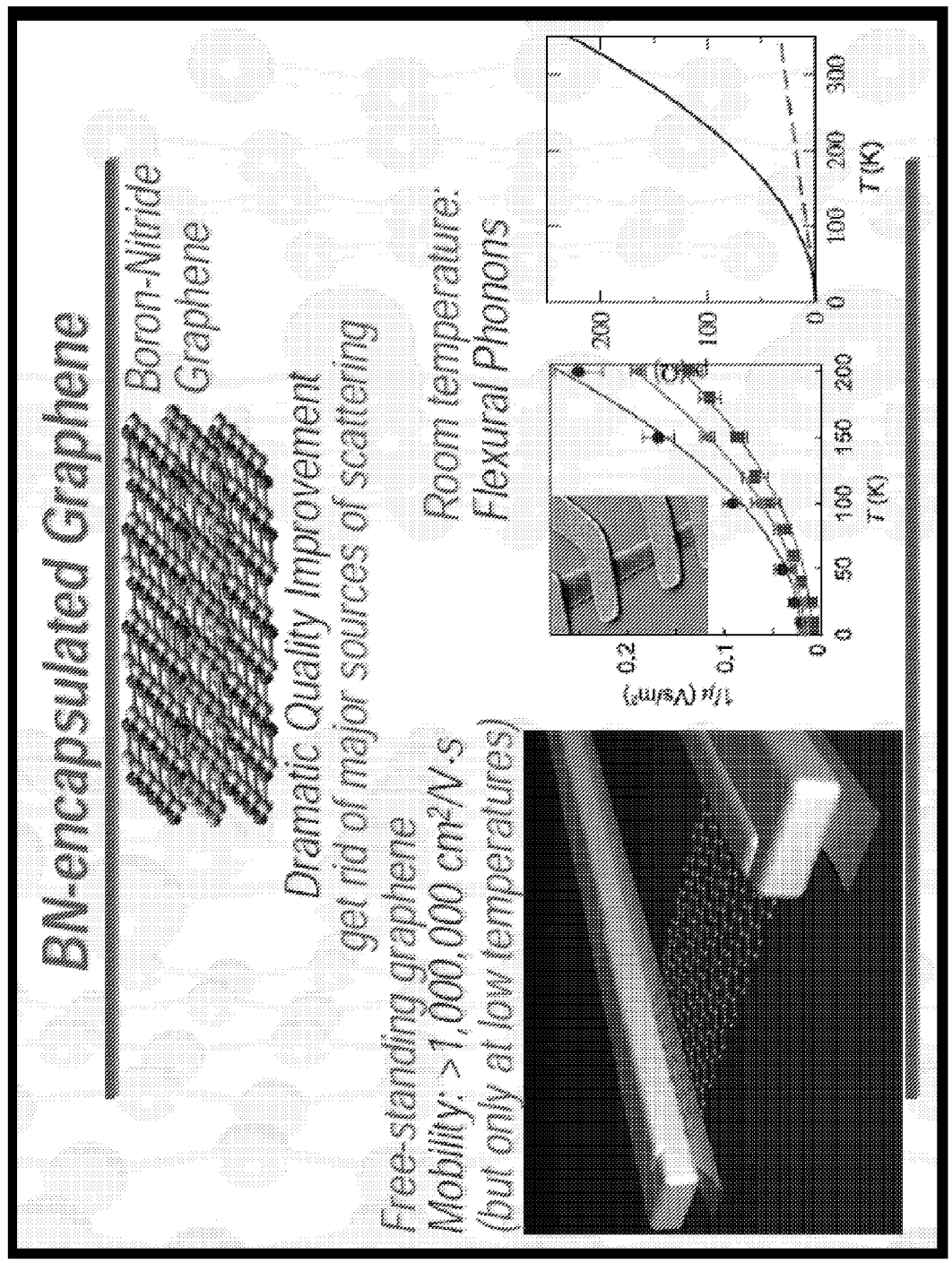
Figure 28:
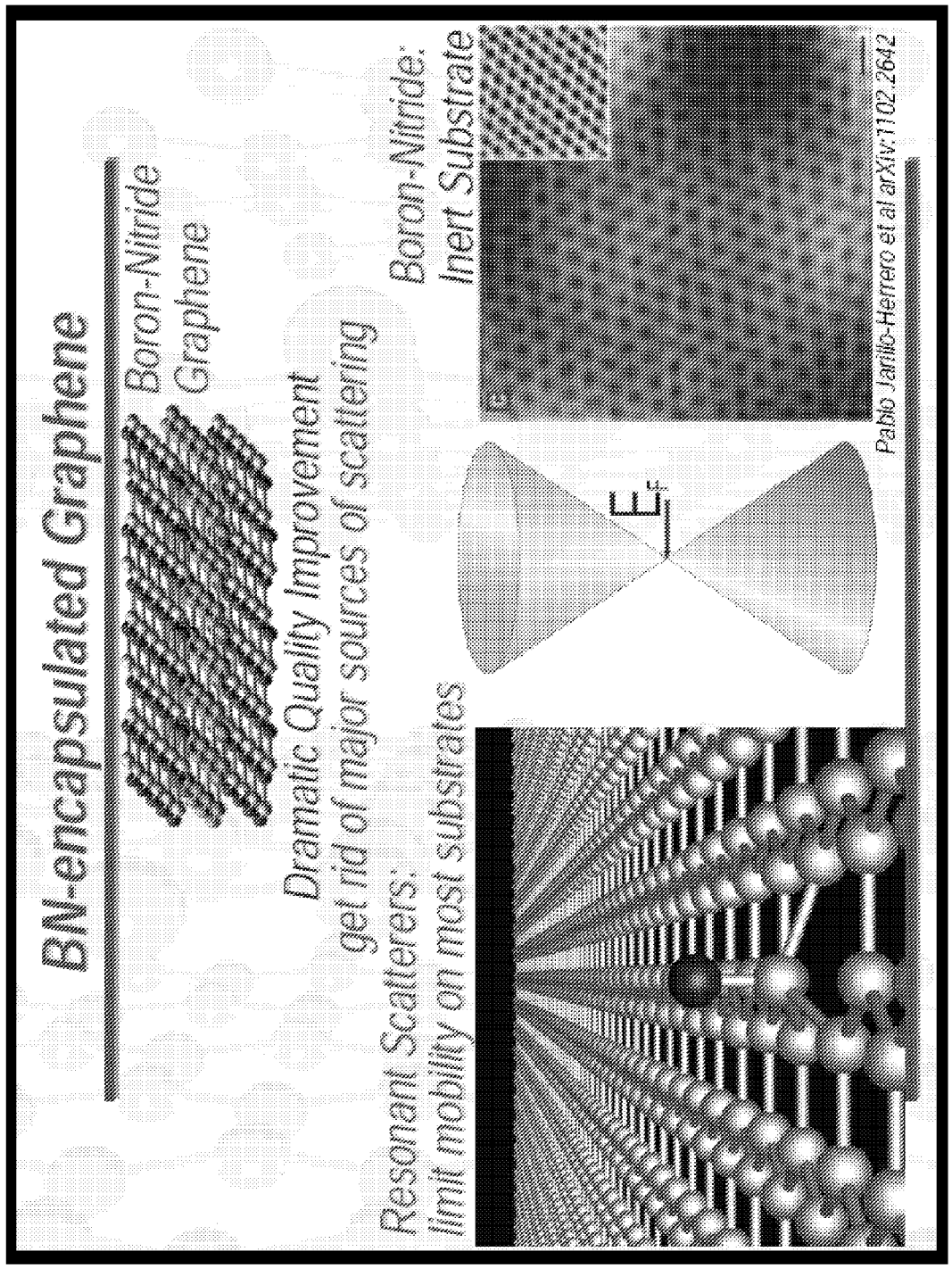
Figure 29:
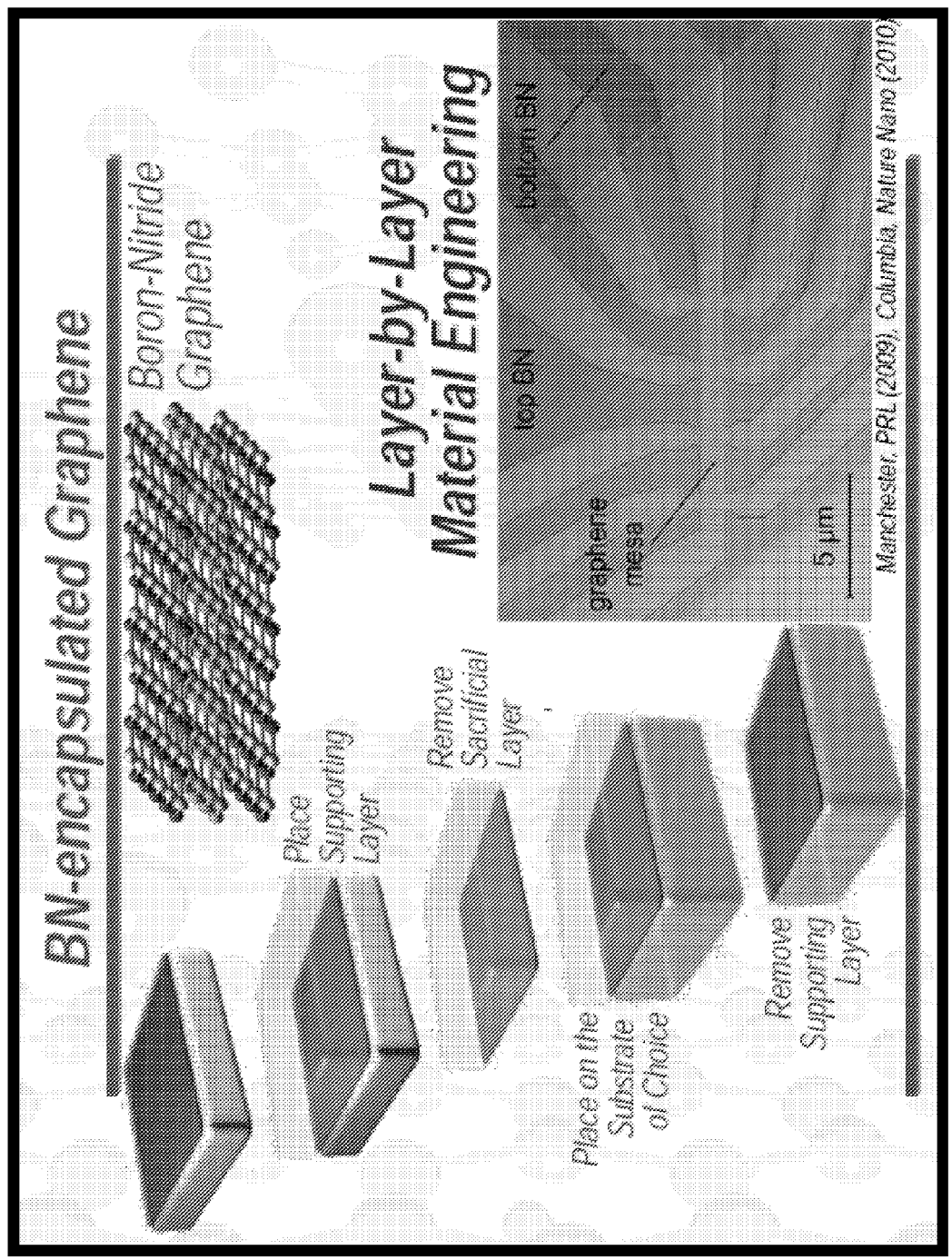
Figure 30:
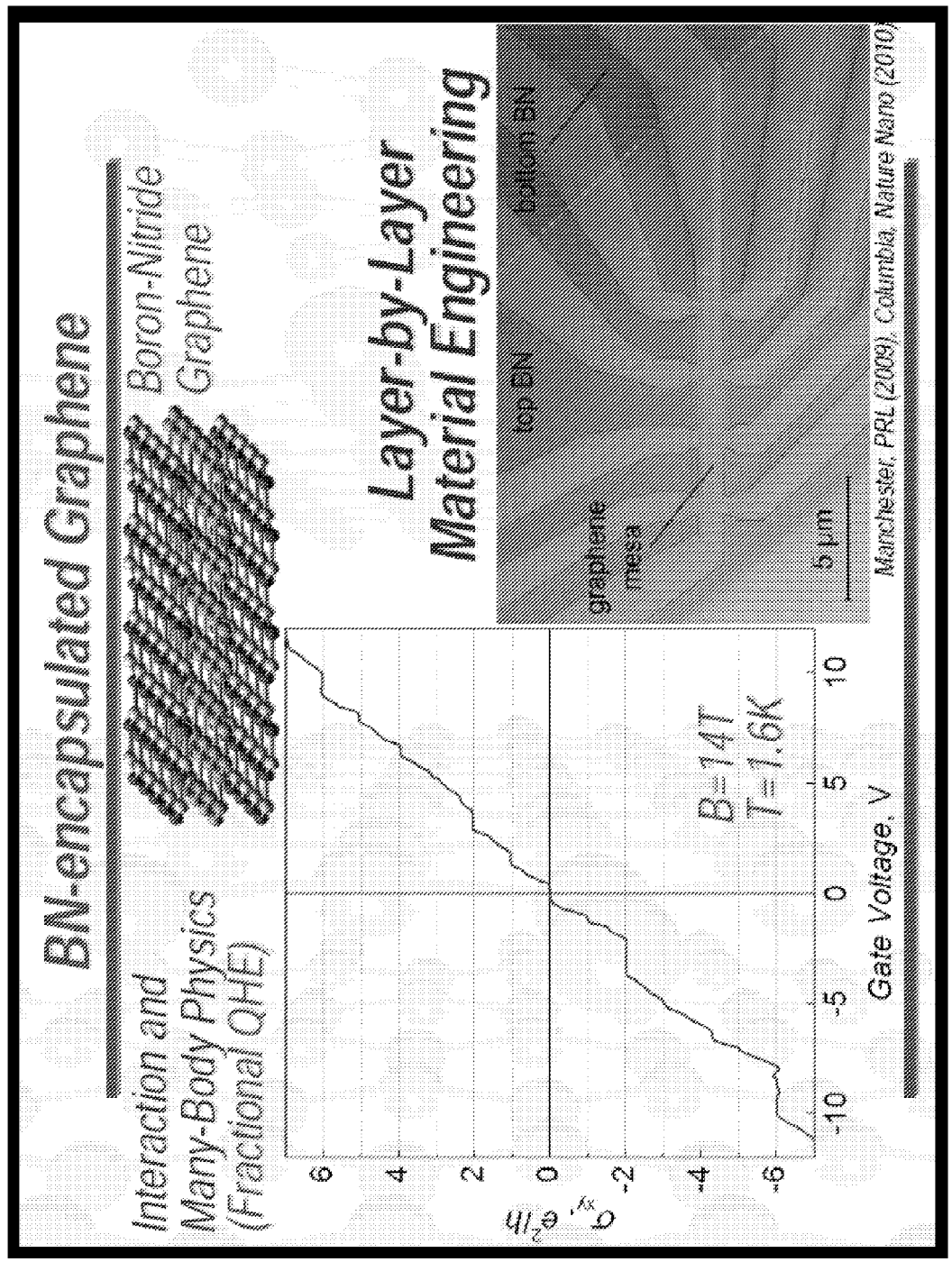
Figure 31:
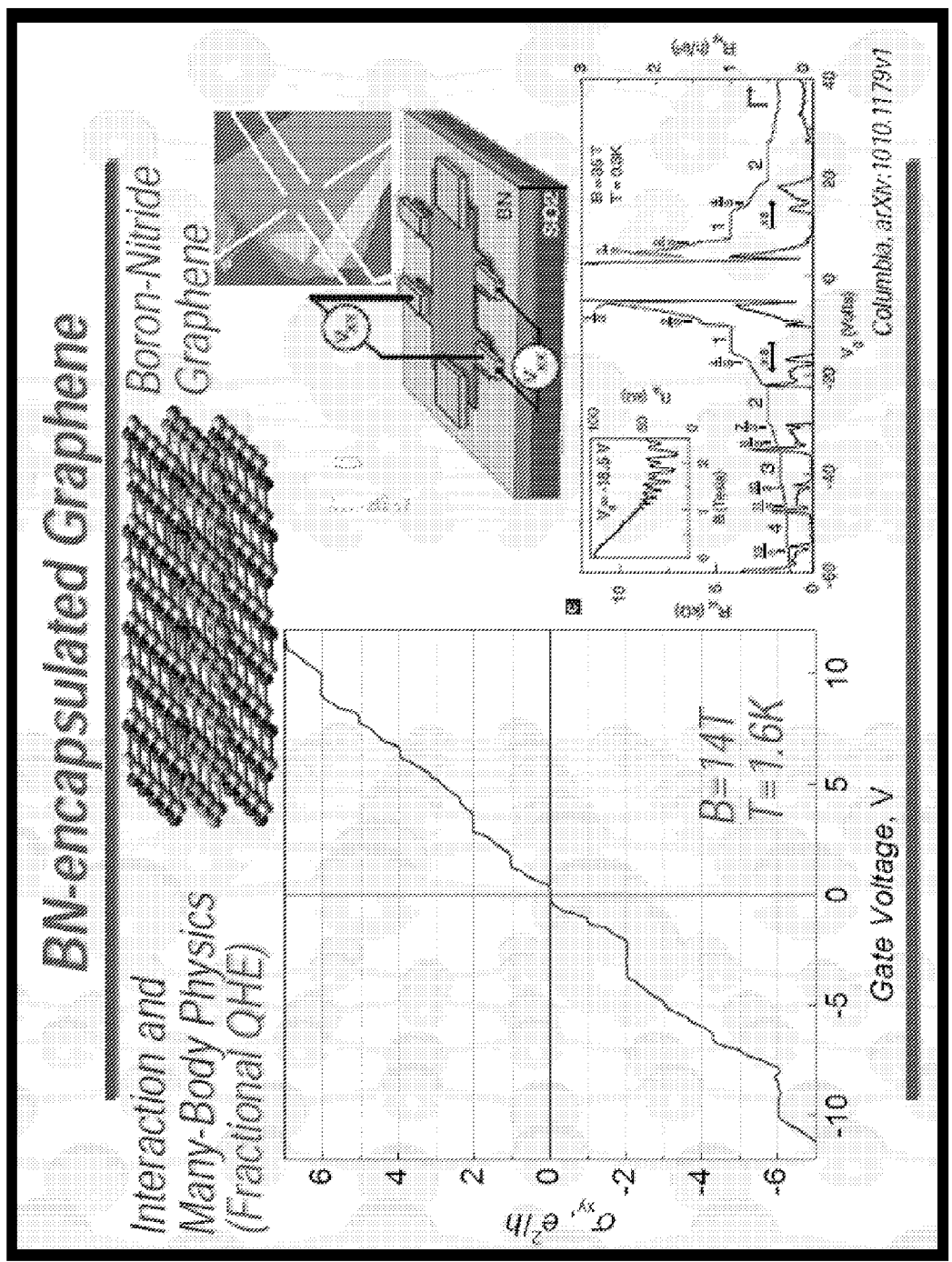
Figure 32:
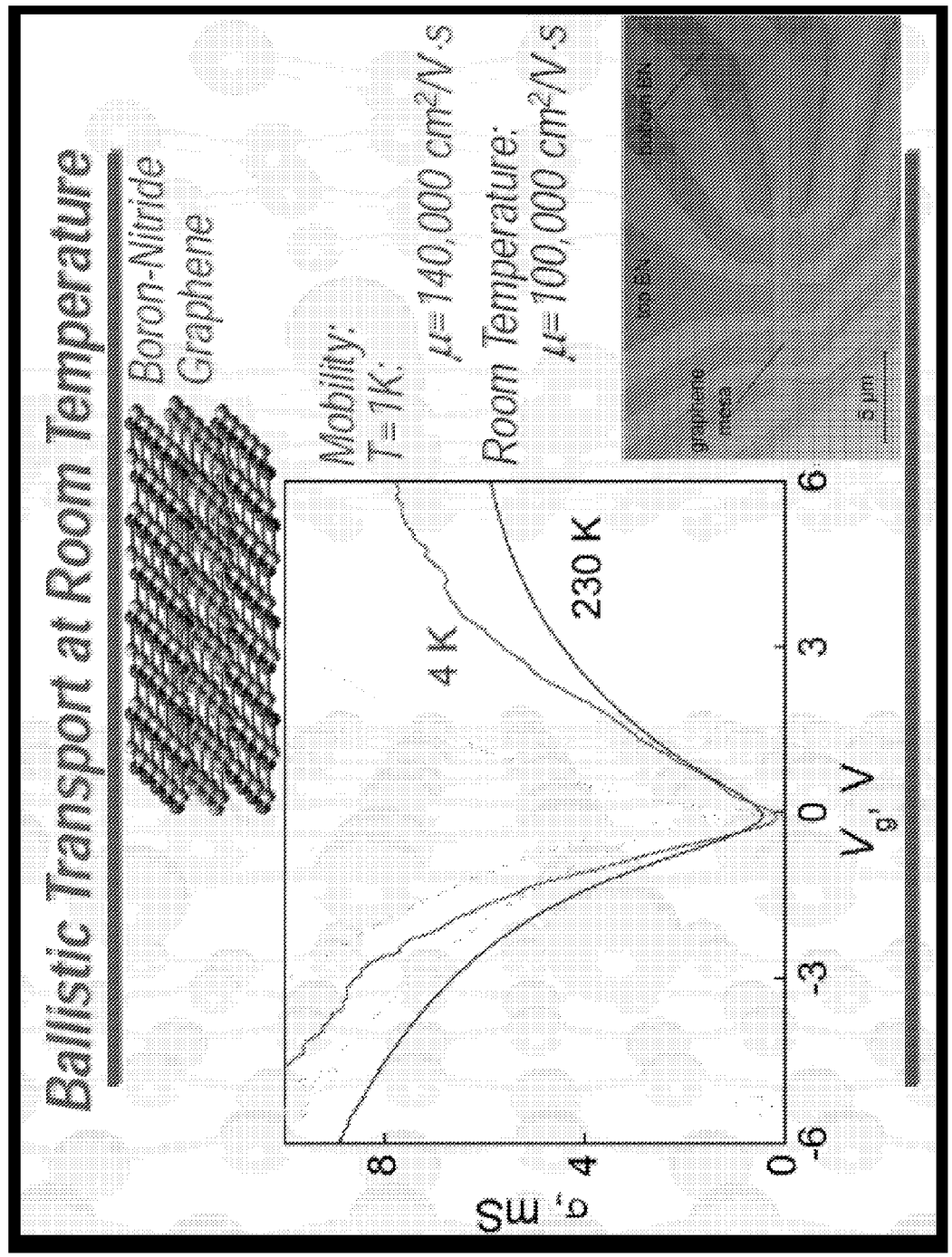
Figure 33:
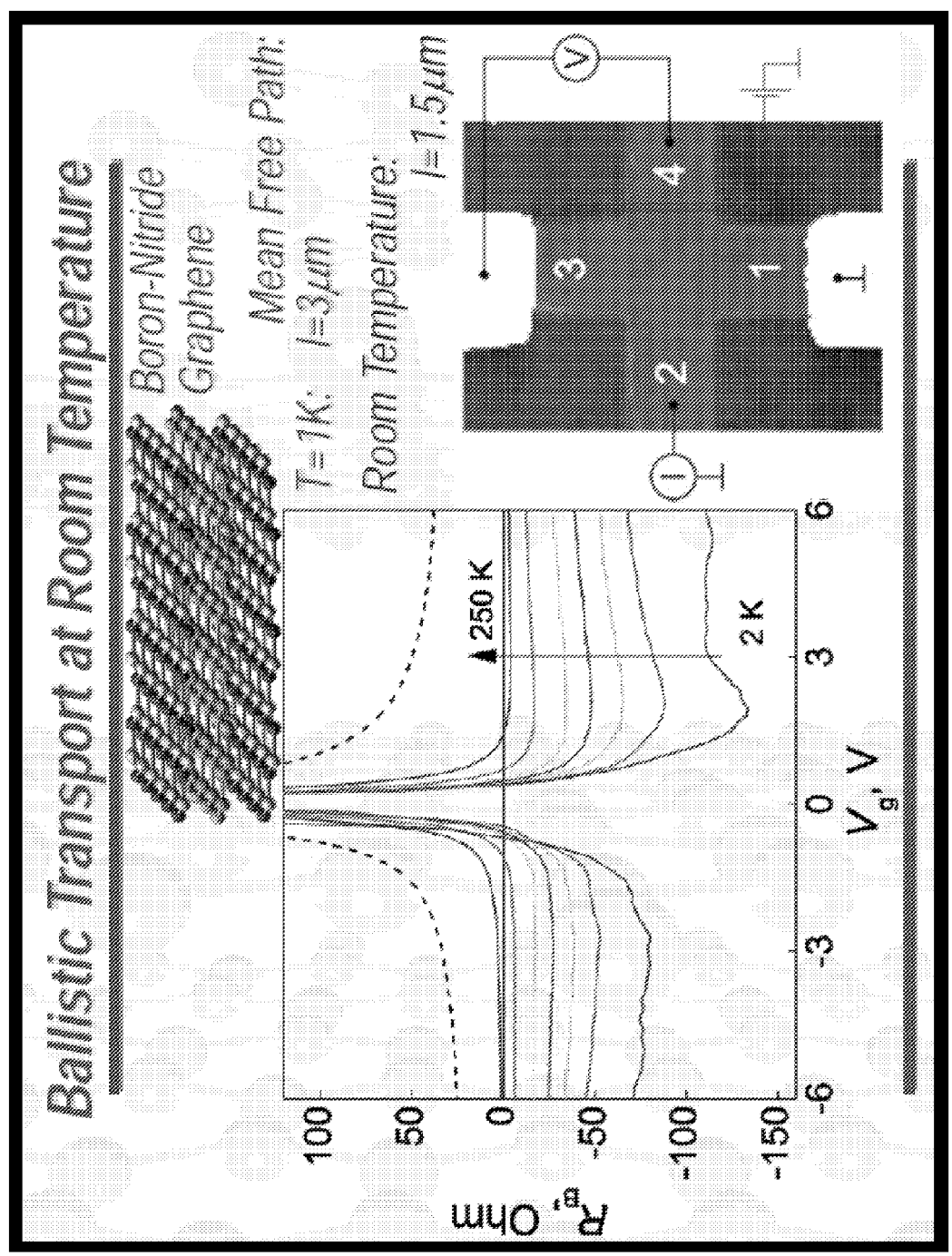
Figure 34:
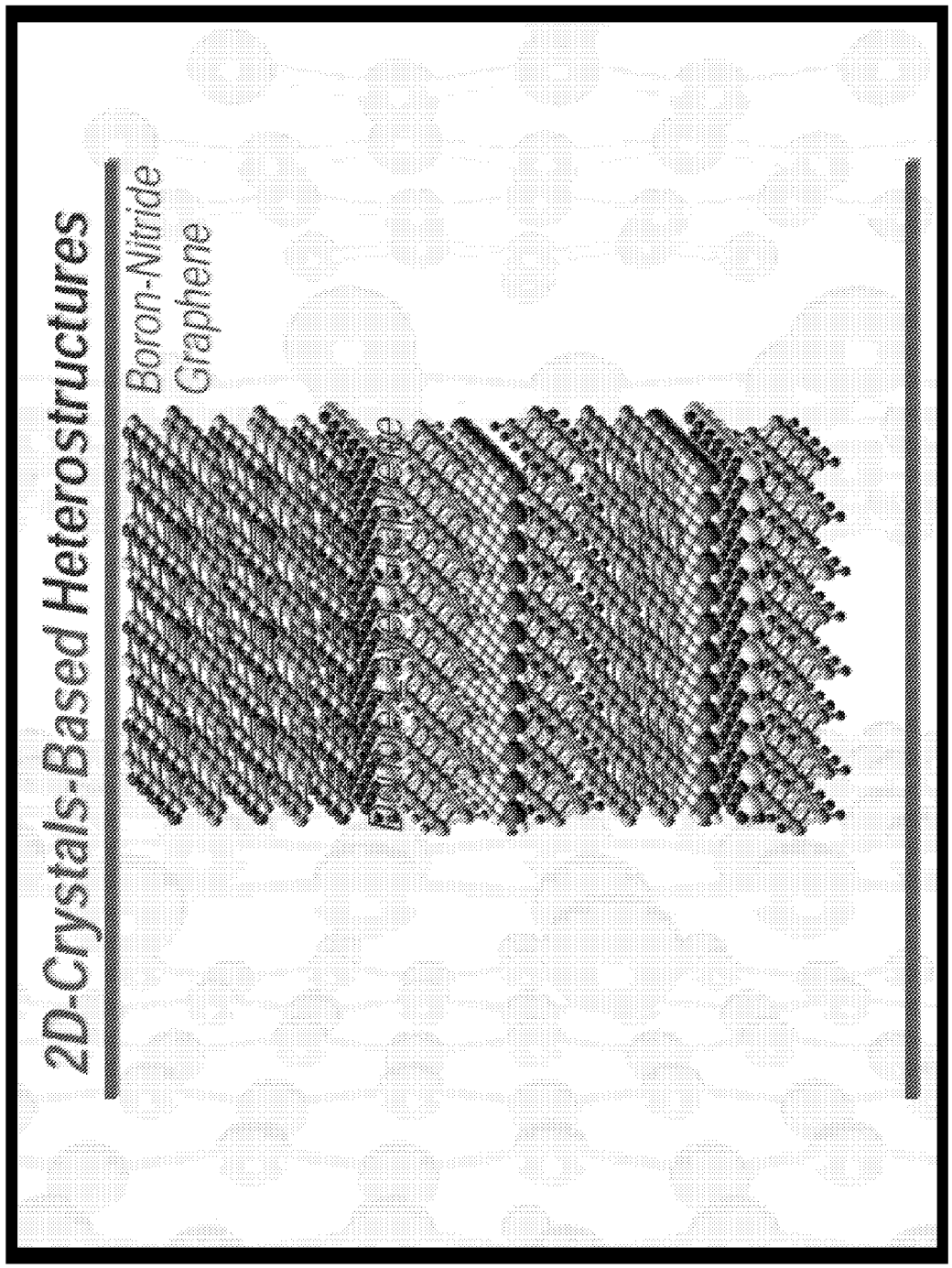
Figure 35:
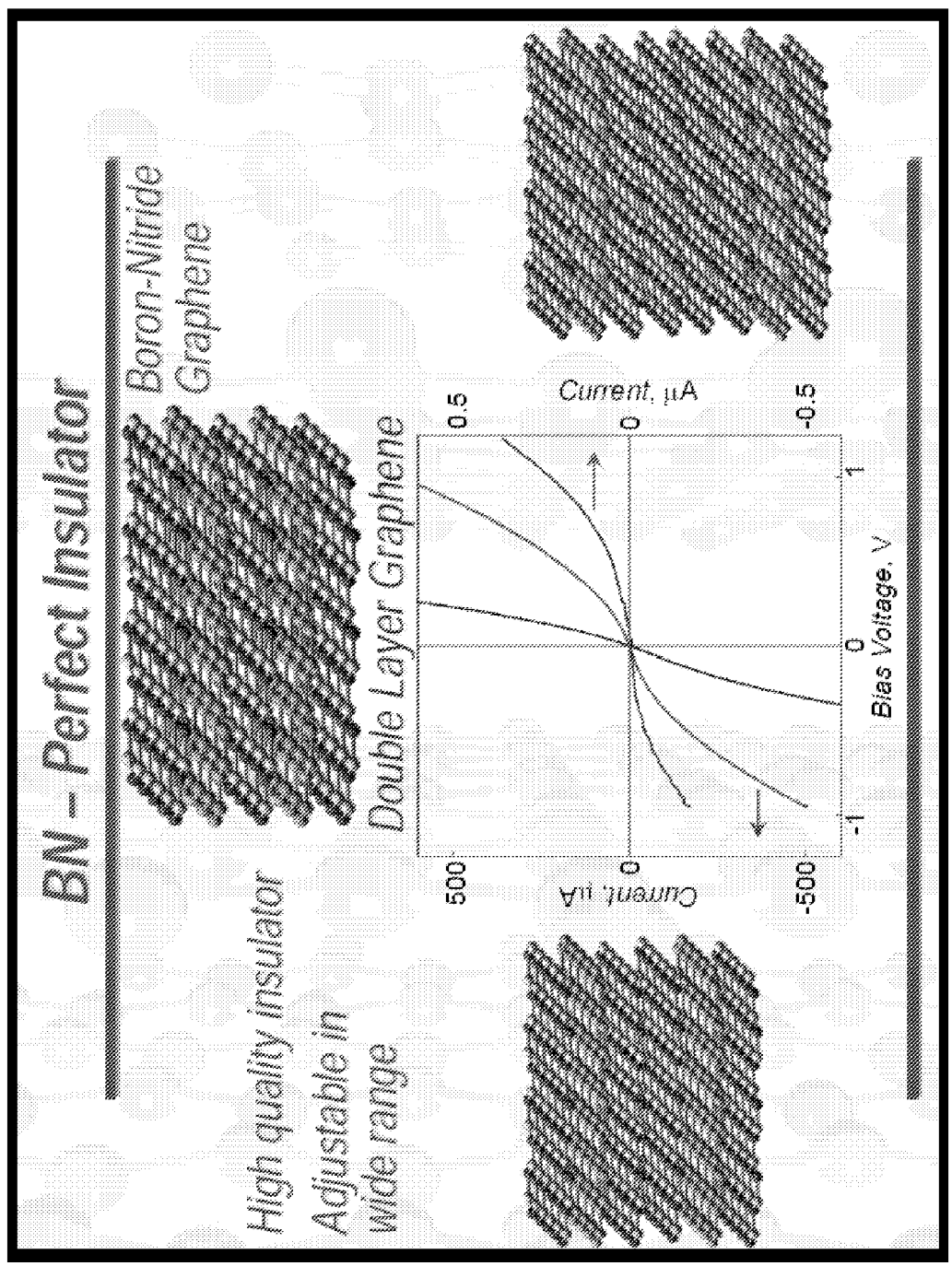
Figure 36:
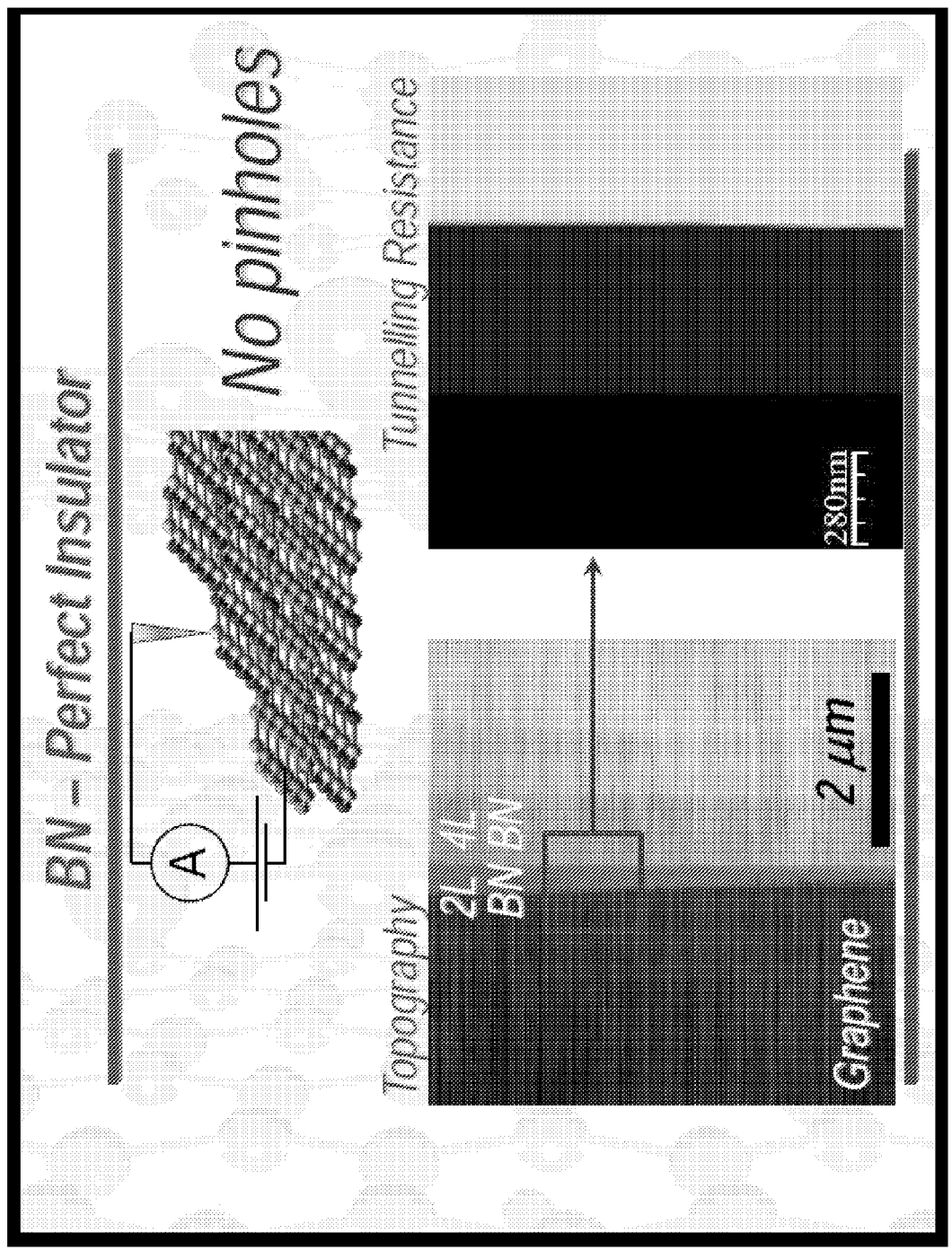
Figure 37:
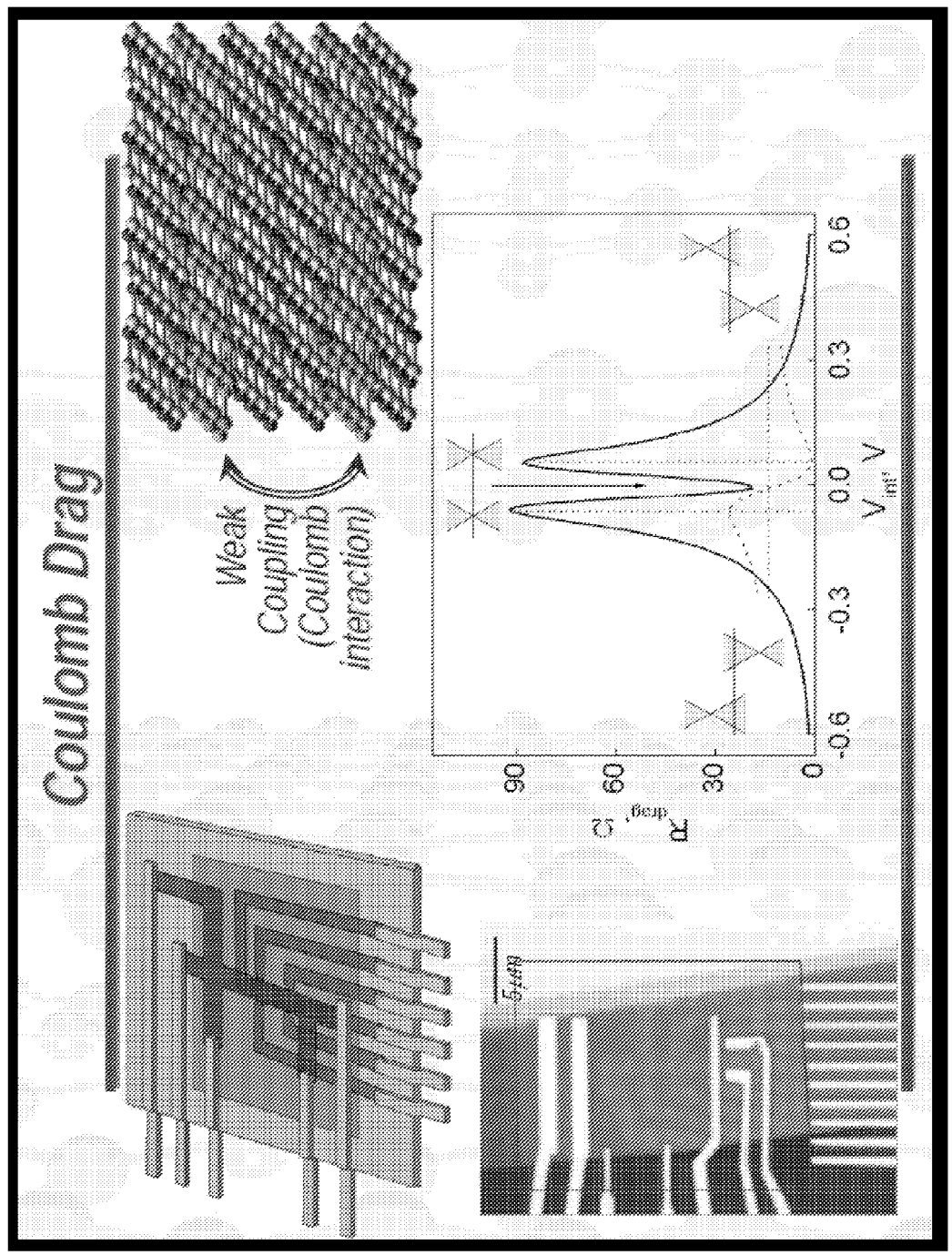
Figure 38:
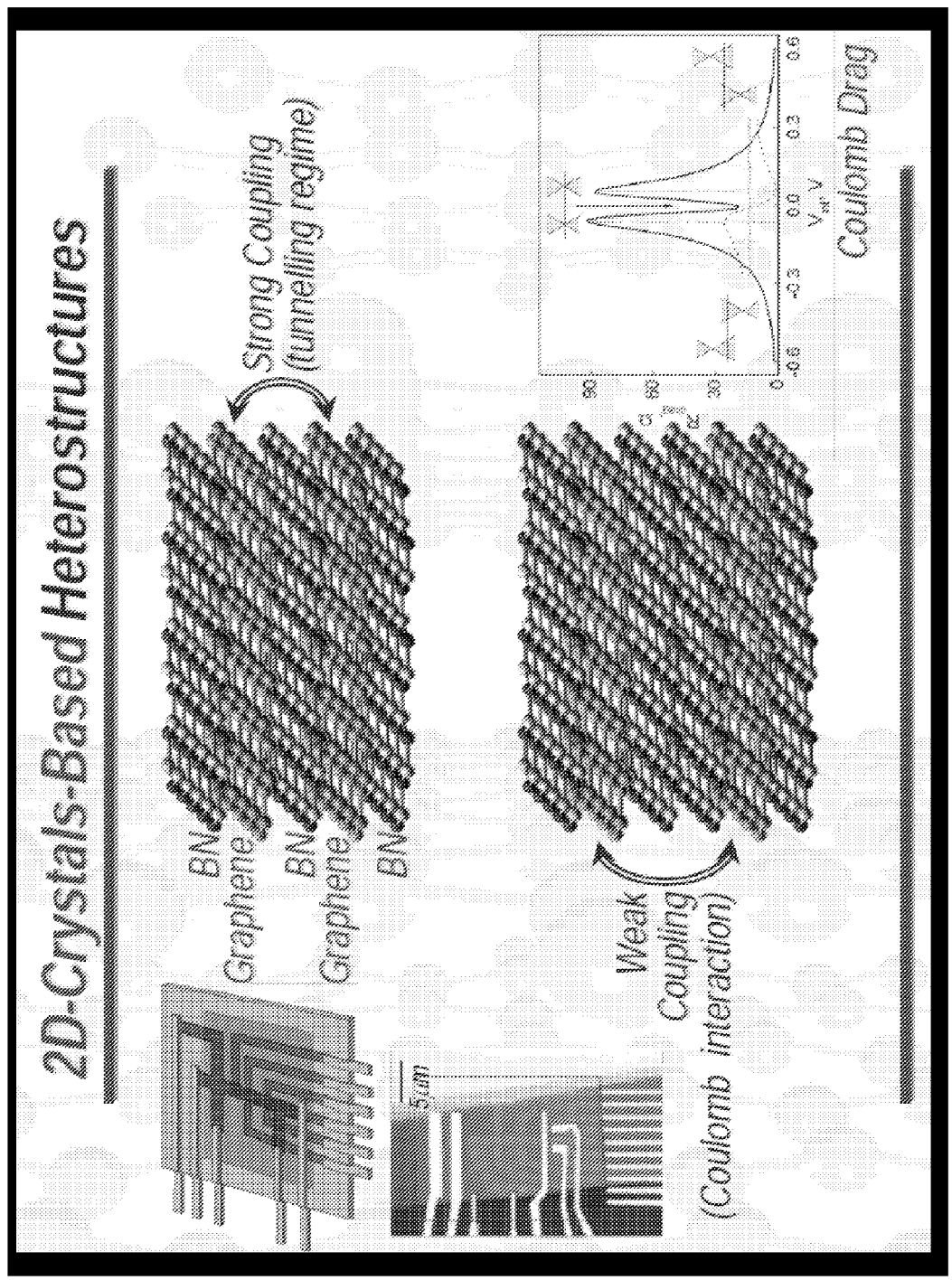
Figure 39:
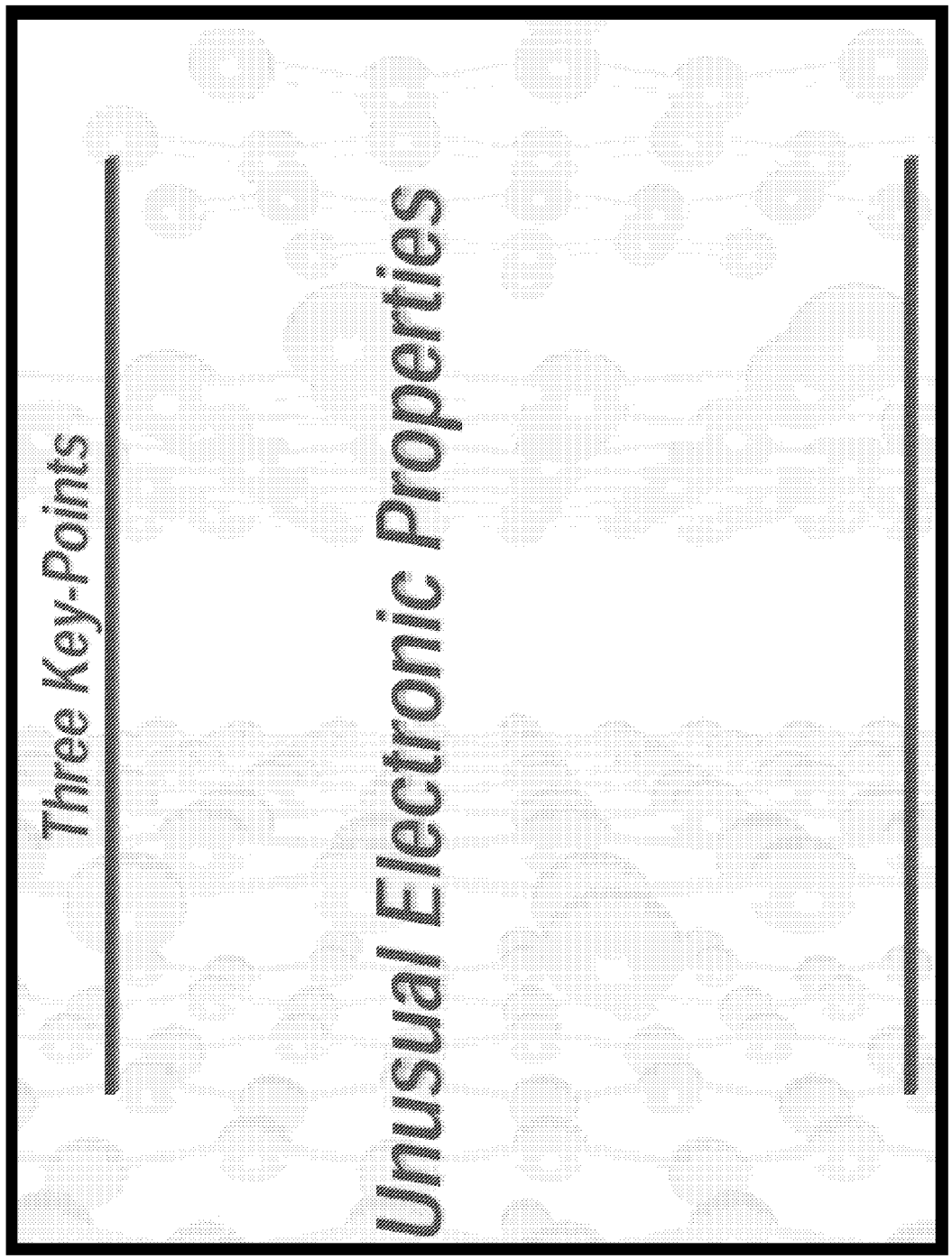
Figure 40:
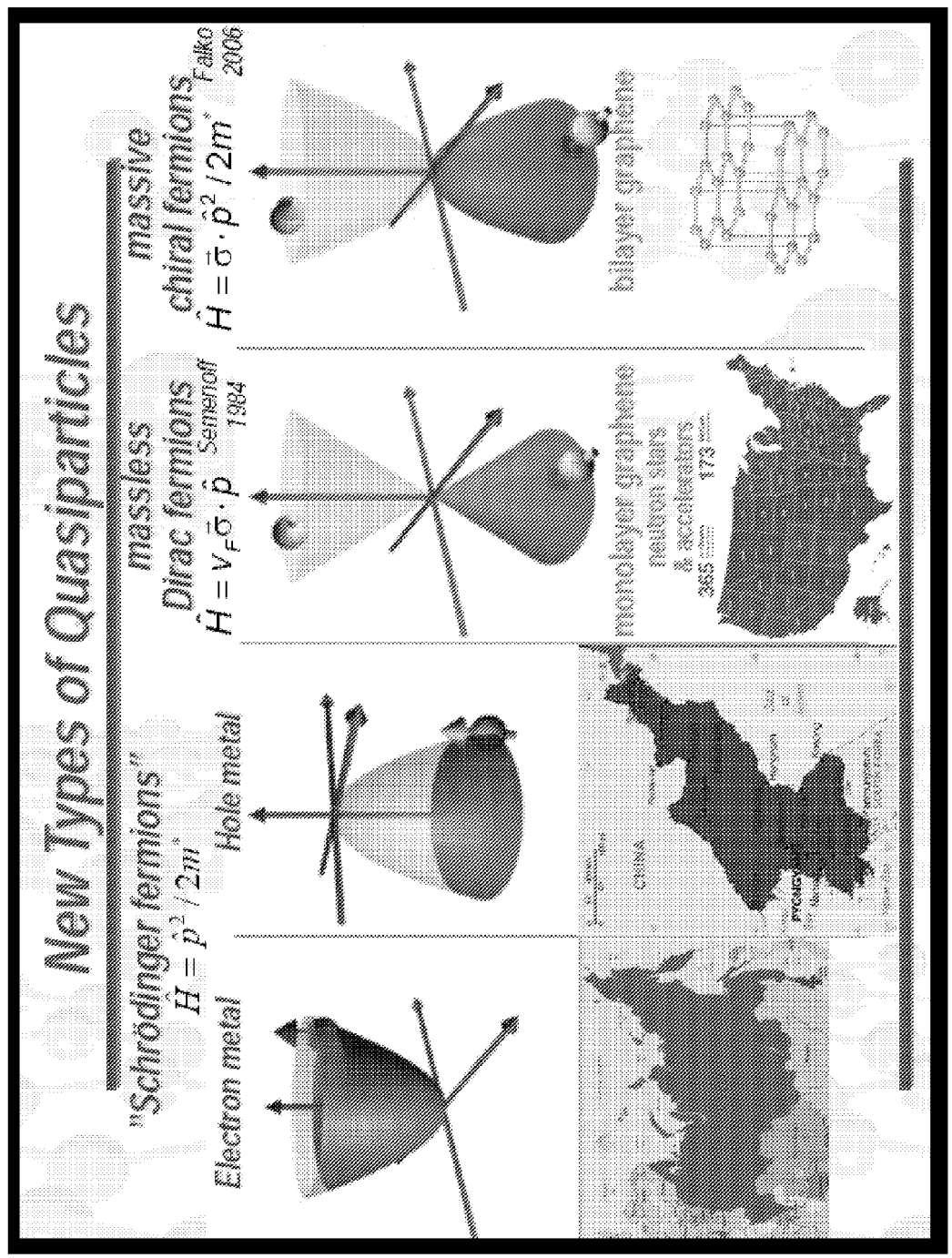

FIG. 7, which relates to Experiment 2, shows $R_{drag}(n)$ in logarithmic scale.

FIGS. 8-54 are informational slides relating to the inventions disclosed herein.

Experiment 1: Direct Evidence for
Micrometer-Scale Ballistic Transport in
Encapsulated Graphene at Room Temperature Devices made from graphene encapsulated in hexagonal boron-nitride exhibit pronounced negative bend resistance and an anomalous Hall effect, which are a direct consequence of room-temperature ballistic transport at a micrometer scale for a wide range of carrier concentrations.

We consider that it is important to continue improving its electronic quality that is commonly characterized by charge carrier mobility μ in the search for new phenomena and applications for graphene. Graphene obtained by mechanical cleavage on top of an oxidized Si wafer usually exhibits μ~10,000 cm²V⁻¹s⁻¹. For typical carrier concentrations n≈10¹² cm⁻², such quality translates into the mean free path $l=(h/2e)\mu(n/\pi)^{0.5}$ of the order of 100 nm where h is Planck's constant and e the electron charge. On the other hand, if extrinsic scattering in graphene is eliminated, its mobility at room temperature (T) can reach ~200,000 cm²V⁻¹s⁻¹ due to weak electron-phonon interaction. Although there have been reports that μ achieved in graphene could approach 1 μm, no ballistic effects on this scale have so far actually been reported.

In this Experiment, we describe devices made from graphene sandwiched between two hBN crystals. The devices exhibit room-T ballistic transport over a 1 μm distance, as evidenced directly from the negative transfer resistance measured in the bend geometry. At low n~10¹¹ cm⁻², the devices exhibit mobility μ>100,000 cm²V⁻¹s⁻¹ even at room T, as determined from their response to gate voltage. Moreover, l continues growing with increasing n and, at higher n≈10¹² cm⁻², we find that our devices' longitudinal conductivity σ becomes limited by their width w≈1 μm rather than scattering in the bulk. From measurements of bend resistance $R_B$, we estimate that encapsulated graphene can exhibit μ~500,000 cm²V⁻¹s⁻¹ and l≈3 μm (at n≈10¹² cm⁻²) at low T, which rivals in quality the best suspended devices. In addition, the encapsulation has made graphene unsusceptible to the environment and allows the use of hBN as an ultra-thin top gate dielectric.

The studied samples that we further refer to as graphene-boron-nitride (GBN) heterostructures were fabricated by using the following multistep technology. First, relatively thick (~10 nm) hBN crystals were mechanically deposited on top of an oxidized Si wafer (100 nm of $SiO_2$). Then, sub-mm graphene crystallites were produced by cleavage on another substrate and transferred on top of the chosen hBN crystal by using alignment procedures similar to those described in Dean, C. R.; Young, A. F.; Meric, I.; Lee, C.; Wang, L.; Sorgenfrei, S.; Watanabe, K.; Taniguchi, T.; Kim, P.; Shepard, K. L.; Hone, J. Boron nitride substrates for high-quality graphene electronics *Nature Nano.* 2010, 5, 722-726.

Electron-beam lithography and oxygen plasma etching were employed to define graphene Hall bars (see images in FIGS. 1, 2). The deposition of graphene on hBN resulted in numerous 'bubbles' containing trapped adsorbates (presumably hydrocarbons) and, if present in the active part of our devices, such bubbles caused significant charge inhomogeneity. This limited the achievable w to ~1 μm, as we tried to fit the central wire inside areas free from the bubbles.

The second hBN crystal (~10 nm thick) was carefully aligned to encapsulate the graphene Hall bar but leave the contact regions open for depositing metal (Au/Ti) contacts. In some devices, the top hBN crystal was used as a dielectric for local gating. After each transfer step, the devices were annealed at 300° C. in an argon-hydrogen atmosphere to remove polymer residues and other contamination.

FIG. 1(a) is an optical micrograph of one of our GBN devices. The plasma etching resulted in a few-nm tall hBN mesa that could be visualized by using the differential interference contrast. To improve the mesa's visibility, its contour is shown by the thin grey lines. The slanted dashed line indicates the edge of the top hBN crystal. FIG. 1(b) shows σ(Vg) measured at two T (solid curves). The dashed curves are σ calculated by using the Landauer-Buttiker formula and numerical modeling of the transmission probability through a quantum wire with w=1 μm. In the calculations, we assume diffusive boundary scattering and the intrinsic mean free path in the graphene bulk $l_i$=1.5 and 3 μm at 230 and 4 K, respectively, which are the values inferred from measurements of $R_B$ as described below.

FIG. 1(b) shows σ as a function of back-gate voltage $V_g$ for a GBN device, measured in the standard four-probe geometry. The minimum in σ occurs at $V_g$≈−0.1V, indicating little extrinsic doping (~10¹⁰ cm⁻²). At small hole concentrations n~10¹¹ cm⁻², the slopes of σ($V_g$) yield μ≈140,000 and 100,000 cm²V⁻¹s⁻¹ at 4 K and room T, respectively (low-n μ is about 30% lower for electrons). The values are in agreement with the measured Hall mobility. In general, at low n our GBN devices exhibited μ between 20,000 and 150,000 cm²V⁻¹s⁻¹, tending to ≈100,000 cm²V⁻¹s⁻¹ in most cases. Another notable feature of FIG. 1(b) is a relatively weak T dependence of σ($V_g$), which is surprising because electron-phonon scattering is expected to start playing a significant role in graphene of such quality. Also, the strong sublinear behavior of σ($V_g$) is unusual for graphene measured in the four probe geometry. As shown below, these features are related to electron transport limited by boundary scattering so that σ=2e²/h($k_F$l)∝n^{1/2}∝$V_g$^{1/2}, where l~w and, therefore, weakly depends on T. The importance of boundary scattering can also be appreciated if we estimate transmission probability Tr through our devices (≈3 μm long). To this end, the standard Landauer-Buttiker formula for quantum conductance G=(4e²/πh)($k_F$w)Tr yields Tr≈0.3-0.5 at high n, which indicates quasi-ballistic transport.

To gain further information about electronic quality of the GBN bulk, we have studied bend resistance $R_B$. To this end, we applied current $I_{21}$ between contacts 2 and 1 and measured voltage $V_{34}$ between probes 3 and 4 (see FIG. 2), which yielded $R_B$=$R_{34,21}$=$V_{34}/I_{21}$. Different bend configurations (e.g., $R_{14,23}$ and $R_{32,14}$) yielded similar $R_B(V_g)$. For a diffusive conductor, $R_B$ should be equal to ln2/πσ. The van der Pauw formula uses the diffusive approximation and can accurately describe $R_B(V_g)$ in the standard-quality graphene. However, the formalism completely fails in our high-μ devices. Indeed, $R_B$ becomes negative which shows that most of the charge carriers injected from, say, contact 2 can reach contact 4 without being scattered. The counterintuitive negative resistance was observed in high-μ two-dimensional gases based on GaAlAs heterostructures and required $l_i$»w where $l_i$ is the mean free path in the bulk. This represents a ballistic propagation of charge carriers which has not previously been possible, perhaps on account of previously insufficient quality.

FIG. 2(a) shows bend resistance at various T for the same device as in FIG. 1(b). The curves from bottom to top correspond to 2, 50, 80, 110, 140, 200 and 250 K, respectively. The dashed curve is $R_B$ calculated using $\sigma(V_g)$ and the van der Pauw formula. FIG. 2(b) (Inset) shows atomic force micrograph of one of our Hall crosses. The scale is given by the device width $w \approx 1$ μm. The drawings schematically depict the bend measurement geometry and a narrow top gate (in red) deposited across one of the leads at a later microfabrication stage. FIG. 2(b) (Main panel) shows $R_B(n)$ for a device with the such a top gate. The negative $R_B$ can be suppressed by applying top-gate voltage $V_{tg}$ which creates an extra barrier and reflects electrons.

In contrast to the measurements in the standard geometry as in FIG. 1(b), $R_B$ in FIG. 2(a) exhibits very strong T dependence, in agreement with the expectations for high-μ graphene.[8] Despite this extra phonon scattering, $R_B$ remains negative at high n for all T≤250 K and does not approach the gate dependence expected in the diffusive regime (dashed curve in FIG. 2(a)). This observation yields $I_i > w \approx 1$ μm at room T, the condition essential for the observation of negative $R_B$. The strong T dependence of $R_B$ also signifies that $I_i$ grows substantially with decreasing T. Complementary evidence for ballistic transfer through the Hall cross comes from devices with an extra barrier placed across one of the potential leads (FIG. 2(b)). When a voltage was applied to the narrow top gate, the potential barrier reflected carriers back into the cross and, accordingly, suppressed negative $R_B$. Also, note that, in the low-n regime ($|V_g|<0.5$ V) where we could determine μ from the linear dependence $\sigma \propto V_g$ as ~140,000 cm$^2$V$^{-1}$s$^{-1}$, $R_B$ remains positive, as expected, because the corresponding $I=(h/2e)\mu(n/\pi)^{0.5} \leq 0.5$ μm is insufficient for causing negative $R_B$.

To elucidate the micron-scale ballistic transport in our GBN heterostructures, FIG. 3(a) shows $R_B$ as a function of magnetic field B applied perpendicular to graphene at a fixed $V_g$ (+3 V in this case). As expected, $R_B$ changes its sign with increasing B because injected electrons are bended by B and can no longer reach the opposite contact ballistically. The characteristic field $B_0$ in FIG. 3(a) is ~0.1 T, which corresponds to a cyclotron orbit of radius $r_c = \hbar(\pi n)^{1/2}/eB \approx 1$ μm, that is equal to w, in agreement with theory ($n \approx 6 \times 10^{11}$ cm$^{-2}$ in this case). Furthermore, ballistic transport is expected to cause an anomalous behavior of Hall resistivity $R_H$ such that it is no longer a linear function of B. FIG. 3(b) shows that, indeed, our devices exhibit nonlinear $R_H(B)$ with a notable kink at the same characteristic $B_0$. This anomaly is usually referred to as the last plateau and absent in diffusive systems. The kink almost disappears at room T (FIG. 3(b)) indicating that we get closer to the diffusive regime. The functional form of $R_H(B)$ strongly depends on the exact shape of Hall crosses, and the anomaly becomes minor if a cross has sharp corners, as is the case of our devices (see image in FIG. 2(b)).

The negative $R_B$, its magnetic field behavior, anomalies in $R_H$ and the influence of the top gate unambiguously prove that, in our Hall crosses, charge carriers can reach the opposite lead ballistically, without scattering. This yields I longer than 1 μm for all $|V_g|>1$ V where the large negative $R_B$ is observed ($|n| \geq 2 \times 10^{11}$ cm$^{-2}$). To appreciate so large values of I, let us mention that in suspended devices[4] and graphene on BN, ultra-high μ were reported only at low n~$10^{11}$ cm$^{-2}$ which translates into submicron I,[4] and I≈1 μm were achieved only in suspended devices with a million μ at low T.

FIG. 3 relates to ballistic transport in magnetic field. FIG. 3(a) shows $R_B(B)$ for a fixed $n \approx 6 \times 10^{11}$ cm$^{-2}$. T is 50, 80, 110, 140, 200 and 250 K (from bottom to top curves, respectively). Inset: $R_B(B)$ calculated for a Hall cross using the billiard-ball model[7] and scaled for the case of our graphene devices and the above n. FIG. 3(b) shows Hall resistance $R_H$ measured at 50 and 250 K. FIG. 3(b) (Inset) shows $R_H(B)$ found theoretically for rounded corners and scaled for our case. The red line in the inset indicates the diffusive limit.

For $I_i > w$, the boundary scattering makes σ only weakly dependent on the bulk quality of graphene and, to obtain a better estimate for $I_i$ than just ≥1 μm as above, we used numerical simulations. We calculated $R_B$ by using the billiard-ball model (Beenakker, C. W. J.; van Houten, H. Billiard model of a ballistic multiprobe conductor. *Phys. Rev. Lett.* 1989, 63, 1857-1860) and assuming diffusive boundary scattering. If the scattering is assumed specular, calculated $R_B$ cannot reach the large negative values observed experimentally. This agrees with general expectations that etched graphene edges are generally rough and scatter diffusively. Diffusive boundary scattering decreases σ of a ballistic wire (transmission probability decreases) but makes $R_B$ more negative due to collimation effects. This is consistent with our experiment that show higher (more ballistic) σ for holes but more negative $R_B$ for electrons and vice versa (cf. FIGS. 1 and 2). This asymmetry can be attributed to a larger degree of diffusivity in boundary scattering for electrons, which implies an extra charge that breaks the electron-hole symmetry of the boundary. Under the assumption of diffusive scattering, the measured $R_B$ yield $I_i \approx 1.5$ μm at room T and ≈3 μm below 50 K for $|n|>2\times10^{11}$ cm$^{-2}$ ($|V_g|>1$ V). Although the exact values are inferred by using the numerical modeling and assuming diffusive boundaries, such large $I_i$ are essential to explain qualitatively both large negative $R_B$ and its strong T dependence (for example, $I_i \leq 1$ μm would be inconsistent with these observations). The inferred $I_i$ also allow us to understand the behavior of σ and its weak T dependence, and the dashed curves in FIG. 1b show $\sigma(V_g)$ calculated within the same model and parameters.

Finally, we note that, for $n \approx 4 \times 10^{11}$ cm$^{-2}$ where $R_B$ reaches its most negative value, $I_i \approx 3$ μm implies intrinsic μ~500,000 cm$^2$V$^{-1}$s$^{-1}$. This is consistent with μ~150,000 cm$^2$V$^{-1}$s$^{-1}$ found from the field effect at significantly lower $n \approx 1 \times 10^{11}$ cm$^{-2}$ where charge inhomogeneity remains significant. The latter regime corresponds to $I_i \leq 0.5$ μm and does not allow negative $R_B$, in agreement in the experiment. To confirm the above μ at high n by using standard field-effect measurements would require GBN devices with w>5 μm, which we have so far been unable to achieve because of the mentioned bubbles that result in charge inhomogeneity.

In conclusion, graphene encapsulated in hBN exhibits robust ballistic transport with a large negative transfer resistance and the mean free path exceeding ~3 μm at low T. Away from the neutrality point, (for carrier concentrations above $10^{11}$ cm$^{-2}$) the longitudinal conductivity of our 1 μm wide devices becomes limited by diffusive scattering at the sample boundaries. The demonstrated graphene-boron-nitride heterostructures is a further improvement with respect to the devices reported previously and shows the way to achieve million mobilities for graphene on a substrate.

Experiment 2: Coulomb Drag in Nonweakly Interacting Double Layer BN-Graphene Heterostructures In this experiment we look at the fabrication of multilayer boron nitride/graphene heterostructures. The developed technique allows to encapsulate graphene between two hexagonal BN crystals while keeping the carrier mobility as high as 10 m²/Vs. The results on transport studies of two closely spaced, independently contacted graphene layers are presented. Due to small interlayer separation, Coulomb drag exhibits unusual behaviour beyond the scope of previously studied weakly interacting regime.

After several years of active transport studies still a little is known about electron-electron interactions in graphene. Due to its minor contribution into the sheet resistance, the direct measurements of the e-e interactions in the conventional transistor structures require complex analysis. Observation of transport properties of two closely spaced graphene flakes can shed light on a variety of new interaction phenomena including, for example, exciton condensation. Electron drag is caused by the scattering between fluctuations of electron density of two two-dimensional electron gases ("2DEGs") and is a probe of intra-layer density excitations and inter-layer electron-electron interaction.

In this Experiment we report on high quality BN/graphene heterostructures and study their transport properties. By analogy with GaAs/AlGaAs double quantum well heterostructures, we explore drag effect in our samples. However, in GaAs samples the spacer between two quantum wells is limited by the leak currents to about ~7.5 nm and the quantum well size itself is typically ~15 nm, which makes the distance between 2DEG centres at least 20 nm. The presented technique allows positioning of two graphene layers an order of magnitude closer, separated by only a few nanometer thick BN crystal, while keeping the leak currents vanishingly small. We were able to reach carrier concentrations as high as $2 \cdot 10^{12}$ by applying a voltage between two layers. Therefore, in combination with the conventional Si back-gate which mainly affects the bottom layer, concentrations in top ($n_t$) and bottom ($n_b$) layers can be controlled independently. Another advantage of the reported technique is the high mobility of our samples up to room temperature, due to the fact that graphene layers are only in contact with chemically inert and atomically flat hexagonal boron nitride sheets. The use of chemically inert and atomically flat hexagonal boron nitride sheets is an important feature of the invention as a whole and is not just an important factor in the success of this experiment.

The sample fabrication starts from the deposition of BN crystals on top of Si/SiO$_2$ wafer using standard mechanical exfoliation technique [PNAS]. We then select a clean and uniform BN flake and transfer a large graphene crystal on top of it. After this graphene flake is shaped to a Hall bar using oxygen plasma etching, a few-layer thick BN spacer is again transferred on top of it. The spacer is aligned so that it only covers the hall-bar structure and not graphene 'leads' (see FIG. 4(a)). Finally, the top graphene layer is transferred, followed by the standard contact deposition. Since the part of the bottom flake is still open, the contacts can be made to both layers in one electron beam lithography run. The top layer also can be shaped by a careful etching, following the mesa-structure of the bottom layer. Each stage of transfer is preceded by annealing at 300° C. in Ar/H$_2$ for several hours in order to clean the surface.

FIG. 4(a) is a device schematic of the multilayer sample. The layer order depicted in FIG. 4(a) is as follows: thick BN underlayer (blue), bottom graphene (gray), thin BN spacer (red) and top graphene layer (dark grey).

FIG. 4(b) is an optical image of the multilayer sample. Red line indicates edges of the BN spacer. Although graphene on BN has vanishing contrast at these conditions, the bottom Hall-bar can be seen due to partial etching of BN underlayer. Scale bar is 5 μm.

FIG. 4(c) shows experimental results on quantum capacitance (circles) and simulations for different spacer thicknesses (solid lines).

The transfer procedure involves standard flake deposition on top of Si/PMGI/PMMA stack followed by the lift-off of the PMMA film by etching away PMGI release layer in a weak alkali solution. The top PMMA surface with the flake remains dry during this procedure. The film is then picked up on a support (metal ring), aligned and placed face-down onto the target substrate. The alignment is done using an optical mask aligner with an accuracy of ~2 μm. After the transfer, the PMMA carrier film is dissolved in acetone. The annealing of transferred flakes is often accompanied by formation of microscopic bubbles of organic and gas species, therefore the lithography is done to fit the hall-bar between such bubbles.

We have studied three samples with different spacer thicknesses (d) of 2, 2.8 and 3.6 nm. Although the samples show very similar behaviour, most of the results presented here have been measured on the thicker device, in order to obtain higher carrier concentrations without significant leak issues. The leak through BN interlayer is not detectable (>1 GΩ) at small biases and exponentially rises to ~1 nA at 0.6 V for the thickest device. AFM studies of the device surface confirm that the layers are flat and uniformly spaced with RMS roughness below 1 Å. Each structure has 10 contacts to the bottom layer and at least 6 contacts to the top. The carrier mobility of the bottom layer (up to 15 m²V⁻¹s⁻¹) is superior to that one of the top (2.5-5 m²V⁻¹s⁻¹).

Good quality of interlayer spacer allows us to use a voltage $V_{int}$ between graphene layers in order to control the charge density. Together with the back gate, which mainly affects the bottom layer, different combinations of top ($n_t$) and bottom ($n_b$) layer concentrations can be achieved. However, the carrier density is no longer a linear function of the voltage $V_{int}$.

In order to investigate that, we have studied the capacitance of our devices (FIG. 4(c)). This has been done by measuring the concentration of charge carriers $n(V_{inter})$ from Hall effect: $n=eB/R_H$, where B is magnetic field and $R_H$ — Hall resistance. Then the capacitance (per unit area) was obtained by differentiation: $C=edn/dV_{inter}$. This method is valid as soon as there is one type of carriers in the graphene sheet (i.e. not too close to NP). The results presented in FIG. 4(c) show that C is not constant as expected for a capacitor with metal plates. The deviation is due to contribution from quantum capacitance $C_q$ originating from low concentration of charge carriers in graphene and working as a series capacitance. At T=0 and ignoring disorder, $$C_q = \frac{2e^2}{\hbar v_F}\sqrt{\frac{|n|}{\pi}},$$

where $v_F=1.1 \cdot 10^6$ m/c is Fermi velocity. The total capacitance is $C=(2/C_q+d/\epsilon\epsilon_0)^{-1}$, where $\epsilon=4.8$ is dielectric constant of BN and factor 2 is due to fact that we have both plates made of graphene. Using thickness as the only fit parameter we obtained d~4 nm, which coincides with result of AFM measurements Here, $\in$=4.8 is an AC value, with $v_F$ taken as $1.1 \times 10^6$.

Since the 2DEGs are in a close proximity, the momentum transfer occurs in scattering events between fluctuations in the electron density of each layer. Passing a driving current $I_a$ in one of the layers (active) results in a drag current being created in the other (passive). The two currents have the same direction in case if both layers have the same carrier type (n-n, p-p) and opposite for n-p (p-n) configuration. Thus, the drag resistance in open circuit configuration $R_{drag}=V_p/I_a$ is negative for n-n (p-p) case, positive for p-n (n-p) case and zero if one of the layers has zero average concentration.

Due to a negligible intrinsic doping observed in our devices (estimate), zero gate voltage result in $E_F=0$ for both layers. Then, a constant voltage is applied to the top layer $V_{int}$ (bottom layer grounded), creating an equal charge density of the opposite signs $n=n_t=-n_b$. For the drag measurements, the bottom layer is used as the active layer and the top layer as passive, though swapping the active and passive layers does not change the drag resistance significantly (within 5%). As expected, the measured drag resistance is independent of driving current (up to 0.5 µA above 20 K) and the same in both AC/DC setups.

FIG. 5(a) shows drag as a function of interlayer voltage (solid) for the symmetric case $n=n_t=-n_b$. Dashed line shows $R_{xy}$ for the top layer in B=0.5 T (the same $V_{int}$ scale, vertical scale not shown). Horizontal dotted line indicates $R_{xy}=0$. The diagrams illustrate Fermi energy in the bottom and top layers, respectively. T=124 K.

FIG. 5(b) shows the drag resistance in nonsymmetric case: negative for the same type of carriers in both layers (black curve—holes, red—electrons) and positive for p-n (n-p) configuration. The diagrams are related to the blue curve. T=124 K.

FIG. 5(c) shows $R_{drag}$ as a function of back gate voltage, with for different $V_{int}$. T=110 K. The diagrams are related to the black curve.

FIG. 5(a) shows $R_{drag}$ measured as a function of the interlayer voltage $V_{int}$, when $V_{back}=0$, i.e. $n=n_t=-n_b$. At the electro-neutrality (EN) point $V_{int}=0$ the spatial inhomogeneity breaks graphene into a system of random thermally smeared electron-hole puddles [Yacoby] and the average $R_{drag}$ approaches zero. As a more inform concentration develops, $R_{drag}$ abruptly rises, reaches a maximum and then decreases due to the screening induced weakening of the interlayer interaction.

In order to estimate how large the nonuniform region is in $V_{int}$, we measure $R_{xy}$ for the top layer, where the mobility is lower (dashed line in FIG. 5(a)). The maxima and minima in $R_{xy}$ correspond to the crossover from the regime of uniform concentration, when $R_{xy}$ should decrease as 1/n, to the non-uniform regime, where two types of carriers present due to the finite temperature and potential disorder. Their positions, indicated by the vertical dashed lines at $V_{int}=\pm 0.05$ V, almost exactly match the peaks in the drag resistance $R_{drag}$ (indicated as vertical dotted lines in the plot). We therefore believe, that the central deep in $R_{drag}$ ($V_{int}$) is directly related to nonuniformity of the gas at low energies.

When a finite back-gate voltage $V_{back}$ is applied, both layers have the same type of carriers: the drag resistance is negative as shown in FIG. 5(b). Introducing $V_{int}$ will increase the concentration in one flake and deplete the other. Eventually, the EN point for one of the layers will match the Fermi level—at this point $R_{drag}$ will change sign passing through 0. The size of such transition is again related to the disorder. Since the mobility in the layers differs, two transitions are not symmetric.

The drag resistance can also be measured as a function of $V_{back}$. FIG. 5(c) shows such measurements for different combinations of carrier types: $V_{int}$=0, 50, -100 mV. Due to the partial screening, the back gate voltage affects concentration in two layers in a different way and we propose to investigate further measurements similar to given in FIG. 5(a), due to its symmetrically defined concentrations $n_t$, $n_b$ and intuitive clearness.

FIG. 6 shows Temperature dependence of drag resistance for different $V_{int}$. Solid line shows slope corresponding to the power of 2.

FIG. 6 (Inset) shows $R_{drag}(V_{int})$ at three different temperatures.

Since the Coulomb drag originates from the interlayer scattering processes, it is governed by phase space available for the scattering events. A general theory of Coulomb drag applied to graphene is based on the second-order perturbation theory in the screened interlayer interaction $U_{12}(\vec{q}, \omega)$ dependent on the wave vector $\vec{q}$ and frequency $\omega$. For the ballistic regime when the mean free path l>>d (which is definitely the case for our experimental situation) the drag resistivity can be estimated as $$\rho_D \propto \left(\frac{k_B T}{E_F}\right)^2 \sum_{\vec{q}} |U_{12}(\vec{q}, 0)|^2 \tag{1}$$

Inset of FIG. 6 shows experimental T-dependence of the drag effect: $R_{drag}$ decreases as the temperature drops, entering mesoscopic regime at T~30 K. The extracted $R_{drag}(T)$ for different values of the interlayer voltage is shown in FIG. 6 in logarithmic scale. The curves are linear within experimental accuracy, with the slope γ close to 2 at high concentrations.

It is thought that the deviation from the square dependence may originate, for example, due to an auxiliary drag mechanism. Besides, two additional drag mechanisms are possible: virtual phonon and plasmon drag enhancement. Another possible reason is change in the carrier concentration due to C(T) or $k_B T$.

Now we discuss the concentration dependence of the coefficient at $T^2$. For the case of identical graphene layers the screened interlayer interaction can be obtained from the general expression as $$U_{12}(\vec{q}, \omega) = \frac{v_c(q)}{2[v_c(q)\Pi(q, \omega)]^2 \sinh(qd) + [1 + 2v_c(q)\Pi(q, \omega)]\exp(qd)} \tag{2}$$

where the polarization function for graphene $\Pi(q, \omega)$ can be taken from the literature and the Fourier component of the bare Coulomb interaction $v_e(q)$ should be obtained from the solution of electrostatic problem for our geometry. For the three-domain medium with the dielectric constant distribution:

$$\varepsilon = \begin{cases} \varepsilon_1, & z > d \\ \varepsilon_2, & d > z > 0 \\ \varepsilon_3, & z < 0 \end{cases}$$

one has $$v_c(q) = \frac{8\pi e^2 \varepsilon_2 \exp(qd)}{q[(\varepsilon_2 + \varepsilon_1)(\varepsilon_2 + \varepsilon_3)\exp(2qd) - (\varepsilon_2 - \varepsilon_1)(\varepsilon_2 - \varepsilon_3)]}. \tag{3}$$

Previous theoretical works on drag in graphene, described the regime of weak interaction, when the interlayer distance is much greater than the size of screened electron density fluctuations $\kappa d \gg 1$, where $\kappa = 4e^2 k_F/\hbar v \in$ is the inverse Thomas-Fermi screening radius and $\in$ is an average dielectric constant of the media. According to the theory of Coulomb drag in graphene, the drag resistance $R_{drag}$ is proportional to $T^2 d^{-4} n_t^{-3/2} n_b^{-3/2}$.

Clearly, we are not in the limit of the theoretical works. For the carrier concentration of $2 \cdot 10^{12}$ cm$^{-2}$ in our devices, the parameter $\kappa d$ is close to 1, always being lower otherwise. Comparison with our experimental results reveals significant deviation from $n^{-3}$ dependence. FIG. 7 shows the drag resistance from FIG. 5(a) plotted in logarithmic scale as a function of n. As one can see the slope increases, almost reaching $n^{-2}$ at high concentration. The slope behaviour reproduces for both positive and negative n (solid and dashed curves) and does not depend on the temperature (different colours represent different temperatures). The fact that the slope increases with the parameter $\kappa d$ may suggest that it can eventually reach 3 when $\kappa d \gg 1$ is satisfied.

The computational results based on Eqs. (1)-(3) are shown in the FIG. 7 as solid green line and indeed are close to the experimental results. Note that for the opposite limit $\kappa d \ll 1$ the concentration dependence of the drag resistivity is $$\rho_D(n) \propto \frac{1}{n} \ln\frac{1}{\kappa d} \propto \frac{1}{n} \ln\frac{1}{nd^2}.$$

FIG. 7 shows $R_{drag}(n)$ in logarithmic scale. Different colours correspond to different temperatures, solid and dashed lines are for positive and negative n respectively. Purple solid line is a guide for $n^{-1}$. The results of our calculations are presented by the green line and close to $n^{-2}$.

When used in this specification and claims, the terms "comprises" and "comprising" and variations thereof mean that the specified features, steps or integers are included. The terms are not to be interpreted to exclude the presence of other features, steps or integers.

The features disclosed in the foregoing description, or in the following claims, or in the accompanying drawings, expressed in their specific forms or in terms of a means for performing the disclosed function, or a method or process for obtaining the disclosed results, as appropriate, may, separately, or in any combination of such features, be utilised for realising the invention in diverse forms thereof.

While the invention has been described in conjunction with the exemplary embodiments described above, many equivalent modifications and variations will be apparent to those skilled in the art when given this disclosure, without departing from the broad concepts disclosed. It is therefore intended that the scope of the patent granted hereon be limited only by the appended claims, as interpreted with reference to the description and drawings, and not by limitation of the embodiments described herein.

The invention claimed is:

1. A graphene heterostructure mounted on a substrate having:
   a first encapsulation layer;
   a second encapsulation layer; and
   a graphene layer positioned between the first encapsulation layer and the second encapsulation layer; wherein the first and second encapsulation layers are of hexagonal boron-nitride; wherein the interfaces between layers are substantially free from polymer residue and/or other contamination; and wherein the graphene component of the heterostructure has a charge carrier mobility greater than 100,000 cm$^2$V$^{-1}$S$^{-1}$.

2. The graphene heterostructure according to claim 1, wherein the graphene layer lies directly next to the first encapsulation layer, and the second encapsulation layer lies directly next to the graphene layer.

3. The graphene heterostructure according to claim 1, wherein the graphene layer is a single sheet of graphene.

4. The graphene heterostructure according to claim 1, wherein the graphene layer is shaped to form a structure.

5. The graphene heterostructure according to claim 1, wherein the graphene heterostructure includes one or more contacts, each of the one or more contacts being positioned on one or more respective contact regions included in a structure formed in the graphene layer.

6. The graphene heterostructure according to claim 1, wherein the second encapsulation layer is aligned with respect to the graphene layer so that it covers only a portion of the graphene layer, so that one or more contact regions included in a structure formed in the graphene layer are not covered by the second encapsulation layer.

7. The graphene heterostructure according to claim 1, wherein the graphene heterostructure includes a substrate on which the first encapsulation layer is positioned.

8. The graphene heterostructure according to claim 1, wherein the heterostructure further comprises a second graphene layer.

9. The graphene heterostructure according to claim 1, wherein the graphene heterostructure forms an electronic component for use in an electronic circuit.

10. The graphene heterostructure according to claim 1, wherein the graphene heterostructure forms an electronic device.

11. The method of making a graphene heterostructure, the method including:
   depositing a first encapsulation layer on a substrate; and
   depositing a graphene layer on a first encapsulation layer; and
   depositing a second encapsulation layer on the graphene layer, so that the graphene layer is positioned between the first encapsulation layer and the second encapsulation layer, wherein the first and second encapsulation layers are hexagonal boron nitride; and
   after depositing any one or more of the layers, cleaning the graphene heterostructure by annealing.

12. The method according to claim 11, wherein the first encapsulation layer is deposited on the substrate by exfoliation; and
   wherein the graphene layer is deposited on the first encapsulation layer using a precursor structure, the precursor structure including the graphene layer positioned on a carrier layer, the method including:
   depositing the precursor structure on the first encapsulation layer with the graphene layer facing the first encapsulation layer; and
   subsequently removing the carrier layer from the graphene layer.

13. The method according to claim 12, wherein the second encapsulation layer is deposited on the graphene layer using a precursor structure, the precursor structure including the second encapsulation layer positioned on a carrier layer, the method including:
   depositing the precursor structure on the graphene layer with the second encapsulation layer facing the graphene layer; and
   subsequently removing the carrier layer from the second encapsulation layer.

14. The method of depositing a layer of material on a surface using a precursor structure, wherein the precursor structure includes the layer of material positioned on a carrier layer, and wherein the precursor structure is made by:

depositing a carrier layer on a sacrificial carrier layer;

depositing the layer of material on the carrier layer; and removing the sacrificial carrier layer so as to separate the precursor structure including the carrier layer and the layer of material from the sacrificial carrier layer; and the method including:

depositing the precursor structure on the surface with the layer of material facing the surface; and subsequently removing the carrier layer from the layer of material;

wherein the material is either graphene or hexagonal boron nitride.

\* \* \* \* \*